United States Patent
Gamelin et al.

(10) Patent No.: US 12,191,414 B2
(45) Date of Patent: Jan. 7, 2025

(54) METAL-HALIDE SEMICONDUCTOR OPTICAL AND ELECTRONIC DEVICES AND METHODS OF MAKING THE SAME

(71) Applicant: UNIVERSITY OF WASHINGTON, Seattle, WA (US)

(72) Inventors: Daniel R. Gamelin, Seattle, WA (US); Daniel M. Kroupa, Seattle, WA (US); Tyler J. Milstein, Seattle, WA (US); Sidney E. Creutz, Seattle, WA (US); Matthew J. Crane, Seattle, WA (US); Joo Yeon Roh, Seattle, WA (US)

(73) Assignee: UNIVERSITY OF WASHINGTON, Seattle, WA (US)

( * ) Notice: Subject to any disclaimer, the term of this patent is extended or adjusted under 35 U.S.C. 154(b) by 760 days.

(21) Appl. No.: 15/733,769

(22) PCT Filed: Apr. 26, 2019

(86) PCT No.: PCT/US2019/029355
§ 371 (c)(1),
(2) Date: Oct. 20, 2020

(87) PCT Pub. No.: WO2019/210174
PCT Pub. Date: Oct. 31, 2019

(65) Prior Publication Data
US 2021/0242357 A1    Aug. 5, 2021

Related U.S. Application Data

(60) Provisional application No. 62/801,535, filed on Feb. 5, 2019, provisional application No. 62/663,656, filed on Apr. 27, 2018.

(51) Int. Cl.
*H01L 31/055* (2014.01)
*C09K 11/77* (2006.01)
(Continued)

(52) U.S. Cl.
CPC ........ *H01L 31/055* (2013.01); *C09K 11/7773* (2013.01); *H01L 31/02168* (2013.01); *H01L 31/18* (2013.01); *H01L 33/502* (2013.01)

(58) Field of Classification Search
None
See application file for complete search history.

(56) References Cited

U.S. PATENT DOCUMENTS

| 6,117,498 A | 9/2000 | Chondroudis et al. |
| 7,700,464 B2 | 4/2010 | Robinson et al. |

(Continued)

FOREIGN PATENT DOCUMENTS

| CN | 101675180 A | 3/2010 |
| CN | 106062983 A | 10/2016 |

(Continued)

OTHER PUBLICATIONS

Khayyat et al; What is Nanocrystal (Year: 2014).*

(Continued)

*Primary Examiner* — David Sample
(74) *Attorney, Agent, or Firm* — Christensen O'Connor Johnson Kindness PLLC

(57) ABSTRACT

Compositions of matter, downconversion layers including the compositions of matter, and devices including the compositions of matter are described. In an embodiment, the compositions of matter are downconversion materials configured to absorb a quantum of energy of a first energy and, in response, emit two or more quanta of energy of a second energy less than the first energy. Methods of making and depositing downconversion materials are also described. Downconversion precursor mixtures suitable for making downconversion materials and methods of making the same are also described.

22 Claims, 46 Drawing Sheets

(51) Int. Cl.
*H01L 31/0216* (2014.01)
*H01L 31/18* (2006.01)
*H01L 33/50* (2010.01)

(56) References Cited

U.S. PATENT DOCUMENTS

| | | | |
|---|---|---|---|
| 9,750,240 B2* | 9/2017 | Parsons | E04H 15/34 |
| 2007/0163637 A1 | 7/2007 | Robinson et al. | |
| 2010/0129994 A1 | 5/2010 | Awad et al. | |
| 2010/0275999 A1* | 11/2010 | Buelow, II | H01L 31/0547 136/259 |
| 2011/0126889 A1 | 6/2011 | Bourke, Jr. et al. | |
| 2013/0025663 A1* | 1/2013 | Liu | H01L 31/02363 257/E31.13 |
| 2013/0284264 A1* | 10/2013 | Pfenninger | H01L 31/055 136/257 |
| 2016/0380125 A1 | 12/2016 | Snaith et al. | |
| 2017/0358758 A1* | 12/2017 | Lee | C09K 11/025 |
| 2018/0072907 A1 | 3/2018 | Balan | |
| 2018/0096795 A1* | 4/2018 | Kim | H10K 85/30 |
| 2018/0196164 A1* | 7/2018 | Friend | H10K 59/38 |
| 2019/0093010 A1* | 3/2019 | Rand | C09K 11/025 |
| 2019/0148602 A1* | 5/2019 | Mu | C09K 11/665 362/362 |
| 2020/0212243 A1* | 7/2020 | Kim | H01L 31/043 |
| 2020/0255727 A1* | 8/2020 | Han | C09K 11/025 |
| 2022/0246873 A1* | 8/2022 | Im | G01T 1/2018 |

FOREIGN PATENT DOCUMENTS

| | | |
|---|---|---|
| CN | 106379932 A | 2/2017 |
| CN | 106796988 A | 5/2017 |
| CN | 107533289 A | 1/2018 |
| CN | 107887466 A | 4/2018 |
| WO | 2016091442 A1 | 6/2016 |
| WO | 2017/178905 A1 | 10/2017 |
| WO | 2017/205727 A1 | 11/2017 |
| WO | 2018/021794 A1 | 2/2018 |
| WO | 2018026326 A1 | 2/2018 |

OTHER PUBLICATIONS

International Search Report and Written Opinion mailed Jul. 16, 2019, for International Patent Application No. PCT/US2019/029355 filed Apr. 26, 2019, 16 pages.
Zhou, D. et al., "Cerium and Ytterbium Codoped Halide Perovskite Quantum Dots: A Novel and Efficient Downconverter for Improving the Performance of Silicon Solar Cells," Advanced Materials, 29:170419, 2017.
Pan, G. et al., "Doping Lanthanide into Perovskite Nanocrystals: Highly Improved and Expanded Optical Properties," Nano Letters, 17:8005-8011, 2017.
Crane, M.J. et al., "Detailed-balance analysis of Yb3+: CsPb(Cl1xBrx)3 quantum-cutting layers for high-efficiency photovoltaics under real-world conditions," Energy and Environmental Science, 12:2486-2495, 2019.
Kulbak, M. et al., "Cesium Enhances Long-Term Stability of Lead Bromide Perovskite-Based Solar Cells," Journal of Physical Chemistry Letters, 7:167-172, 2016.
Milstein, T.J. et al., "Picosecond Quantum Cutting Generates Photoluminescence Quantum Yields Over 100% in Ytterbium-Doped CsPbCl3 Nanocrystals," Nano Letters, 18:3792-3799, 2018.

Fu, X. et al., "Self-assembly and photoactivation of blue luminescent CsPbBr3 mesocrystals synthesized at ambient temperature," Journal of Materials Chemistry C, 6:1701-1708, 2018.
Gardecki, J.A. and Maroncelli, M., "Set of Secondary Emission Standards for Calibration of the Spectral Responsivity in Emission Spectroscopy," Applied Spectroscopy, 52(9):1179-1189, 1998.
Würth, C. et al., "Determination of the absolute fluorescence quantum yield of rhodamine 6G with optical and photoacoustic methods—Providing the basis for fluorescence quantum yield standards," Talanta, 90:30-37, 2012.
Hatami, S. et al., "Absolute photoluminescence quantum yields of IR26 and IR-emissive Cd1-xHgxTe and PbS quantum dots—method- and material-inherent challenges," Nanoscale, 7:133-143, 2015.
Nozik, A.J. et al., "The promise and challenge of nanostructured solar cells," Nature Nanotechnology, 9:951-954, 2014.
Trupke, T. et al., "Improving solar cell efficiencies by down-conversion of high-energy photons," J. Appl. Phys., 92:1668-1674, 2002.
NREL Best Research-Cell Efficiency Chart (Rev. Oct. 30, 2017).
Creutz, S.E. et al., "A Selective Cation Exchange Strategy for the Synthesis of Colloidal Yb3+-Doped Chalcogenide Nanocrystals with Strong Broadband Visible Absorption and Long-Lived Near-Infrared Emission," J. Am. Chem. Soc., 139:11814-11824, 2017.
Stranks, S.D. and Snaith, H.J., Metal-halide perovskites for photovoltaic and light-emitting devices. Nature Nanotechnology 10:391-402, 2015.
Xiao, Z. et al., "Efficient, high yield perovskite photovoltaic devices grown by interdiffusion of solution-processed precursor stacking layers," Energy and Environmental Science, 7:2619-2623, 2014.
Kondo, S. et al., "Annealing behaviors of quench-deposited (CsCl)1-x(PbCI2)x films studied by optical absorption spectroscopy," Materials Science and Engineering: B, 88:85-90, 2002.
Kondo, S. and Saito, T., "Strongly enhanced free-exciton luminescence in microcrystalline CsPbCl3 films produced via the amorphous phase," Solid State Communications, 127:731-736, 2003.
Henling, L.M. and McPherson, G.L., "EPR-Spectra of Magnetically Coupled Pairs of Gd3+ Ions in Crystals of CsMgCl3, CsMgBr3, and CsCdBr3," Phys. Rev. B, 16:4756-4760, 1977.
McPherson, G.L. and Henling, L.M., "EPR-Spectrum of Coupled Pairs of Gd3+ Ions in Single-Crystals of CsCdBr3," Phys. Rev. B, 16:1889-1892, 1977.
International Preliminary Report on Patentability mailed Jan. 15, 2021, for International Patent Application No. PCT/US2019/029355 filed Apr. 26, 2019, 18 pages.
Extended European Search Report mailed Dec. 21, 2021, issued in corresponding European Application No. EP 19793678, filed Apr. 26, 2019, 7 pages.
English translation of the First Chinese Office Action and Search Report mailed on Dec. 28, 2023, issued in the corresponding Chinese Application No. 2019800393571, filed Apr. 26, 2019, 26 pages.
European Commission—Directorate-General for Health & Consumers; Scientific Committee on Emerging and Newly Identified Health Risks (SCENIHR), Scientific Basis for the Definition of the Term "Nanomaterial", Approved for public consultation by written procedure on Jul. 6, 2010; pp. 1-43. <http://ec.europa.eu/health/ph_risk/risk_en.htm>.
Chinese Office Action mailed on Jul. 31, 2024, issued in the corresponding Chinese App. No. 201980039357.1, filed on Apr. 26, 2019; 15 pages.

* cited by examiner

FIG. 32A    FIG. 32B

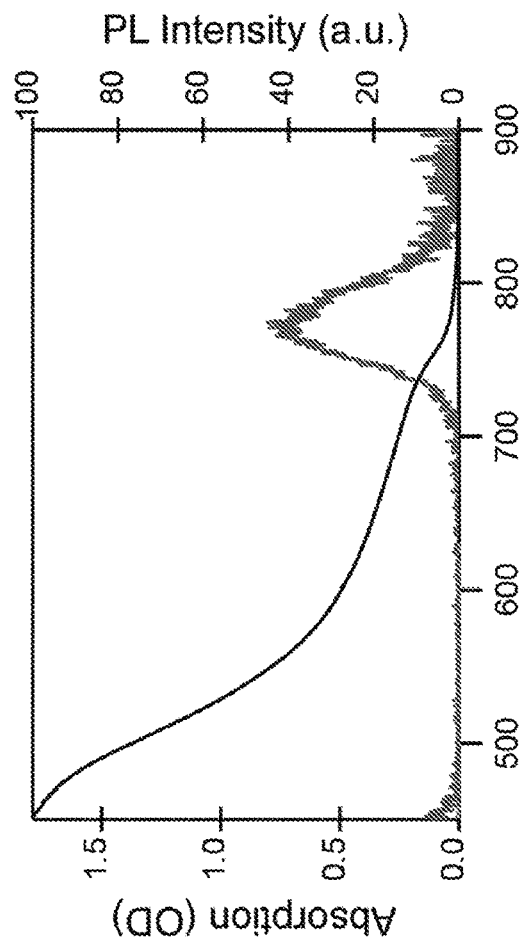
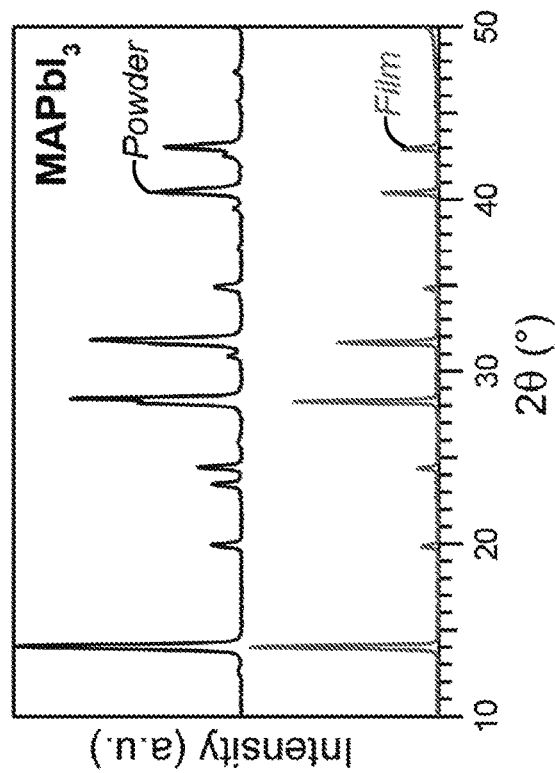
FIG. 43B
FIG. 43A

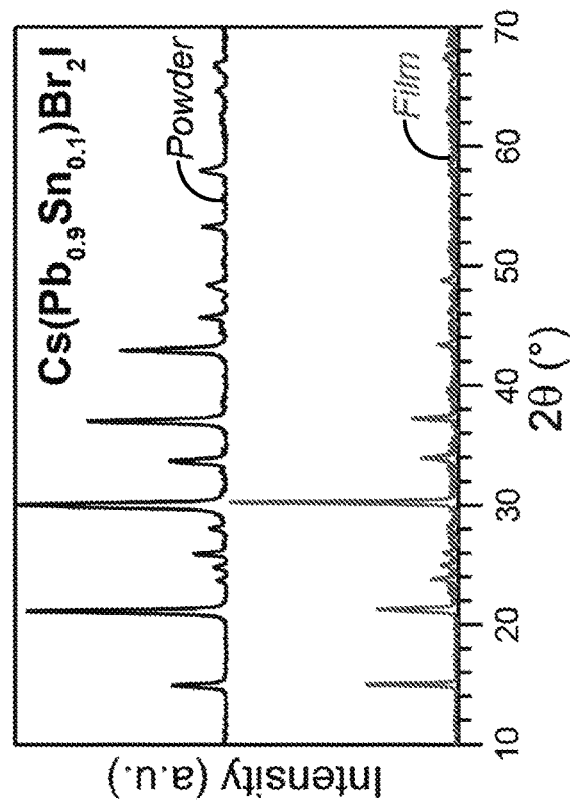
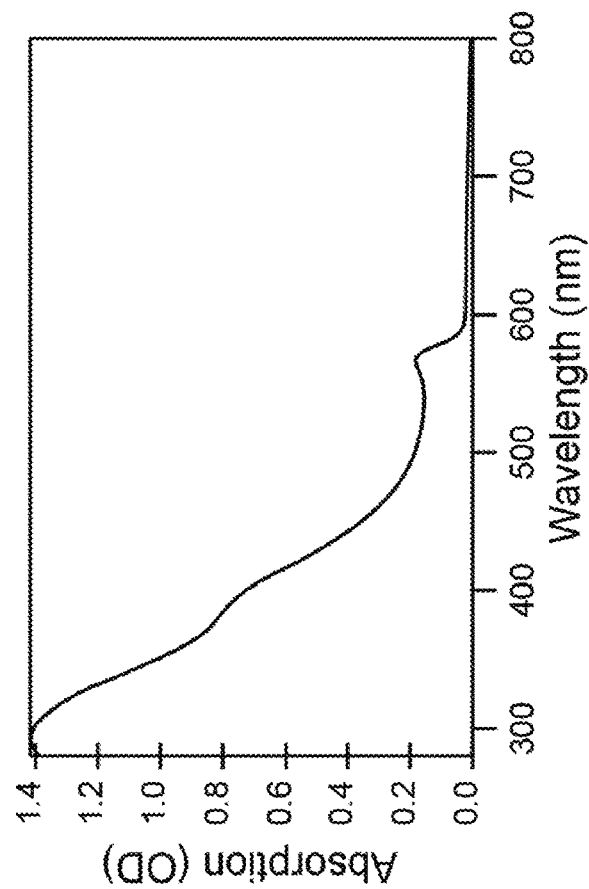
FIG. 48A
FIG. 48B

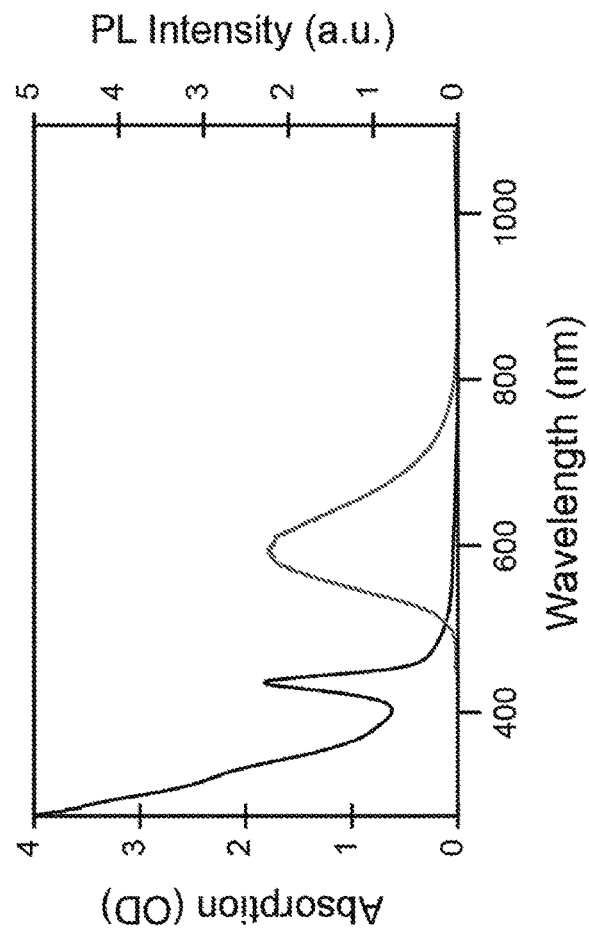
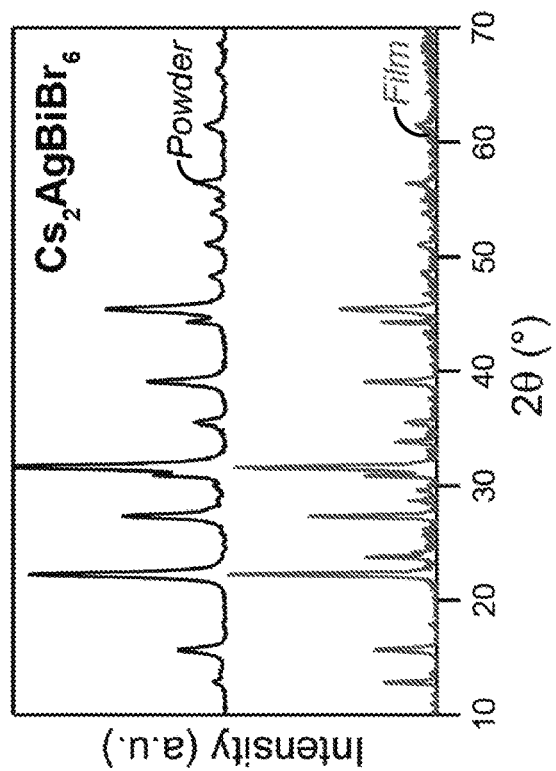
FIG. 49B
FIG. 49A

METAL-HALIDE SEMICONDUCTOR OPTICAL AND ELECTRONIC DEVICES AND METHODS OF MAKING THE SAME

CROSS-REFERENCES TO RELATED APPLICATIONS

This application claims the benefit of U.S. Provisional Application No. 62/663,656, filed Apr. 27, 2018, and U.S. Provisional Application No. 62/801,535, filed on Feb. 5, 2019, the entire contents of which are incorporated herein by reference.

STATEMENT OF GOVERNMENT LICENSE RIGHTS

This invention was made with government support under Grant Nos. DMR-1505901, DMR-1719797 and DMR-1807394, awarded by the National Science Foundation. The government has certain rights in the invention.

BACKGROUND

The global deployment of a secure, clean, and sustainable energy system that preserves our environment and promotes economic prosperity is one of the most critical challenges facing humanity. Solar energy holds the greatest promise to meet this challenge through the production of vast amounts of energy with net-zero greenhouse gas emissions. Commercially available photovoltaics (PVs), which capture and convert solar photons directly into electricity, are, on average, too expensive (dollars/kWh) to directly compete with conventional fossil fuels. Despite considerable progress in PV technology, the price of raw materials and assembly sets a lower limit that has been difficult to overcome, and the efficiencies of conventional PV devices are asymptotically approaching fundamental thermodynamic limits. Revolutionary approaches that bypass these fundamental limits are urgently needed.

One of the major energy-loss mechanisms limiting conventional PV devices is their inability to efficiently convert high-energy, ultraviolet (UV) and blue solar photons into electricity. Quantum-cutting downconversion layers at the front surfaces of solar cells can reduce these losses by transforming high-energy photons into lower energy photons that are more easily absorbed by the underlying PV. In addition, quantum-cutting downconverters convert high-energy solar photons into lower-energy photons with quantum yields that exceed 100%, i.e., a single absorbed photon yields more than one emitted photon. Thermodynamic detailed-balance calculations project that such downconversion can boost PV device efficiencies up to 39%—a significant improvement over the 29% thermodynamic limit of a conventional silicon (Si) PV or the 26.6% champion laboratory Si PV efficiency record.

Metal-halide perovskites and elpasolites are a broad class of semiconductors with desirable optical and electronic properties for numerous photonic applications including photovoltaic cells, photodetectors, and light emitting devices. In general, these materials are easy to process and handle using solution or vapor methods. Further, their unique electronic structure results in the formation of few deep electronic trap states despite their high propensity for crystalline defect formation. Thus, these materials often possess high band-to-band photoluminescence quantum yields approaching unity and exhibit desirable electronic transport properties.

More recently, the development of impurity-doped, metal-halide perovskite and elpasolite materials has further broadened their utility. The ionic nature of these lattices has allowed for the inclusion of a number of aliovalent impurities, most notably the lanthanides. The lanthanides are a group of elements in the periodic table (also often referred to as rare-earth (RE) elements, which include elements 57-71 on the periodic table plus scandium and yttrium) that are mostly stable in their trivalent ionic form ($RE^{3+}$) with the electronic configuration $4f^n 5s^2 5p^6$ where n varies from 0 to 14. The partly filled 4f inner electron shell of the lanthanides is shielded from the surrounding environment by the outer filled 5s and 5p electron shells giving rise to characteristic optical and magnetic properties that are minimally perturbed when doped into various matrices. This concept is captured by the so-called "Dieke diagram" which describes the rich electronic energy level structures of the various lanthanide ions (see, for example, FIG. 1, reproduced from Dieke et al., Appl. Opt. 1963, 2, 675). Due to their unique and relatively unchanging electronic structures in different environments, lanthanide ions have been broadly used to convert light to different, more useful wavelengths for applications including fluorescent tubes, lasers, white light emitting diodes, and they have also been widely used in other applications such as high-performance magnets, catalysts, alloys, glasses, electronics, security dyes, and agriculture.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In an aspect, the present disclosure provides a composition having a chemical formula selected from the group of formulae consisting of:

$M:ABX_3$,
$M:AB_2X_5$,
$M:A_4BX_6$,
$M:C_2DX_5$,
$M:A_2CDX_6$, and
combinations thereof, wherein, A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $y^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In an embodiment, the composition is configured to absorb a first quantum of energy having a first energy and configured to emit a second quantum of energy in response to absorbing the first quantum of energy, wherein the second quantum of energy is less than the first quantum of energy.

In another aspect, the present disclosure provides a device comprising a composition as described herein.

In another aspect, the present disclosure provides method of forming a film comprising depositing materials onto a substrate to form the film, wherein the film comprises a composition as described herein.

In another aspect, the present disclosure provides a method of forming a precursor mixture comprising forming one or more precursor materials into the precursor mixture, wherein the one or more precursor materials are selected from the group consisting of:

$M:ABX_3$, $M:AB_2X_5$, $M:A_4BX_6$, $M:C_2DX_5$, $M:A_2CDX_6$, $ABX_3$, $AB_2X_5$, $A_4BX_6$, $C_2DX_5$, $A_2CDX_6$, $AX$, $BX_2$, $CX$, $DX_3$, $MX_2$, and $MX_3$, wherein A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $y^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In another aspect, the present disclosure provides a material precursor mixture comprising: one or more precursor materials are selected from the group consisting of:

$M:ABX_3$, $M:AB_2X_5$, $M:A_4BX_6$, $M:C_2DX_5$, $M:A_2CDX_6$, $ABX_3$, $AB_2X_5$, $A_4BX_6$, $C_2DX_5$, $A_2CDX_6$, $AX$, $BX_2$, $CX$, $DX_3$, $MX_2$, and $MX_3$, wherein A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Y^{3+}$, $Lu^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 32A is a scanning electron microscopy (SEM) image of an un-doped $CsPbCl_3$ film, in accordance with an embodiment of the disclosure;

FIG. 32B is an SEM image of a $Yb^{3+}$-doped $CsPbCl_3$ film, in accordance with an embodiment of the disclosure;

FIG. 43A shows the X-ray diffraction pattern of $MAPbI_3$ powder (black) and a film deposited by SSVD (grey), in accordance with an embodiment of the disclosure;

FIG. 43B shows the absorption (black) and photoluminescence (gray) spectra of a $MAPbI_3$ film deposited by SSVD under photoexcitation, in accordance with an embodiment of the disclosure;

FIG. 48A shows the X-ray diffraction pattern of $Cs(Pb_{0.9}Sn_{0.1})Br_2I$ powder (black) and a film deposited by SSVD (grey), in accordance with an embodiment of the disclosure;

FIG. 48B shows the absorption spectrum of a $Cs(Pb_{0.9}Sn_{0.1})Br_2I$ film deposited by SSVD, in accordance with an embodiment of the disclosure;

FIG. 49A shows the X-ray diffraction pattern of $Cs_2AgBiBr_6$ powder (black) and a film deposited by SSVD (grey), in accordance with an embodiment of the disclosure;

FIG. 49B shows the absorption (black) and photoluminescence spectra (grey) of a $Cs_2AgBiBr_6$ film deposited by SSVD, in accordance with an embodiment of the disclosure;

DETAILED DESCRIPTION

The following provides examples of compositions suitable, for example, as downcoversion materials, and precursor mixtures thereof. In this regard, the compositions of the present disclosure may be configured to absorb a first quantum of energy having a first energy and configured to emit a second quantum of energy in response to absorbing the first quantum of energy, wherein the second quantum of energy is less than the first quantum of energy.

As discussed further herein, the downconversion materials of the present disclosure may be disposed on a substrate, such as in the form of a film. Such materials disposed on substrates may be incorporated into devices, such as photonic devices including, for example, a photovoltaic cell, a photovoltaic module, a photodetector, a light-emitting diode, a laser, and the like.

Figure 1:
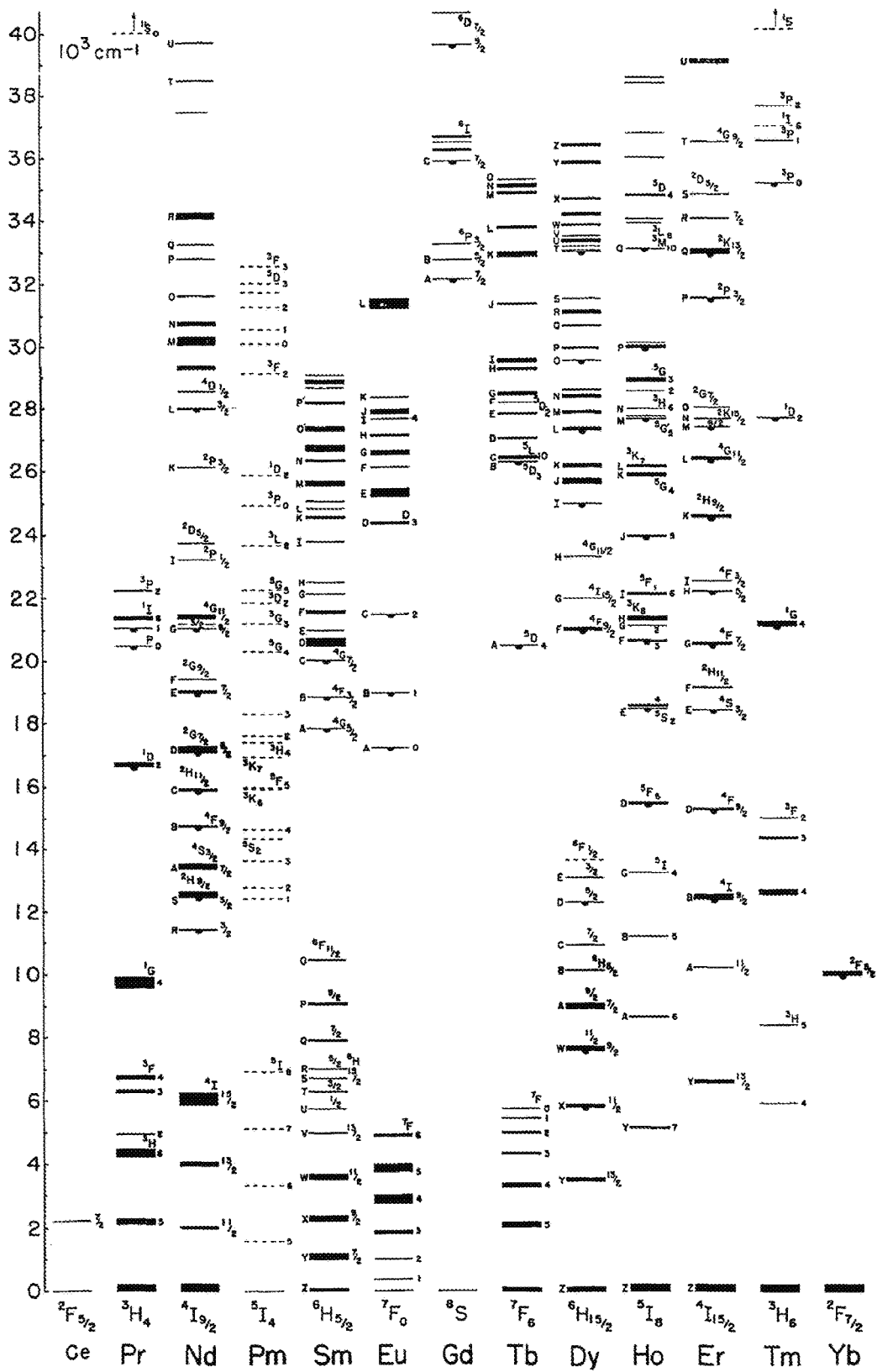
FIG. 1 is a Dieke Diagram, which depicts free ion energy levels of the trivalent lanthanide ions.
Figure 2:
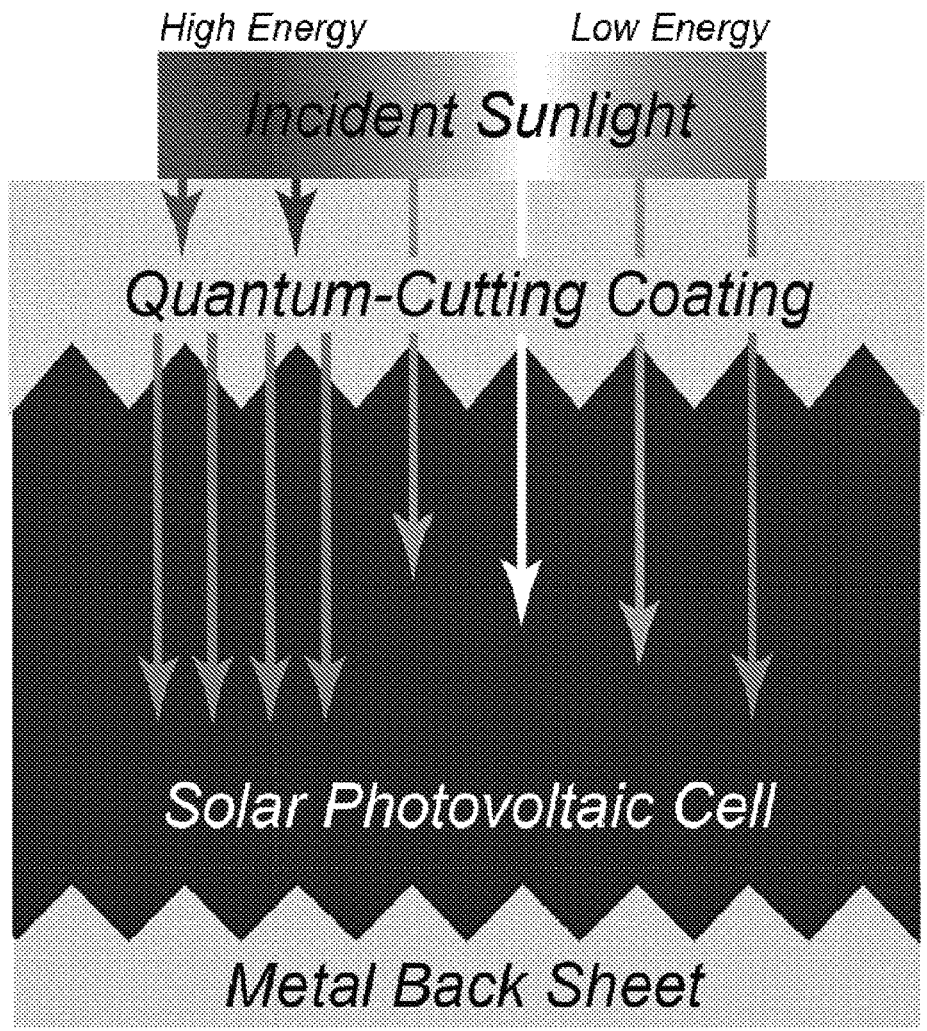
FIG. 2 illustrates schematically spectral conversion ability of a quantum-cutting coating on a solar photovoltaic cell in which high-energy solar photons are split into two lower-energy photons, in accordance with an embodiment of the disclosure.
Figure 3:
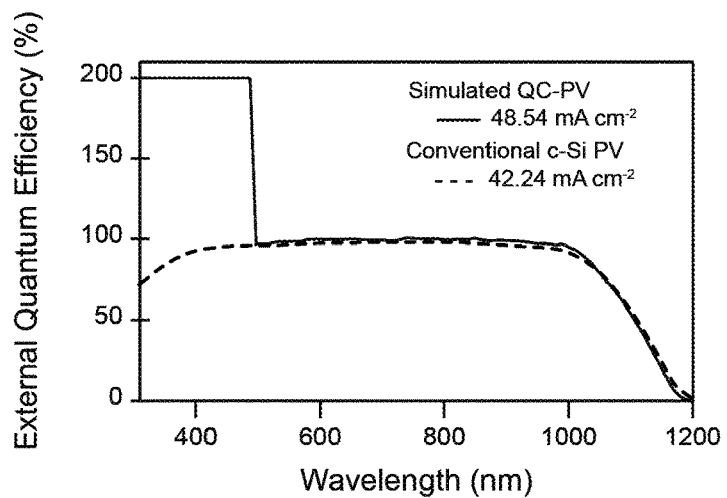
FIG. 3 shows external quantum efficiency data and simulated solar photovoltaic device characteristics for a conventional crystalline silicon photovoltaic cell and that same cell with a quantum-cutting coating, in accordance with an embodiment of the disclosure.
Figure 4:
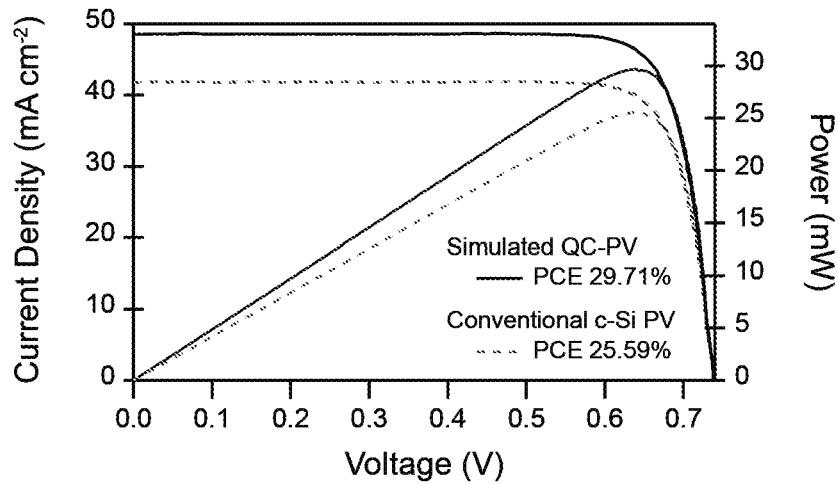
FIG. 4 shows current-voltage data and simulated solar photovoltaic device characteristics for a conventional crystalline silicon photovoltaic cell and that same cell with a quantum-cutting coating, in accordance with an embodiment of the disclosure.
Figure 5:
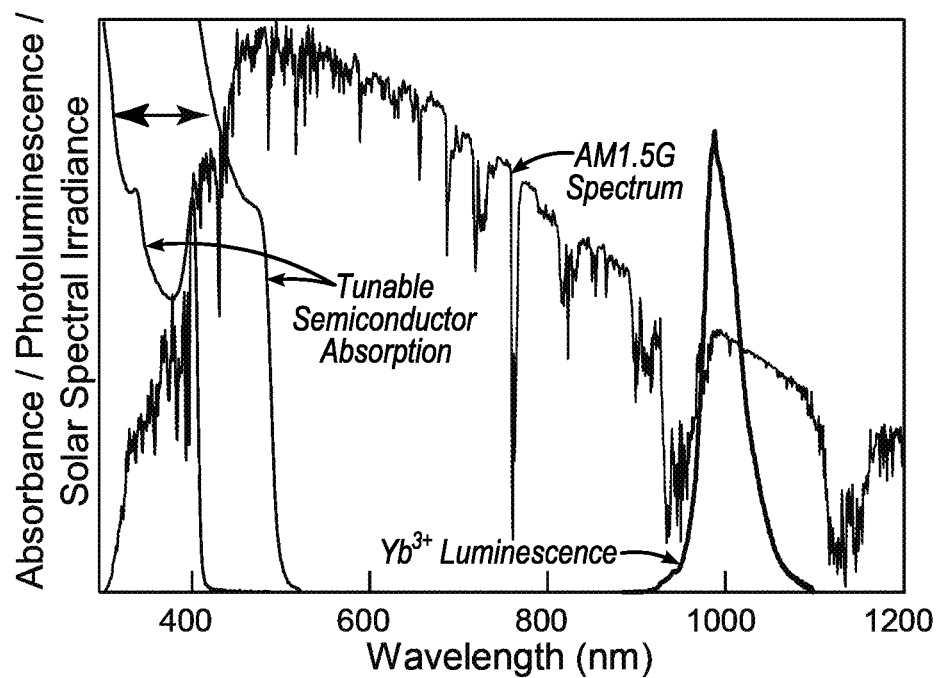
FIG. 5 shows absorption and luminescence characteristics of a quantum-cutting coating, in accordance with an embodiment of the disclosure.

Of particular interest is the sensitization of ytterbium ions ($Yb^{3+}$) by broadband absorbing semiconductors, such as metal-halide perovskites and elpasolites, that enable quantum cutting. Quantum cutting is the process in which a single high-energy quantum of energy (usually, but not necessarily, in the form of a high-energy photon absorbed by the material) is split into two or more lower-energy quanta (usually, but not necessarily, emitted from the material as lower-energy photons). As discussed further herein, the compositions of the present disclosure are configured for downconversion and quantum cutting. Efficient coupling of these lower-energy quanta, such as emitted from a composition of the present disclosure, into an acceptor (e.g. a solar cell or photodetector) via radiative or non-radiative processes can enable enhanced photonic technological implementations. An example solar photovoltaic cell cross section, in accordance with an embodiment of the disclosure, with a coupled luminescent quantum-cutting coating is shown in FIG. 2. Simulations of an example solar photovoltaic cell's external quantum efficiency spectrum and JV response with and without quantum cutting are shown in FIG. 3 and FIG. 4, respectively. The spectral characteristics of a luminescent quantum-cutting coating are shown in FIG. 5.

The present disclosure also describes examples of methods of making such compositions, both doped and un-doped examples, and methods of forming precursor mixtures for such compositions. In that regard, the present disclosure provides methods of preparing and depositing downconversion materials, such as on a substrate, and a method of forming a precursor mixture of the compositions of the present disclosure.

Compositions of Matter

In an aspect, the present disclosure provides compositions of matter. As described further herein, the compositions of the present disclosure are suitable, for example, as downconversion materials configured to absorb quanta of energy of a first wavelength and emit quanta of energy of a second wavelength different than the first wavelength.

Such quantum cutting characteristics are suitable, for example, to increase photoluminescence quantum efficiencies of photovoltaic cells.

In an embodiment, the compositions of the present disclosure have a chemical formula selected from the group of formulae consisting of:

M:$ABX_3$,
M:$AB_2X_5$,
M:$A_4BX_6$,
M:$C_2DX_5$,
M:$A_2CDX_6$, and
combinations thereof,
wherein,
A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $y^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In an embodiment, the composition is in the form of a film disposed on a substrate. In contrast with the analogous nanocrystals, these films may be deposited from solutions of ionic precursors at low temperatures by methods that are compatible with existing large-area surface-coating technologies. The resulting films show highly efficient quantum-cutting.

In an embodiment, the film has a thickness in a range of about 10 nm to about 5000 nm, more preferably of about 100 nm to about 1000 nm. In an embodiment, the composition is in a bulk form having a largest dimension in a range of about 1 μm to about 10 cm. As discussed further herein, such a composition, whether in film or bulk form, may be part of a device, such as an optoelectronic device.

As above, the compositions of the present disclosure can include a dopant, M. In an embodiment, M substitutes for B or D in a crystalline lattice. In an embodiment, a molar ratio of M/(B+M) is in a range of about 0% to about 49%, more preferably of about 0% to about 20%. In an embodiment, a molar ratio of M/(D+M) is in a range of about 0% to about 49%, more preferably of about 0% to about 20%.

Dopants, M, may or may not be associated with a defect of the crystalline lattice. In an embodiment, inclusion of M in the crystalline lattice is not associated with a cluster of M cations in the crystalline lattice. In an embodiment, inclusion of M in the crystalline lattice is associated with a cluster of two or more M cations.

As discussed further herein with respect to methods of the present disclosure, dopants, M, may be homogeneously or inhomogeneously distributed within the compositions of the present disclosure. Accordingly, in an embodiment, the composition comprises a plurality of M cations, and wherein M cations of the plurality of M cations are inhomogeneously distributed within the composition. In this regard, the composition may be suitable for creating a homojunction via doping within the film. For example, if half of the film is doped with an n-type dopant and the other half is doped with a p-type dopant, the composition is suitable to create a homojunction with rectifying behavior for PV or LED applications by changing the special distribution of dopants. Similarly, redistributing a dopant distribution, such as a $Yb^{3+}$ distribution, for quantum cutting by changing the local ratio of excitons to $Yb^{3+}$ dopants. This may be important for solar irradiance-dependent effects or high powered LEDs. Correspondingly, in an embodiment, the composition comprises a plurality of M cations, and wherein M cations of the plurality of M cations are homogeneously distributed within the composition.

In an embodiment, the composition is suspended in a matrix. In an embodiment, the composition is suspended in the matrix defines a spatial concentration gradient within the matrix. In an embodiment, the matrix, such as a polymer or glass, provides structural rigidity and improves the durability of the composition. This allows for incorporation of the compositions of the present disclosure into existing components of a device (glass top/bottom sheet, solar cell encapsulant layer, and the like). Further, such a concentration gradient may be suitable to produce beneficial photonic effects by slowly grading the refractive index to reduce reflections. In an embodiment, the composition is in the form of a mixed-phase and/or hetero-structured composition.

As above, in an embodiment, the compositions of the present disclosure are configured to absorb quanta of energy, such as photons. In an embodiment, the compositions are configured to absorb light having wavelengths in a range of about 250 nm to about 600 nm. As discussed further herein, in an embodiment, such compositions are suitable as downconversion layers for photovoltaic cells, photovoltaic modules, visible light photodetectors, visible light light-emitting diodes, and the like. In an embodiment, the compositions are configured to absorb light having wavelengths in a range of about 10 nm to about 400 nm. In an embodiment, such compositions are suitable as downcoversion layers in ultraviolet light photodetectors. In an embodiment, the compositions are configured to absorb light having wavelengths in a range of about 0.01 nm to about 10 nm. In an embodiment, such compositions are suitable as downcoversion layers in X-ray photodetectors. In an embodiment, the compositions are configured to absorb light having wavelengths less than 10 μm. In an embodiment, such compositions are suitable as downcoversion layers in gamma ray photodetectors. In an embodiment, the compositions are configured to absorb light having wavelengths in a range of about 250 nm to about 1100 nm. In an embodiment, such compositions are suitable as absorber layers for photovoltaic cells, and the like.

In an embodiment, the compositions are configured to emit light, such as in response to absorbing light and/or to application of a voltage to the composition. In an embodiment, the emitted light is as a result of band-edge recombination. In an embodiment, the emitted light is as a result of dopant emission.

In an embodiment, a number of emitted photons is greater than a number of absorbed photons, such as when M is $Yb^{3+}$. As discussed further herein, incorporation of compositions exhibiting this phenomenon into devices, such as photovoltaic cells, photodetectors, and the like, is suitable to increase external quantum efficiencies over analogous devices that do not include such compositions.

In an embodiment, the composition is selected from the group consisting of $Yb^{3+}:CsPbCl_3$, $Yb^{3+}:CsPb(Cl_{1-x}Br_x)_3$, $Yb^{3+}:CsSnCl_3$, $Yb^{3+}:CsSn(Cl_{1-x}Br_x)_3$, $Yb^{3+}:RbPbCl_3$, $Yb^{3+}:RbPb(Cl_{1-x}Br_x)_3$, $Yb^{3+}:(Rb_{1-x}Cs_x)Pb(Cl_{1-x}Br_x)_3$, $Yb^{3+}:FAPbCl_3$, $Yb^{3+}:FAPb(Cl_{1-x}Br_x)_3$, $Yb^{3+}:(FA_{1-x}Cs_x)PbCl_3$, $Yb^{3+}:(FA_{1-x}Cs_x)Pb(Cl_{1-x}Br_x)_3$, $Yb^{3+}:(Rb_{1-x}Cs_x)(Pb_{1-x}Sn_x)(Cl_{1-x}Br_x)_3$, $Yb^{3+}:Cs_2PbCl_2I_2$, $Yb^{3+}:Cs_2SnCl_2I_2$, $Yb^{3+}:Cs_2AgBiCl_6$, $Yb^{3+}:Cs_2AgBiBr_6$, $Yb^{3+}:Cs_2AgBi(Cl_{1-x}Br_x)_6$, $Yb^{3+}:Cs_2AgInCl_6$, $Yb^{3+}:Cs_2AgIn(Cl_{1-x}Br_x)_6$, $Mn^{2+}:CsPbCl_3$, and $Mn^{2+}:CsPb(Cl_{1-x}Br_x)_3$, wherein x is a number between 0 and 1.

In an embodiment, the compositions of the present disclosure are suitable downconversion materials for solar photovoltaics including narrow-bandgap active materials, such as silicon and copper-indium-gallium-selenide. Such downconversion material can include downconversion materials selected from the group consisting of $Yb^{3+}:CsPbCl_3$, $Yb^{3+}:CsPb(Cl_{1-x}Br_x)_3$, $Yb^{3+}:CsSnCl_3$, $Yb^{3+}:CsSn(Cl_{1-x}Br_x)_3$, $Yb^{3+}:RbPbCl_3$, $Yb^{3+}:RbPb(Cl_{1-x}Br_x)_3$, $Yb^{3+}:(Rb_{1-x}Cs_x)Pb(Cl_{1-x}Br_x)_3$, $Yb^{3+}:FAPbCl_3$, $Yb^{3+}:FAPb(Cl_{1-x}Br_x)_3$, $Yb^{3+}:(FA_{1-x}Cs_x)PbCl_3$, $Yb^{3+}:(FA_{1-x}Cs_x)Pb(Cl_{1-x}Br_x)_3$, $Yb^{3+}:(Rb_{1-x}Cs_x)(Pb_{1-x}Sn_x)(Cl_{1-x}Br_x)_3$, $Yb^{3+}:Cs_2PbCl_2I_2$, and combinations thereof, wherein x is a number between 0 and 1.

In an embodiment, the compositions of the present disclosure are suitable lead-free downconversion materials for solar photovoltaics including for solar photovoltaics including narrow-bandgap active materials, such as silicon and copper-indium-gallium-selenide. Such downconversion material can include downconversion materials selected from the group consisting of $Yb^{3+}:Cs_2SnCl_2I_2$, $Yb^{3+}:Cs_2AgBiCl_6$, $Yb^{3+}:Cs_2AgBiBr_6$, $Yb^{3+}:Cs_2AgBi(Cl_{1-x}Br_x)_6$, $Yb^{3+}:Cs_2AgInCl_6$, $Yb^{3+}:Cs_2AgIn(Cl_{1-x}Br_x)_6$, and combinations thereof, wherein x is a number between 0 and 1.

In an embodiment, the compositions of the present disclosure are suitable downconversion materials for solar photovoltaics including wide-bandgap active materials, such as cadmium telluride, gallium arsenide, and methylammonium lead iodide. Such downconversion materials can include downconversion materials selected from the group consisting of $Mn^{2+}:CsPbCl_3$, and $Mn^{2+}:CsPb(Cl_{1-x}Br_x)_3$, and combinations thereof, wherein x is a number between 0 and 1.

In an embodiment, compositions of matter suitable for inclusion in photovoltaics include compositions selected from the group consisting of $MAPbI_3$; $(FA_{1-x}Cs_x)PbI_3$; $(FA_{1-x}Cs_x)Pb(Br_{1-x}I_x)_3$; $(FA_{1-x-y}MA_xCs_y)Pb(Cl_{1-x-y}Br_xI_y)_3$; $CsPb(Br_{1-x}I_x)_3$; $Cs(Pb_{1-x}Sn_x)(Br_{1-x}I_x)_3$.

Downconversion Layers

As above, in an embodiment, the compositions of the present disclosure are suitable for inclusion in downconversion layers. Accordingly, in an aspect, the present disclosure provides a downconversion layer comprising a composition of the present disclosure. As used herein, a "downcoversion layer" refers to a layer or film comprising a composition configured to convert a first quantum of energy into one or more quanta of energy lower than the first quantum of energy. Such energy conversion can be through radiative or non-radiative processes.

In an embodiment, an electronic excited-state in the downconversion layer may be generated by the absorption of a photon. In an embodiment, an electronic excited-state in the downconversion layer may be generated by the injection of charge carriers from external electrodes.

In an embodiment, the downconversion layer is configured to absorb all or a portion of light emitted from a broadband light source (i.e. a light source emitting photons of more than one wavelength) such as the sun, a lamp, or an ensemble of emitting diodes or lasers. In an embodiment, the downconversion layer is configured to absorb all or a portion of light emitted from a monochromatic source (i.e. emitting photons of a single wavelength or a narrow band of wavelengths) such as lasers or light-emitting diodes.

Energy from an electronic excited state of the downconversion layer may be directly or indirectly converted into one or more lower energy photons. In this regard, devices, such as photovoltaic cells, including a downconversion layer are configured to have external quantum efficiencies in a range of about 0% to about 200%. In an embodiment, a device including a downconversion layer of the present disclosure is configured to have an external quantum efficiency greater than 100%. As used herein, compositions and devices having photoluminescence quantum yields and/or external quantum efficiencies greater than 100% are referred to as quantum cutting materials and devices.

As discussed further herein with respect to devices of the present disclosure, energy from an electronic excited state of the downconversion layer may be directly or indirectly converted into one or more charge carriers in an acceptor material through radiative or non-radiative energy transfer processes. Such acceptor materials can include molecules, semiconducting polymers, inorganic semiconductors, and the like.

In one embodiment, a spectral downconversion layer is composed of a single layer of downconversion material. Such a downconversion layer is in contrast to a downconversion layer comprising two or more downconversion sub-layers. In an embodiment, the downconversion material has a uniform or substantially uniform composition. In an embodiment, different downconversion layers absorb different parts of the solar spectrum. Further, absorbing the light with multiple thin layers effectively reduces the incident photon flux on each layer, which may elicit beneficial effects, such as in improved external quantum efficiency and the like.

In one embodiment, the spectral downconversion layer is composed of a spectral downconversion material suspended in a matrix. In an embodiment, the matrix is selected from the group consisting of a polymer, an inorganic lattice, a resin, a liquid, and combinations thereof. In an embodiment, the downconversion material is suspended in the matrix prior to or after depositing the layer onto a substrate. In an embodiment, the downconversion material is suspended in the matrix through solvent swelling infusion of a polymer. In an embodiment, the matrix is formed using atomic layer deposition on a film of spectral downconversion material deposited onto a substrate. In an embodiment, the downconversion material suspended in the matrix has a varying composition.

In an embodiment, a spectral downconversion layer is composed of more than one sub-layer comprising downconversion material(s). In an embodiment, different sub-layers of the spectral downconversion layer absorb different portions of, for example, the solar radiation spectrum. Such two or more downconversion sub-layers can be deposited using similar or different methods. In an embodiment, each sub-layer comprises the same or a similar downconversion material. In an embodiment, one or more sub-layers comprise different downconversion materials. In an embodiment, one or more of the downconversion materials are suspended in a matrix.

In an embodiment, the downconversion material suspended in the matrix is ordered to define a gradient of absorber band gaps arranged highest to lowest, for example in a direction of light propagation. In an embodiment, the gradient of high-to-low bandgap is configured to absorb different wavelengths of light. Such a gradient may be suitable to minimize saturation effects under high excitation density. In an embodiment, an additional sub-layer may be deposited directly on top of the underlying sub-layer to form a gradient. In that regard, attention is directed to FIG. 23, where a cross-section of a downconversion layer, in accordance with an embodiment of the present disclosure, is schematically illustrated. As shown, the composition of down conversion sub-layers defines a gradient in which a highest-bandgap sub-layer is disposed adjacent to a surface of the downconversion layer configured to receive incident light and a lowest-bandgap sub-layer is disposed in the down conversion layer opposite the highest-bandgap sub-layer.

Figure 23:
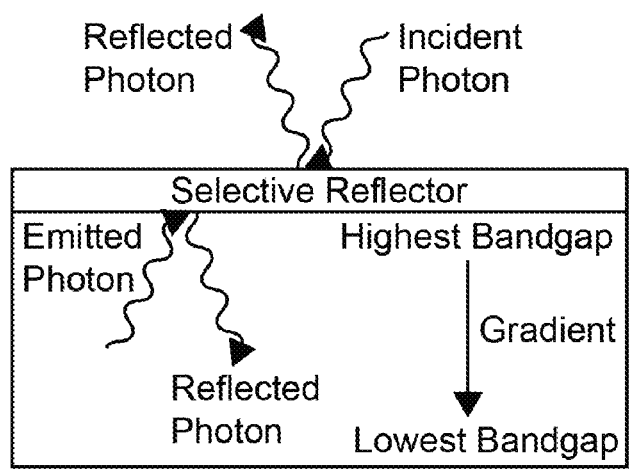
FIG. 23 illustrates schematically a cross-section of a downconversion layer in which the composition of sub-layers defines a gradient, in accordance with an embodiment of the disclosure.

The downconversion layer of FIG. 23 is shown to further include a selective reflector. As discussed further herein, such a selective reflector may be configured to direct light, such as an emitted photon from the downconversion layer towards a solar cell, where such an emitted photon might otherwise be directed away from the solar cell. In an embodiment, the selective reflector may be configured to direct light, such as an emitted photon from the solar cell back toward a solar cell or an emitted photon from the solar cell at a certain angle. In an embodiment, photons emitted by the sun may be directed away from the solar cell. In an embodiment, the selective reflector is configured to allow photons of specific wavelengths to transmit through the selective reflector and reflect photons of specific wavelengths. In an embodiment, the selective reflector reflects light having wavelengths in a range of about 950 nm to about 1050 nm and allows light having wavelengths outside this range to pass through the selective reflector. In an embodiment, the selective reflector reflects light having wavelengths greater than 950 nm to reflect photons emitted by the downconversion layer, solar cell, In an embodiment, the selective reflector has a structure chosen from a distributed Bragg reflector, dichroic mirrors, and/or rugate filters. In an embodiment, the selective reflector is composed of alternating thin layers or spatially varying refractive indices. In an embodiment, the selective reflector comprises a material selected from the group consisting $TiO_2$, $ZrO$, $MgO$, $ZnS$, $SiO_2$, $MgF$, $Ta_2O_5$, and combinations thereof.

Figure 24:
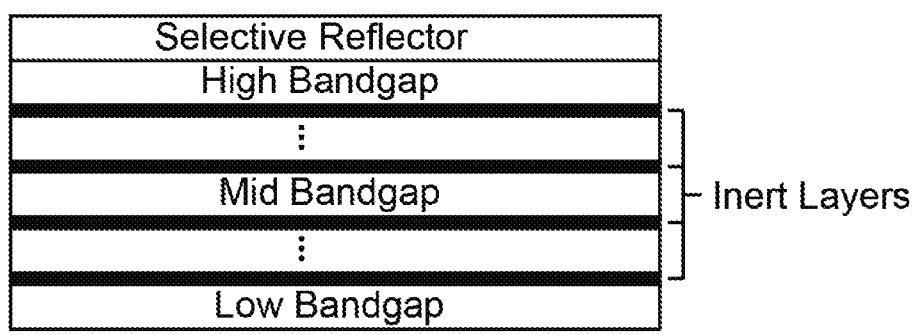
FIG. 24 illustrates schematically a cross-section of a downconversion layer in which the composition of sub-layers defines a gradient where each sub-layer is separated by inert spacer layers, in accordance with an embodiment of the disclosure.

In an embodiment, downconversion layers comprising two or more downconversion sub-layers include a spacer layer disposed between such two or more downconversion sub-layers. In that regard, attention is directed to FIG. 24 in which a downconversion layer, in accordance with an embodiment of the disclosure, is illustrated. As shown, the downconversion layer includes a selective reflector disposed on a side of the downconversion layer configured to receive incident light and a plurality of downconversion sub-layers. In the illustrated embodiment, a high-bandgap downconversion sub-layer is disposed adjacent to the side of the downconversion layer configured to receive incident light. A low-bandgap downconversion sub-layer is disposed on a side opposite the side of the downconversion layer configured to receive incident light with a mid-bandgap downconversion sub-layer disposed between the low-bandgap and high-bandgap sub-layers. In this regard, the composition of sub-layers defines a bandgap gradient.

Further, the downconversion layer is shown to include inert spacer layers disposed between the downconversion sub-layers. In an embodiment, the inert spacer layer is configured to prevent or limit mixing of different compositions between adjacent downconversion layers. "Ion scrambling" is known to readily occur in adjacent perovskite layers, which results in homogenization of the chemical composition over time, leading to decreased layer device performance. In an embodiment, the inert spacer layer includes one or more photonic structures that modify the direction of emitted or scattered light within a solar cell or other device. This would allow the inert spacer layer to accomplish the role of a selective reflector, for example. Such inert spacer layers may be configured to chemically or otherwise isolate the downconversion sub-layers from one another. In an embodiment, the spacer layers comprise an organic material. In an embodiment, the spacer layers comprise an inorganic layer. Such spacer layers may be deposited as described further herein with respect to the methods of the present disclosure.

In an embodiment, a thickness of the spacer layers, spectral downconversion sub-layers, refractive index of the film, and/or a surface roughness of the film are tuned to enhance emission of light from the spectral downconversion material. In this regard, the layers are to act as to act as cavities that constructively amplify and destructively decrease different wavelengths.

In an embodiment, a thickness of the spectral downconversion layer is tuned to enhance absorption or emission of a predetermined wavelength. In an embodiment, the thickness of the spectral downconversion layer is in a range of about 1/16 times the predetermined wavelength and 1 times the predetermined wavelength.

In an embodiment, a thickness of the spectral downconversion layer is tuned to decrease reflected losses of transmitted light. In an embodiment, the thickness of the spectral downconversion layer is approximately 1/16 to 1/2 of the wavelength of the transmitted light.

In one embodiment, one or more surfaces of the spectral downconversion layer are patterned. In an embodiment, the downconversion layer includes a surface configured to reflect light in random directions (i.e., act as a lambertian reflector). In an embodiment, the spectral downconversion layer is patterned to direct light emitted from the downconversion layer in one or more directions. In an embodiment, such a patterned downconversion layer is deposited onto a patterned surface, as described further herein, where the patterned surface transmits one or more features of the patterned surface into the downconversion layer.

Material Precursor Mixture

In another aspect, the present disclosure provides a material precursor mixture. In an embodiment, the material precursor mixture comprises one or more precursor materials selected from the group consisting of:

$M:ABX_3$, $M:AB_2X_5$, $M:A_4BX_6$, $M:C_2DX_5$, $M:A_2CDX_6$, $ABX_3$, $AB_2X_5$, $A_4BX_6$, $C_2DX_5$, $A_2CDX_6$, $AX$, $BX_2$, $CX$, $DX_3$, $MX_2$, and $MX_3$, wherein A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $y^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

As discussed further herein, such a material precursor mixture may be suitable for use in preparing a composition of matter and/or downconversion layer of the present disclosure. In an embodiment, the material precursor mixture is configured to form a composition having a chemical formula selected from the group of formulae consisting of:

$M:ABX_3$,
$M:AB_2X_5$,
$M:A_4BX_6$,
$M:C_2DX_5$,
$M:A_2CDX_6$, and
combinations thereof.

In an embodiment, a molar ratio of M/(B+M) of the composition is in a range of about 0% to about 49%. In an embodiment, a molar ratio of M/(D+M) of the composition is in a range of about 0% to about 49%.

In an embodiment, a composition of the present disclosure may be formed from the material precursor mixture using one or more of the methods of the present disclosure. In that regard, in an embodiment, the material precursor mixture is a sputtering target assembly configured to provide a composition of the present disclosure when sputtered, as discussed further herein.

In an embodiment, the material precursor mixture is in a form selected from the group consisting of a pellet, a disk, a wafer, a regular polygon, and a rectangle. Such forms may depend, for example, on the nature of transformations and/or manipulations used to prepare compositions from the material precursor mixture.

Devices

In another aspect, the present disclosure provides devices comprising the compositions of the present disclosure. As discussed further herein, such devices can include optoelectronic device such as photovoltaic cells, photodetectors, photovoltaic modules, and light-emitting diodes.

Photovoltaic Cells

In an embodiment, the present disclosure provides a photovoltaic cell coupled to a spectral downconversion layer of the present disclosure. As used herein, a "photovoltaic cell" refers to an electrical device including a semiconducting material configured to absorb and convert the energy of light into electricity by the photovoltaic effect.

As above, the downconversion layers of the present disclosure are configured to absorb a first quantum of energy having a first energy and configured to emit a second quantum of energy in response to absorbing the first quantum of energy, wherein the second quantum of energy is less than the first quantum of energy. In this regard, light absorbed by downconversion layer may be configured to absorb a photon of a first energy and emit two or more photons of a second energy lower than the first energy for receipt by the photovoltaic device. As discussed further herein, such two or more photons may subsequently be absorbed by a photovoltaic cell and converted into electrical energy. Such quanta of downconverted energy may be transferred to the photovoltaic cell through radiative or non-radiative processes. In that regard, the photovoltaic cell may be optically and/or electronically coupled to the downconversion layer.

As discussed further herein, the downconversion layer may be configured to generate more photons than a number of photons incident upon and/or absorbed by the downconversion layer. In that regard, the transferred quanta of energy may result in increased photocurrent from the photovoltaic cell relative to an analogous photovoltaic device that is not coupled to such a downconversion layer. Further, the downconversion layer may result in decreased photovoltaic cell operating temperatures, thus leading to additional increases in device efficiency. Additionally, in an embodiment, the downconversion layer is configured to decrease the reflection of incident light, thus operating as an antireflective coating and leading to increased light absorption by the photovoltaic cell.

The photovoltaic cell may be configured to receive incident light, such as incident solar radiation, on a single face (standard or monofacial cell) or on top and bottom faces (bifacial cell). Light absorbed on such active faces of the solar cell is configured to downconvert in the downconversion layer through quantum cutting, with photons emitted by the downconversion layer configured to be received by the photovoltaic cell.

In an embodiment, the downconversion layer is stacked onto an active face of a solar photovoltaic cell. In that regard, attention is directed to FIGS. 6A and 6B in which photovoltaic cells, in accordance with an embodiment of the disclosure, are illustrated.

Figure 6A:
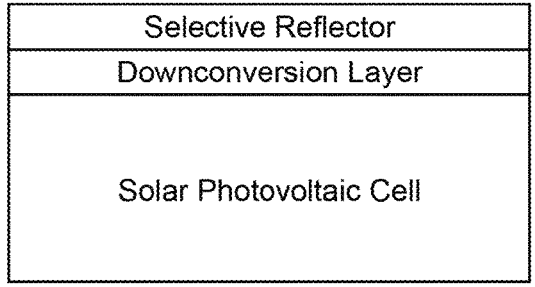
FIG. 6A illustrates schematically a monofacial solar photovoltaic cell with a downconversion layer stacked onto an active face of the solar photovoltaic cell, in accordance with an embodiment of the disclosure.

The embodiment of FIG. 6A is shown to include a photovoltaic cell, a downconversion layer coupled to the photovoltaic cell, and a selective reflector coupled to the downconversion layer. The photovoltaic cell of FIG. 6A is a monofacial photovoltaic cell configured to absorb light on the side of the photovoltaic cell in which the down conversion layer is coupled to the photovoltaic cell. As above, a portion of light absorbed by the downconversion layer is downconverted to provide lower-energy photons for receipt by the photovoltaic cell.

The selective reflector is configured to selectively reflect photons emitted by the downconversion layer towards the photovoltaic cell for further absorption and electron generation.

Figure 6B:
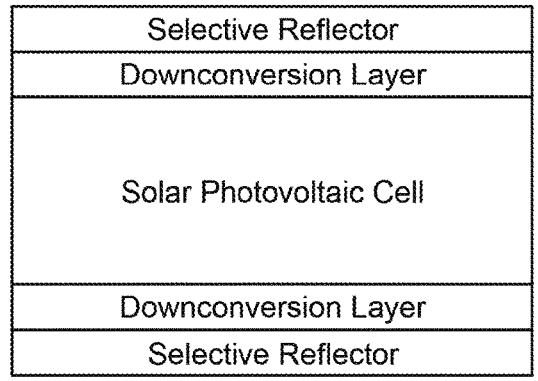
FIG. 6B illustrates schematically a bifacial solar photovoltaic cell with downconversion layers stacked onto an active face of the solar photovoltaic cell, in accordance with an embodiment of the disclosure.

The embodiment of FIG. 6B is shown to include downconversion layers disposed on two major sides of the photovoltaic cell. Such a bifacial photovoltaic cell is configured to absorb photons on both major surfaces for conversion to electrons. The embodiment of FIG. 6B is shown to further include selective reflectors disposed on surfaces of the downconversion layers opposite the photovoltaic cell. As above, such selective reflectors are configured to direct photons emitted from the downconversion layers toward the photovoltaic cell.

Figure 7A:
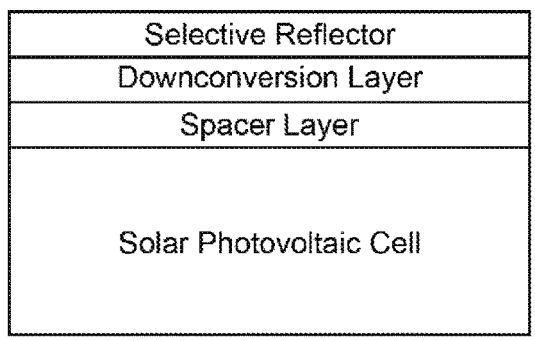
FIG. 7A illustrates schematically a monofacial solar photovoltaic cell with a downconversion layer disposed adjacent to an active face of the solar photovoltaic cell with a spacer layer between the solar photovoltaic cell and the downcoversion layer, in accordance with an embodiment of the disclosure.
Figure 7B:
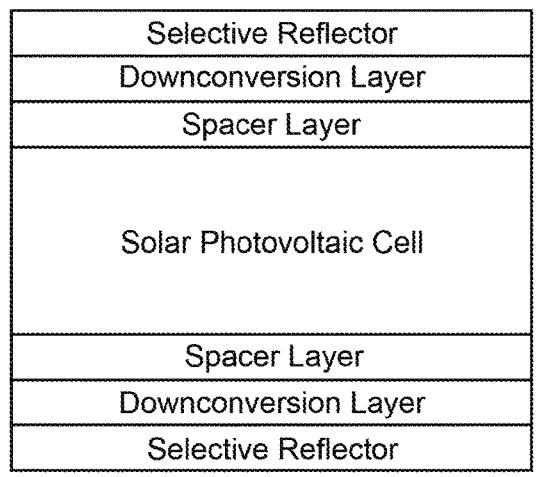
FIG. 7B illustrates schematically a bifacial solar photovoltaic cell with a downconversion layer stacked adjacent to an active face of the solar photovoltaic cell with a spacer layer between the solar photovoltaic cell and the downcoversion layer, in accordance with an embodiment of the disclosure.

In an embodiment, photovoltaic cells include a spacer layer disposed between a downconversion layer and a photovoltaic cell. In an embodiment, the spacer layer is configured to provide a chemical barrier between the solar cell and downconversion layer to prevent or limit chemical or mechanical damage to the underlying solar cell during deposition and long-term operation. In an embodiment, the spacer is suitable as an antireflective layer. In that regard, attention is directed to FIGS. 7A and 7B, in which photovoltaic cells, in accordance with an embodiment of the disclosure, are illustrated. As shown, the embodiments of FIGS. 7A and 7B include selective reflectors disposed on the downconversion layers, as discussed further herein with respect to FIGS. 6A and 6B. The embodiments of FIGS. 7A and 7B are shown to further include a spacer layer disposed between the downconversion layer and the photovoltaic cell. Such a spacer layer may be composed of an organic or inorganic material and functions to physically, chemically, and/or thermally separate the downconversion layer from the photovoltaic cell. Such spacer layers may be deposited using, for example, any of the deposition methods described further herein with respect to the methods of the present disclosure.

Figure 20:
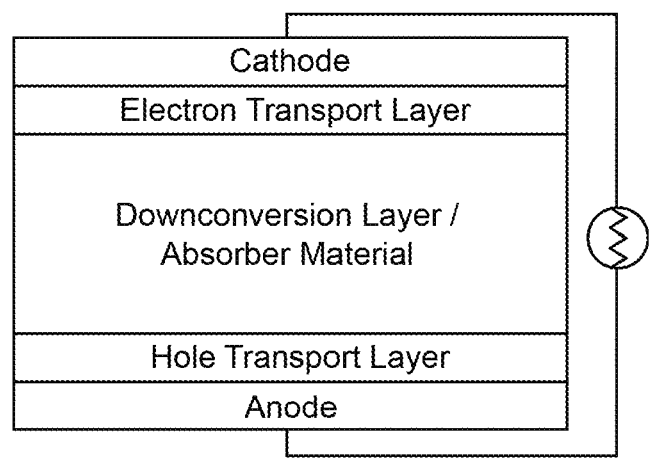
FIG. 20 illustrates schematically a cross-section of a single-junction photovoltaic cell with a downconversion layer serving as an active photo-absorber material, in accordance with an embodiment of the disclosure.

As above, in an embodiment, the downconversion layers are optically and/or electronically coupled to photovoltaic cells, which include absorber materials configured to absorb photons and convert the absorbed photons into electrons. In an embodiment, the present disclosure provides photovoltaic cells comprising downconversion layer of the present disclosure, which is an absorber layer. In that regard, attention is directed to FIG. 20, in which a photovoltaic cell, in accordance with an embodiment of the disclosure is illustrated. As shown, the photovoltaic cell includes a series of stacked layers including a transparent or reflective anode, a transparent or reflective cathode, a hole transport layer, an electron transport layer, and an absorber material comprising a downconversion layer. Such a downconversion layer can be any downconversion layer described herein. The illustrated embodiment is shown as a single junction photovoltaic cell. In an embodiment, the active material is electrically conductive and, for example, suitable to conduct charge carriers from the active material to the anode and cathode.

The electron transport layer and hole transport layer are configured to transport electrons and holes, respectively, such as for receipt by the cathode and anode, respectively. In an embodiment, the electron and/or hole transport layers are composed of a material selected from the group consisting of titanium dioxide ($TiO_2$), Spiro-OMeTAD (2,2',7,7'-Tetrakis[N,N-di(4-methoxyphenyl)amino]-9,9'-spirobifluorene), PC61BM (phenyl-$C_{61}$-butyric acid methyl ester), ZnO:PEI (ZnO:polyethylenimine), PEDOT:PSS (poly(3,4-ethylenedioxythiophene)-poly(styrenesulfonate)), F8 (poly (9,9'-dioctylfluorene), TPBi (1,3,5-tris(1-phenyl-1H-benzimidazol-2-yl)benzene), TPD (N,N'-bis(3-methylphenyl)-N, N'-diphenylbenzidine), TFB (poly(9,9-dioctyl-fluorene-co-N-(4-butylphenyl)diphenylamine), LiF, ZnO, BCP (Bathocuproine), tin oxide, cadmium selenide, cadmium sulfide, nickel oxide, copper thiocyanate, copper iodide, copper bromide, copper chloride, OXD7 (1,3-bis[4-(tert-butylphenyl)-1,3,4-oxadiazolyl]phenylene), and combinations thereof.

The anodes and cathodes can comprise any material suitable to conduct charge carriers from hole-transport layers and electron-transport layers, respectively. In an embodiment, the anodes and cathodes comprise a material selected from the group consisting of indium tin oxide, aluminum tin oxide, fluorine tin oxide, indium zinc oxide, silver nanowires, silver, tungsten, molybdenum, copper, nickel, aluminum, gold, palladium, platinum, magnesium, calcium, carbon, carbon nanotubes, graphene, graphite, oxides thereof, and combinations thereof. In an embodiment, the anodes and cathodes comprise a material selected from the group consisting of indium tin oxide, fluorine tin oxide, indium zinc oxide, silver nanowires, silver, aluminum, gold, and combinations thereof.

In an embodiment, the photovoltaic cell includes has an anti-reflective coating adjacent to either the anode or cathode suitable to reduce reflection of incident photons. In an embodiment, the anti-reflective coating includes a graded (either through chemical or physical structuring) and/or layered material. In an embodiment, the anti-reflective coating includes a material selected from the group consisting of $TiO_2$, ZrO, MgO, ZnS, $SiO_2$, MgF, $Ta_2O_5$, EVA, and combinations thereof.

Such an anti-reflective coating may configured to reduce a number of photons incident upon the photovoltaic device that are reflected away from the photovoltaic device and an absorber material disposed therein.

In an embodiment the photovoltaic cells of the present disclosure are multi-junction photovoltaic cells. Such multi-junction photovoltaic cells comprise two or more sub-cells, such as where each sub-cell has an absorber layer with a different band gap energy. In an embodiment, such two or more sub-cells are stacked such that band gap energies are arranged highest to lowest in a direction of light propagation.

In an embodiment, one or more of the sub-cells of the multi-junction cells of the present disclosure includes a downconversion layer and/or a composition of the present disclosure. In an embodiment, one or more of the sub-cells of the multi-junction cells of the present disclosure includes a material selected from the group consisting of silicon, copper-indium-gallium-selenide (CIGS), group II-VI semiconductor, group III-V semiconductor, and combinations thereof.

Figure 21:
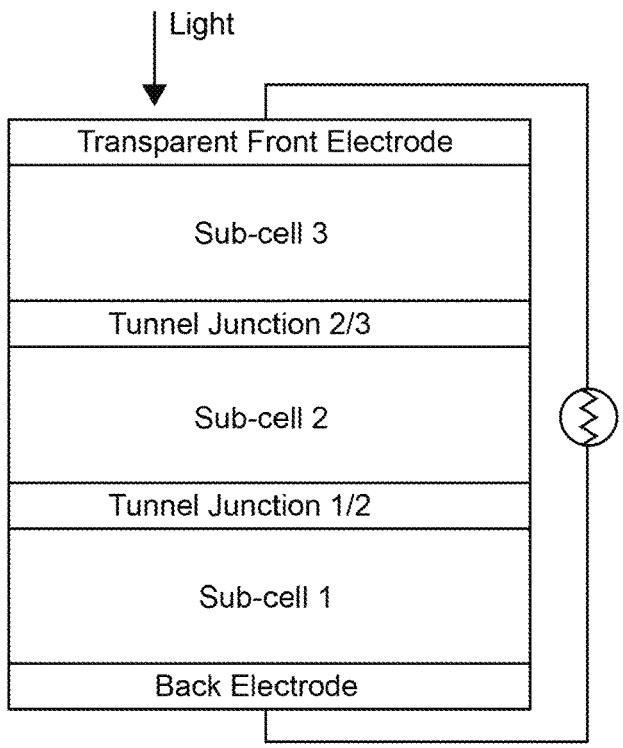
FIG. 21 illustrates schematically a cross-section of a two-terminal multi-junction photovoltaic cell with a downconversion layer serving as an active photo-absorber material for one or more of the photovoltaic sub-cells, in accordance with an embodiment of the disclosure.

FIG. 21 illustrates a multi-junction photovoltaic cell, in accordance with an embodiment of the disclosure, including three sub-cells electronically connected in a two-terminal configuration. As shown, the sub-cells 1-3 are electronically connected through tunnel junctions ½ and ⅔. While tunnel junctions are illustrated it will be understood that recombination layers are also possible. Such tunnel junctions and/or recombination layers are suitable to transmit charge carriers through the photovoltaic device, such as from sub-layer to sub-layer.

Figure 22:
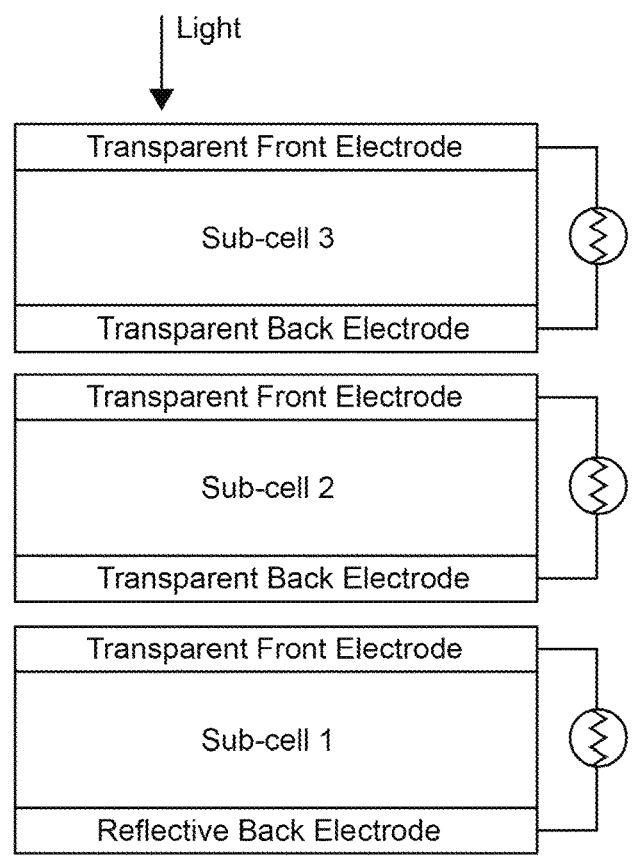
FIG. 22 illustrates schematically a cross-section of a many-terminal, multi-junction photovoltaic cell with a downconversion layer serving as an active photo-absorber material for one or more of the device sub-cells, in accordance with an embodiment of the disclosure.

In an embodiment, sub-cells of the photovoltaic cells of the present disclosure are disposed in many-terminal configuration. In that regard, attention is directed to FIG. 22 in which a many-terminal photovoltaic cell, in accordance with an embodiment of the disclosure, is illustrated. As shown, each of the sub-cells 1-3 are disposed between transparent front and back electrodes. These transparent front and back electrodes are further conductively coupled to individual loads. In an embodiment, one or more of the sub-cells 1-3 includes a composition of the present disclosure.

Photovoltaic Module

In another aspect, the present disclosure provides photovoltaic modules including two or more photovoltaic cells. As discussed further herein, such photovoltaic cells include an active layer and/or a composition of the present disclosure, such as in the form of a downconversion layer, optically and/or electronically coupled to the active layer. In an embodiment, the photovoltaic module comprises a packaged, connected assembly of photovoltaic cells. As above, such photovoltaic cells of the photovoltaic module may be configured to absorb incident light, such as incident solar light, on a single face (standard module) or top and bottom faces (bifacial module).

Figure 8:
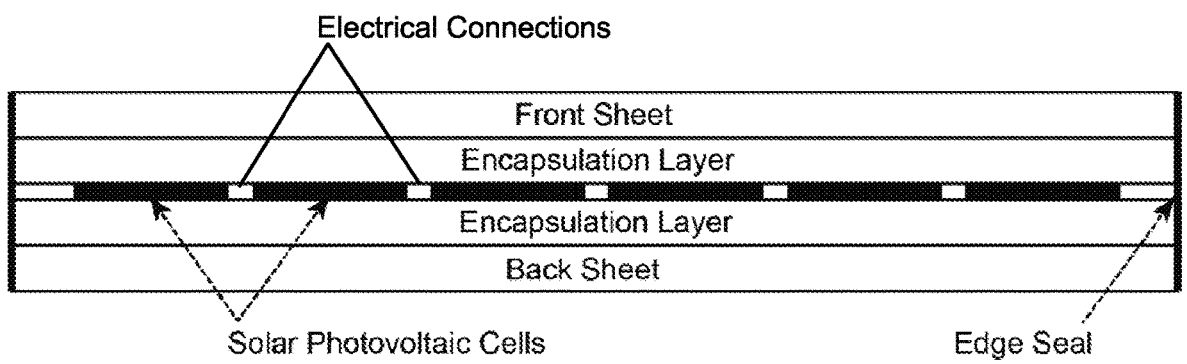
FIG. 8 illustrates schematically a cross-section of a monofacial or bifacial solar photovoltaic module with a back sheet, back encapsulation layer, solar cells, electrical connections, front encapsulation layer, and front sheet, in accordance with an embodiment of the disclosure.

In an embodiment, the photovoltaic module includes encapsulation layers configured to encapsulate the photovoltaic cells. In that regard, attention is directed to FIG. 8 in which a photovoltaic module, in accordance with an embodiment of the disclosure, is illustrated. In the illustrated embodiment, the photovoltaic module includes a back sheet, back encapsulation layer, a plurality of solar cells, electrical connections, front encapsulation layer, and front sheet. The electrical connections are configured to electrically connect the plurality of solar to electrical leads to provide external electrical power.

The front and back sheet are configured to coat the encapsulation layers. In an embodiment, the front and back sheets, such as a sheet including metal, plastic, or some other rigid material, provide structure to the module and prevents exposure of the cell material to the surrounding environment. In an embodiment, the front and/or back sheet comprise a material selected from the group consisting of glass, tedlar-polyester-tedlar (TPT), polyamid-PET-polyamid (APA), kynar-PET-EVA (KPE), tedlar-PET-polyamid (TPA), flourinated ethylene propylene (FEP), ethylene tetrafluoroethylene (ETFE), polytetrafluoroethylene (PTFE), polyvinylidene fluoride (PVDF), polyvinylfluoride (PVF), polyolefin (PO), and combinations thereof.

As above, the encapsulation layers are configured to encapsulate the photovoltaic cells. In an embodiment, the encapsulation layer binds the module together and, in certain embodiments, additionally provides structure to the module and prevents exposure of the cell material to the surrounding environment. In an embodiment, the front and/or back encapsulation layer include a material selected from the group consisting of ethylene vinyl acetate (EVA), silicone, polydimethyl silicone (PDMS), thermoplastic polyurethane (TPU), polyolefin (PO), polyvinyl butyral (PVB), and combinations thereof.

Figure 9A:
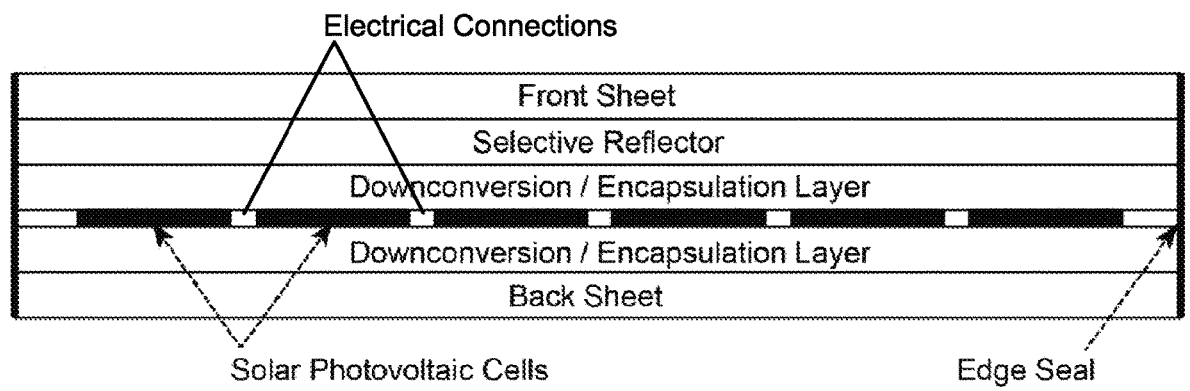
FIG. 9A illustrates schematically a cross-section of a monofacial solar photovoltaic module with a back sheet, back encapsulation layer, selective reflector, solar cells, electrical connections, front encapsulation layer, and front sheet in which a downconversion layer replaces the encapsulation layers, in accordance with an embodiment of the disclosure.
Figure 9B:
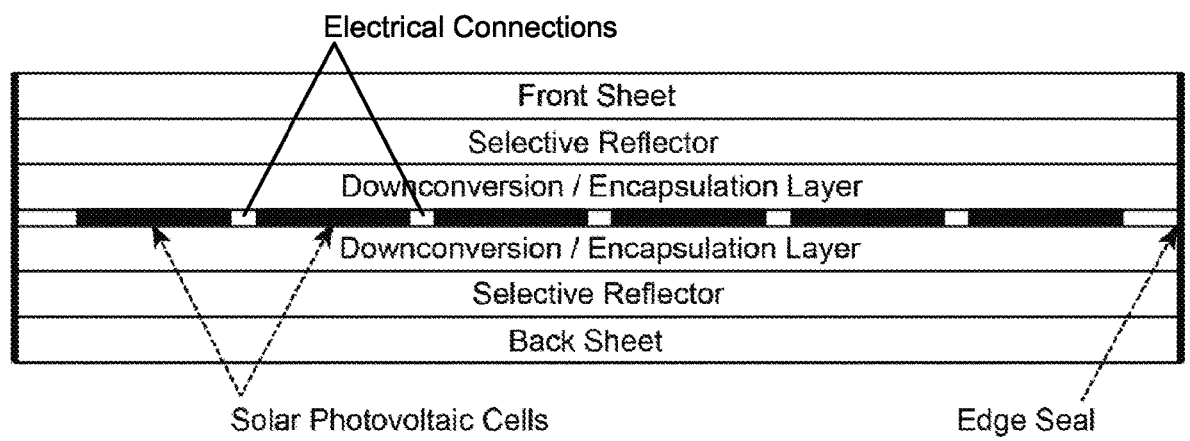
FIG. 9B illustrates schematically a cross-section of a bifacial solar photovoltaic module with a back sheet, back encapsulation layer, selective reflectors, solar cells, electrical connections, front encapsulation layer, and front sheet in which a downconversion layer is integrated with the encapsulation layers, in accordance with an embodiment of the disclosure.

In an embodiment, a downconversion layer replaces or supplements the back and/or front encapsulation layers. In that regard, attention is directed to FIGS. 9A and 9B, in which photovoltaic modules, in accordance with an embodiment of the disclosure, are illustrated. In the illustrated embodiments, the photovoltaic modules are shown to include a plurality of photovoltaic cells connected by electrical connections, a front sheet, a back sheet, and edge seals as discussed further herein.

In the illustrated embodiments, the downconversion layer replaces and/or supplements the back and front encapsulation layers. As discussed further herein, such downconversion layers can include a composition of the present disclosure dispersed in a matrix, such as an organic or inorganic matrix. Such a matrix may have a varying composition and may define a composition gradient. The downconversion layer including the composition and the matrix may serve dual functions of quantum cutting and encapsulation of the photovoltaic cells.

Figure 10A:
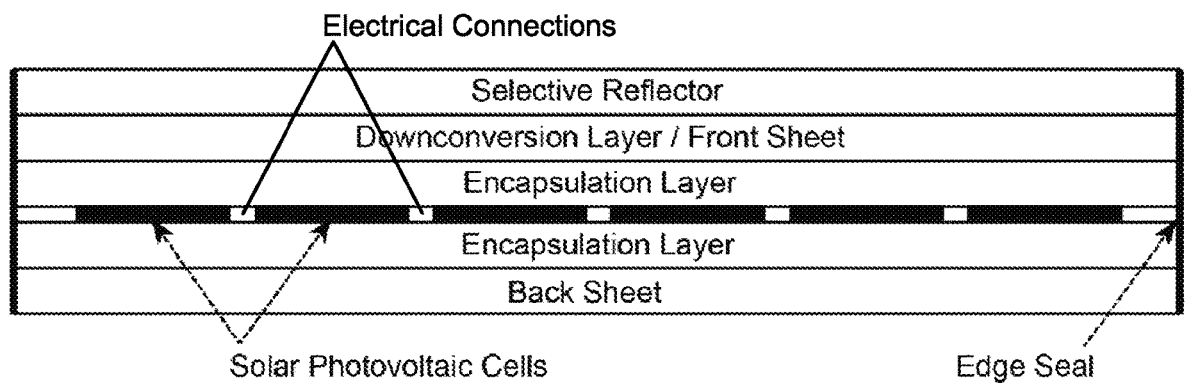
FIG. 10A illustrates schematically a cross-section of a monofacial solar photovoltaic module with a back sheet, back encapsulation layer, solar cells, electrical connections, front encapsulation layer, and front sheet in which a downconversion layer replaces or is integrated with the front sheet, in accordance with an embodiment of the disclosure.
Figure 10B:
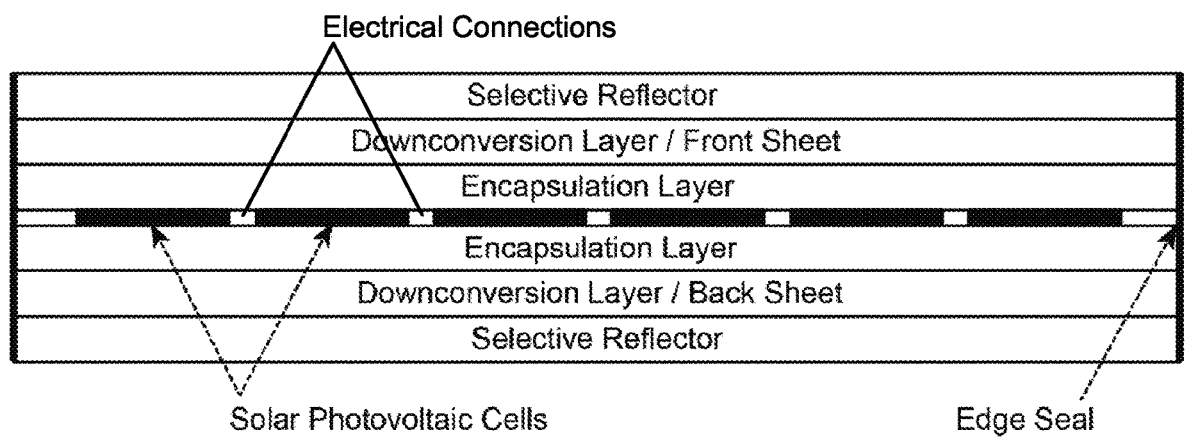
FIG. 10B illustrates schematically a cross-section of a bifacial solar photovoltaic module with a back sheet, back encapsulation layer, solar cells, electrical connections, front encapsulation layer, and front sheet in which downconversion layers are integrated with the front sheet and back sheet, in accordance with an embodiment of the disclosure.

In an embodiment, a photovoltaic module includes a downconversion layer that replaces or supplements the back and/or front sheets. This may be accomplished by dispersing pre-synthesized downconversion material (e.g. nanocrystals) into the back/front sheet polymer material (such as those listed above). Additionally, it may be possible to grow small doped nanocrystals during the glass formation process. In an embodiment, downconversion material is thermally evaporated as a film directly onto polymers and glass, which could supplement the existing back/front sheet material. In that regard, attention is directed to FIGS. 10A and 10B, in which photovoltaic modules in accordance with an embodiment of the disclosure are illustrated. As shown, the photovoltaic modules include selective reflectors, encapsulation layers, a plurality of photovoltaic modules, electrical connections, and edge seals as discussed further herein.

The photovoltaic modules are shown to further include a downconversion layer, disposed between selective reflectors and encapsulation layers, configured to replace and/or supplement the functions of front and/or back sheets of the photovoltaic module. Such downconversion layers may include a composition of the present disclosure dispersed in a matrix and discussed further herein with respect to the downconversion layers of the present disclosure and with respect to FIGS. 9A and 9B.

Figure 11A:
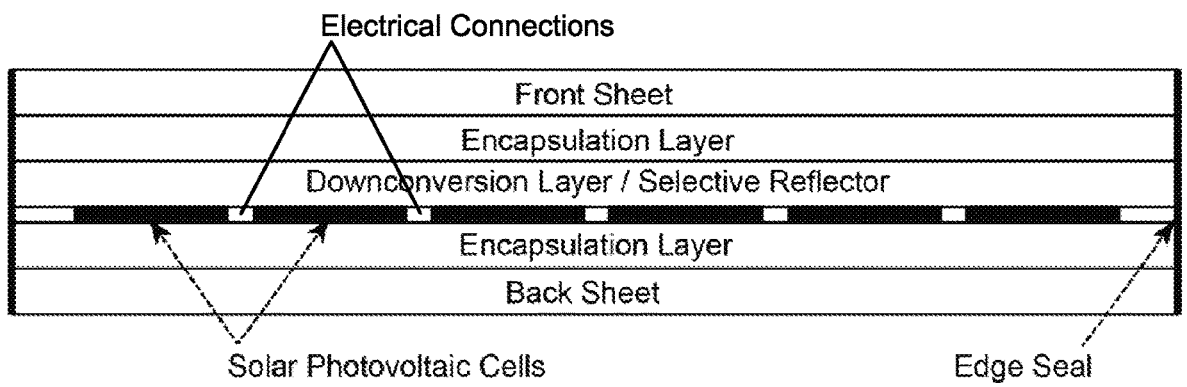
FIG. 11A illustrates schematically a cross-section of a monofacial solar photovoltaic module with a back sheet, back encapsulation layer, solar cells, electrical connections, front encapsulation layer, and front sheet in which a downconversion layer is located between the solar cells and an encapsulation layer and is integrated in or replaces a selective reflector, in accordance with an embodiment of the disclosure.
Figure 11B:
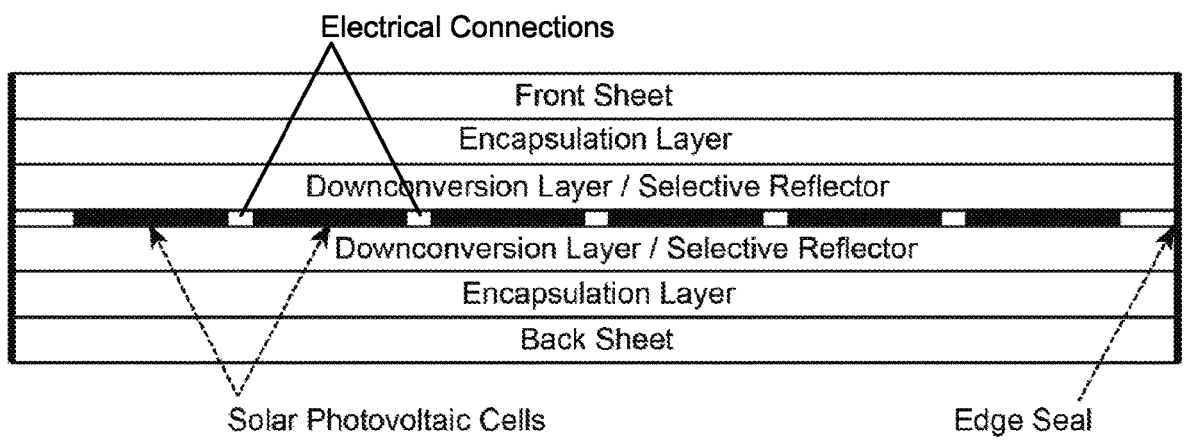
FIG. 11B illustrates schematically a cross-section of a bifacial solar photovoltaic module with a back sheet, back encapsulation layer, solar cells, electrical connections, front encapsulation layer, and front sheet in which downconversion layers are located between the solar cells and encapsulation layers and is integrated within or replaces selective reflectors, in accordance with an embodiment of the disclosure.

In an embodiment, the photovoltaic modules include a downconversion layer disposed between a plurality of solar cells and an encapsulation layer. In that regard, attention is directed to FIGS. 11A and 11B in which photovoltaic modules, in accordance with an embodiment of the disclosure, are illustrated. As shown, the photovoltaic modules include front sheets, back sheets, encapsulation layers, electrical connections, edge seals, and pluralities of photovoltaic cells, as discussed further herein. The photovoltaic modules further include a downconversion layer disposed between encapsulation layers and configured to replace or supplement a selective reflector. In an embodiment, the downconversion layer does not replace the selective reflector. The selective reflector aids in the operation of the downconversion layer. In an embodiment, the downconversion layer is directly processed onto the solar cell and a selective reflector could be directly processed onto the downconversion layer. In an embodiment, the selective reflector is directly processed onto the encapsulation layer followed by the downconversion layer. In an embodiment, the downconversion layer is structured such that it also operates as a selective reflector.

Figure 12A:
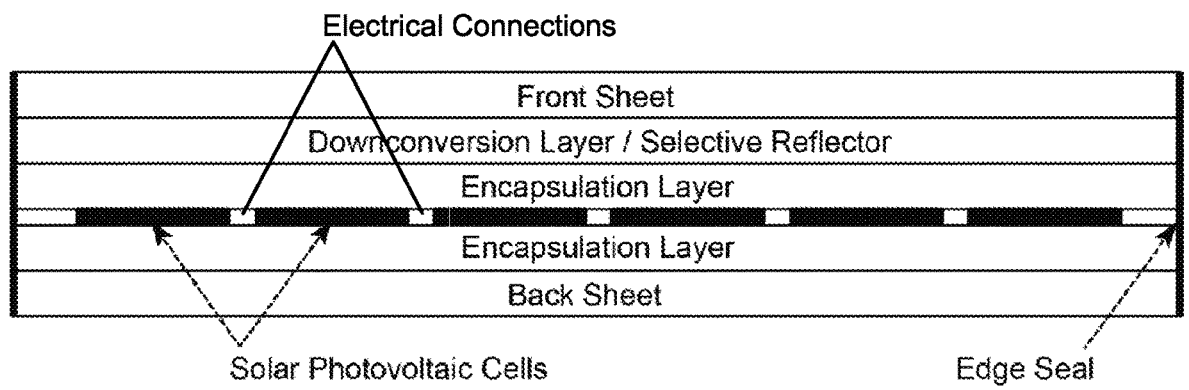
FIG. 12A illustrates schematically a cross-section of a monofacial solar photovoltaic module with a back sheet, back encapsulation layer, solar cells, electrical connections, front encapsulation layer, and front sheet in which a downconversion layer is located between the front encapsulation layer and front sheet, in accordance with an embodiment of the disclosure.
Figure 12B:
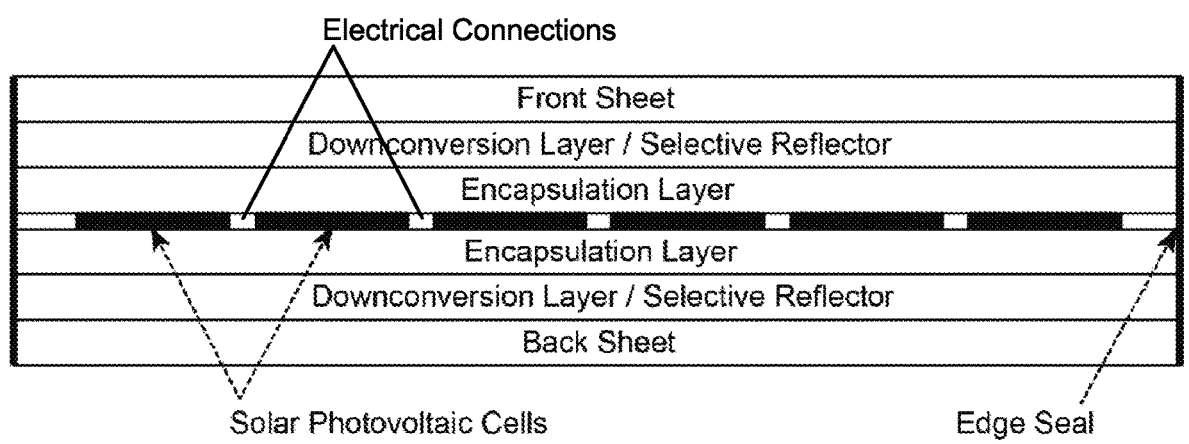
FIG. 12B illustrates schematically a cross-section of a bifacial solar photovoltaic module with a back sheet, back encapsulation layer, solar cells, electrical connections, front encapsulation layer, and front sheet in which downconversion layers are located between the encapsulation layers and cover sheets, in accordance with an embodiment of the disclosure.

In an embodiment, the photovoltaic modules include a downconversion layer disposed between an encapsulation layer and a cover sheet. In that regard, attention is directed to FIGS. 12A and 12B, in which photovoltaic modules, in accordance with an embodiment of the disclosure, are illustrated. As shown, the photovoltaic modules include a front sheet, back sheet, encapsulation layers, electrical connections, plurality of photovoltaic cells, and edge seals as discussed further herein. In the illustrated embodiment, the photovoltaic modules include a downconversion layer disposed between an encapsulation layer and a coversheet, whether a front sheet or a back sheet. In an embodiment, the downconversion layer is configured to replace and/or supplement a selective reflector.

In an embodiment, the photovoltaic modules include a downconversion layer disposed on an outside face of a cover sheet. In that regard, attention is directed to FIGS. 13A and 13B in which photovoltaic modules, in accordance with an embodiment of the disclosure, are illustrated. As shown, the photovoltaic modules include a front sheet, a back sheet, encapsulation layers, a plurality of photovoltaic modules, electrical connections, and edge seals, as discussed further herein. As shown, the photovoltaic module further includes a downconversion layer disposed on an outer surface of a coversheet, shown in FIG. 13A as an outer surface of a front sheet and in FIG. 13B as outer surfaces of a front sheet and a back sheet. The downconversion layer may be supplemented by a selective reflector.

Figure 13A:
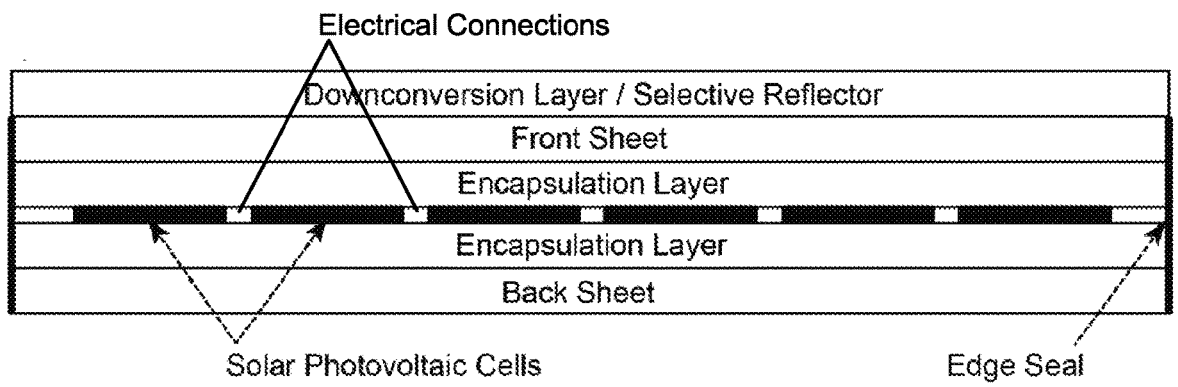
FIG. 13A illustrates schematically a cross-section of a monofacial solar photovoltaic module with a back sheet, back encapsulation layer, solar cells, electrical connections, front encapsulation layer, and front sheet in which a downconversion layer is located on an outside face of the front sheet, in accordance with an embodiment of the disclosure.
Figure 13B:
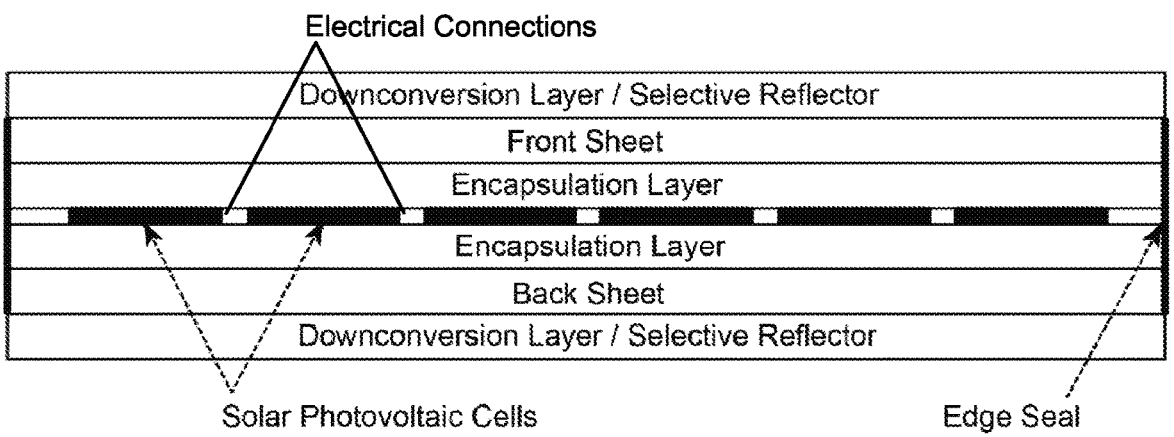
FIG. 13B illustrates schematically a cross-section of a bifacial solar photovoltaic module with a back sheet, back encapsulation layer, solar cells, electrical connections, front encapsulation layer, and front sheet in which a downconversion layer is located on the outside face of the cover sheets, in accordance with an embodiment of the disclosure.

Because the downconversion layers of FIGS. 13A and 13B are disposed on outer surfaces of cover sheets of the photovoltaic module, such downconversion layers may serve as a retrofits and/or additions to pre-assembled/deployed photovoltaic modules. In that regard, the downconversion layers may be applied to such outer surfaces without, for example, disassembling the photovoltaic module. The downconversion layers may be applied to such outer surfaces according to the methods described further herein.

Figure 41:
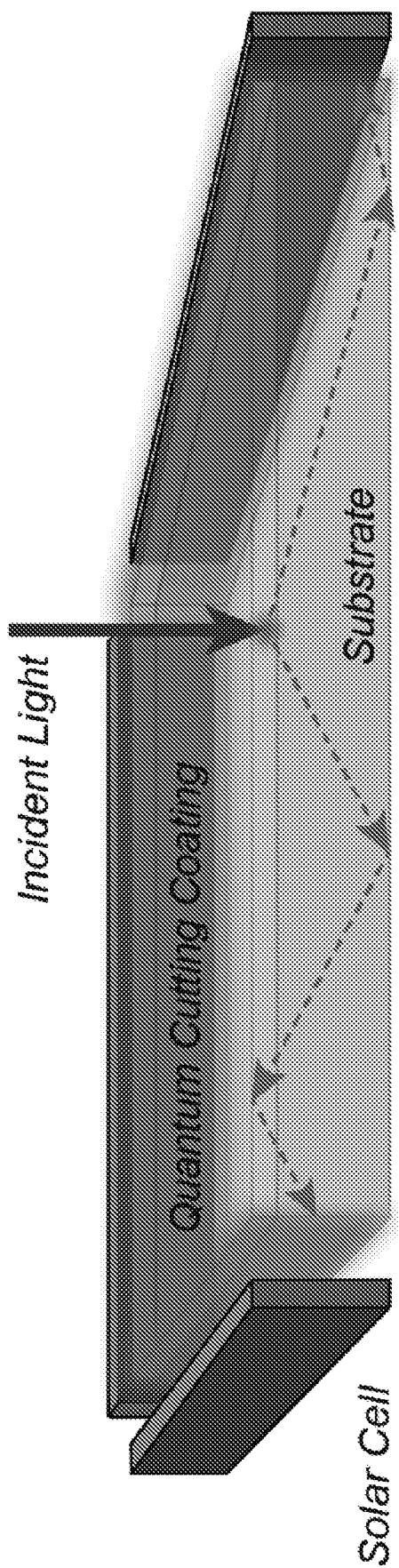
FIG. 41 illustrates a thin-film luminescent solar concentrator; in accordance with an embodiment of the disclosure.

In an embodiment, the photovoltaic module includes a thin film, in accordance with an embodiment of the disclosure, disposed on a substrate. In that attention is directed to FIG. 41, in which a photovoltaic module in accordance with an embodiment of the disclosure is illustrated. As show, the photovoltaic module includes a thin film, in accordance with an embodiment of the disclosure, disposed on a substrate, wherein the thin film is configured to guide photoluminescent light to one or more photovoltaic cells of the module disposed at edges of the thin film. Such a thin film is configured to act as a solar concentrator to waveguide incident light to the photovoltaic cells, thus generating a greater photovoltaic current than in its absence.

Photodetector

In another aspect, the present disclosure provides a photodetector coupled to a spectral downconversion layer. As used herein, a "photodetector" refers to a device that converts incident electromagnetic radiation into electrical current. Downconversion layers coupled to the photodetector can include any downconversion layer described herein. In an embodiment, a gain of the photodetector is produced by the photoelectric effect, thermal heating, and/or a photochemical process.

In an embodiment, the downconversion layer is optically, electronically, and/or thermally coupled to a photodetector. In that regard, quanta of downconverted energy may be transferred from the downconversion layer to the photodetector via radiative or non-radiative processes. Such transferred quanta of energy may be suitable to increase a spectral response of the photodetector to shorter wavelengths, such as to detect electromagnetic radiation outside of a wavelength range otherwise detectable by the photodetector or improve detection of such wavelengths. In this regard, the photodetectors of the present disclosure may be suitable to generate an electrical signal based upon light incident upon the photodetector that where such an electrical would be weaker or non-existent in a photodetector that did not include the downconversion layer. Further, the downconversion layer may decrease the reflection of incident radiation (i.e., operate as an anti-reflective coating).

In an embodiment, the downconversion layer is tuned to absorb high-energy X-rays for generation of an electrical current or photoluminescence following X-ray absorption. In this regard, the downconversion layer may be configured to emit photons in response to absorbing X-rays, where such photons are configured to be absorbed by the photodetector, which is configured to generate an electrical signal in response to the emitted photons.

Figure 14:
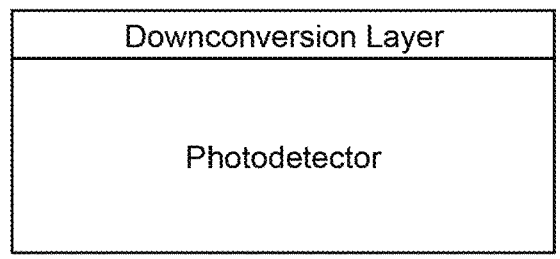
FIG. 14 illustrates schematically a cross-section of a photodetector with a downconversion layer stacked onto an active face of the photodetector, in accordance with an embodiment of the disclosure.
Figure 15:
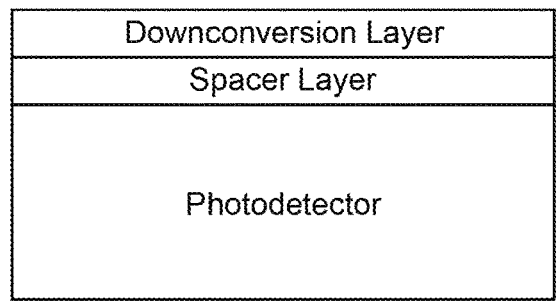
FIG. 15 illustrates schematically a cross-section of an example photodetector with a downconversion layer stacked adjacent to an active face of the device with a spacer layer between the photodetector and downcoversion layer, in accordance with an embodiment of the disclosure.

In an embodiment, a downconversion layer is monolithically stacked onto a photodetector, as illustrated in FIG. 14. In an embodiment, the downconversion layer may be separated from the photodetector by a spacer layer, such as a spacer layer as discussed further herein, as illustrated in FIG. 15.

Light-Emitting Diode

In another aspect, the present disclosure provides a light-emitting diode (LED) coupled to a spectral downconversion layer. In an embodiment, the LED is configured to convert current into emitted photons via electroluminescence, which are radiatively coupled to a downconversion layer. As discussed further herein, such a downconversion layer is configured to emit photons in response to absorbing photons from the LED. The photons emitted by the downconversion layer have a lower energy than those emitted from the LED.

Figure 16:
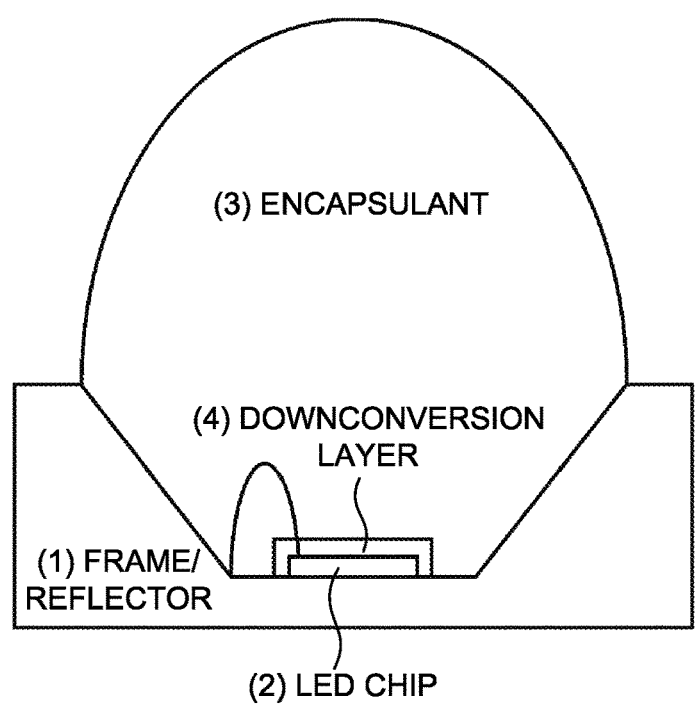
FIG. 16 illustrates schematically a light-emitting diode (LED) with a downconversion layer disposed directly onto an LED chip, in accordance with an embodiment of the disclosure.

In an embodiment, the downconversion layer is deposited directly onto an LED chip configured to emit light. In that regard, attention is directed to FIG. 16 in which an LED, in accordance with an embodiment of the disclosure, is illustrated. The illustrated embodiment is shown to include a frame/reflector 1 configured to house the LED chip 2 and reflect light emitted therefrom, and an encapsulant 3 configured to encapsulate the LED chip 2 and the downconversion layer 4. In this regard, the encapsulant isolates the LED chip from the environment to prevent degradation. As shown, the downconversion layer 4 is disposed directly on and conformally coats the LED chip 2. In this regard, the downconversion layer 4 is configured to absorb photons emitted from the LED chip 2 due to its immediate proximity to the LED chip 2.

Figure 17:
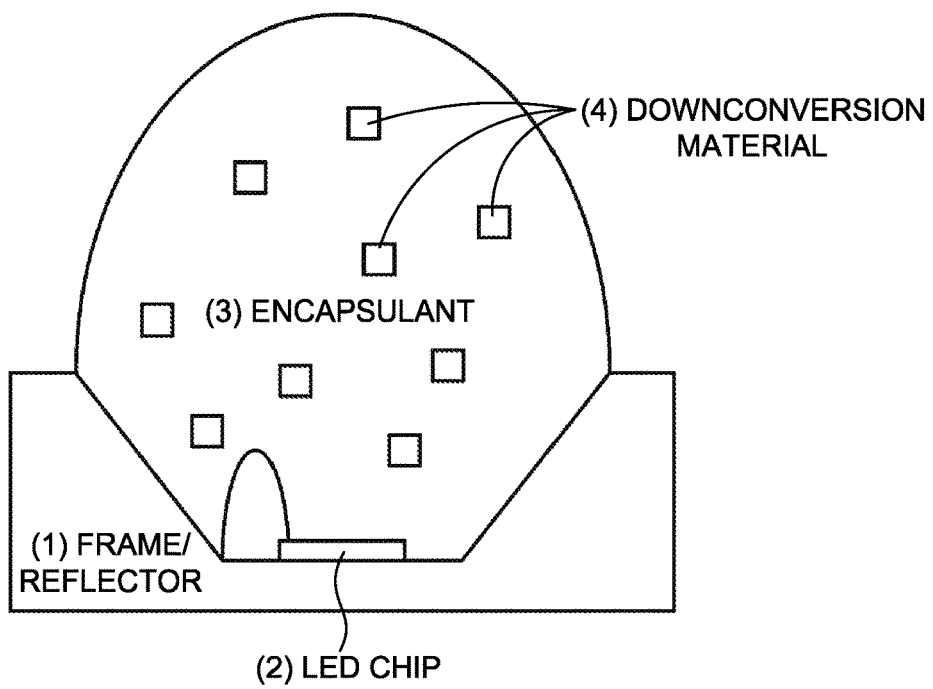
FIG. 17 illustrates schematically an LED with a downconversion layer incorporated into an LED encapsulation material, in accordance with an embodiment of the disclosure.

In an embodiment, the downconversion layer is incorporated into and/or dispersed in the LED chip encapsulation material. In that regard, attention is directed to FIG. 17 in which an LED, in accordance with an embodiment of the disclosure, is illustrated. As shown, the LED includes a frame/reflector 1 and an LED chip 2, as discussed further herein with respect to FIG. 16. The LED is shown to further include an encapsulant 3 in which a downconversion material 4 is distributed. Due to its distribution within the encapsulant 3, the downconversion material 4 is configured to absorb light emitted by the LED chip 2.

Figure 18:
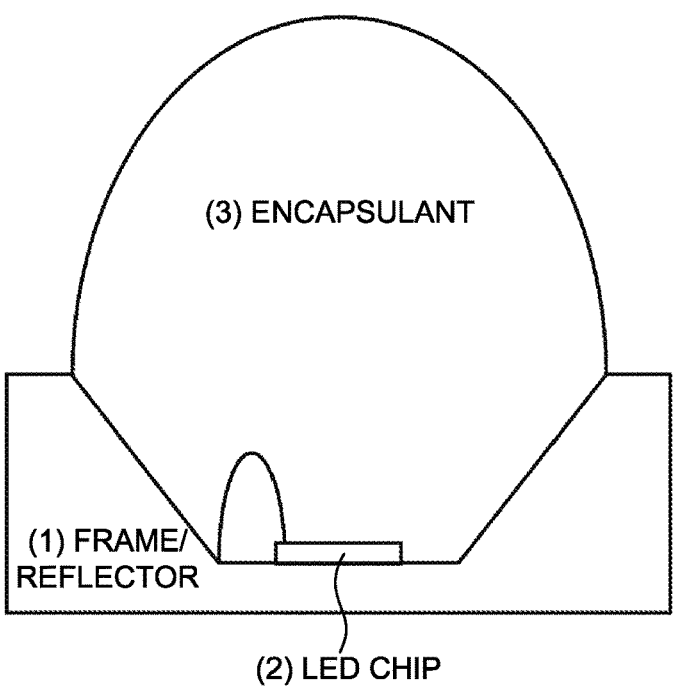
FIG. 18 illustrates schematically an LED with a downconversion layer remotely coupled with an LED chip by photoexcitation, in accordance with an embodiment of the disclosure.

In an embodiment, the downconversion layer is remotely coupled with the LED chip by photoexcitation. In that regard, attention is directed to FIG. 18 in which an LED, in accordance with an embodiment of the disclosure, is illustrated. As shown, the LED includes a frame/reflector 1, an LED chip 2, and an encapsulant 3, as discussed further herein. The LED is shown to further include a downconversion layer 4. In the illustrated embodiment, the downconversion layer 4 is not physically coupled to either the encapsulant 3 or the LED chip 2. Rather, the downconversion layer 4 is in an optical path of light emitted from the LED chip 2 and, in the regard, is optically coupled to the LED chip 2. As discussed further herein, by optically coupling the downconversion layer 4 to the LED chip, the downconversion layer 4 is configured to emit quanta of energy in response to light emitted from the LED chip 2.

Downconversion Light-Emitting Diode

In another aspect, the present disclosure provides a downconversion LED. In an embodiment, the downconversion LED is configured to convert current into emitted photons via electroluminescence and comprises a series of stacked layers including a transparent or reflective anode, a transparent or reflective cathode, a hole transport layer, an electron transport layer, and an active material comprising a downconversion layer. The downconversion layer can include a downconversion layer of the present disclosure.

Figure 19:
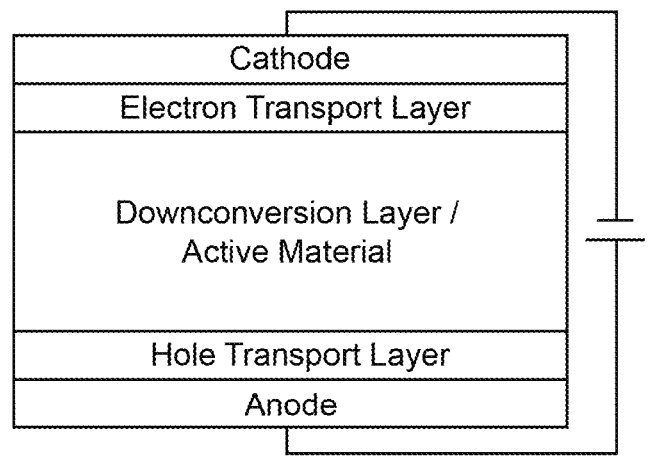
FIG. 19 illustrates schematically a cross-section of an LED with a downconversion layer serving as an active electroluminescent material, in accordance with an embodiment of the disclosure.

A downconversion LED, in accordance with an embodiment of the disclosure, is illustrated in FIG. 19. As shown, the downconversion LED includes a cathode, an electron transport layer coupled to the cathode, a downconversion layer/active material coupled to the electron transport layer, a hole transport layer coupled to the downconversion layer/active material, and an anode coupled to the hole transport layer.

Through the application of a voltage to the anode and the cathode, the active material, including or consisting of the downconversion layer, is configured to convert electrons and holes into emitted photons. In an embodiment, the bandgap energies between the electron and hole transport layers are greater than the energies of the emitted photons.

As shown in FIG. 19, the electron transport layer is disposed between the cathode and the active layer and the hole transport layer is disposed between the anode and the active layer. In an embodiment, a thicknesses of the electron and hole transport layers are in a range of about 1 nm and about 1000 nm.

In an embodiment, the electron and/or hole transport layers comprises a material selected from the group consisting of titanium dioxide ($TiO_2$), Spiro-OMeTAD (2,2',7,7'-Tetrakis[N,N-di(4-methoxyphenyl)amino]-9,9'-spirobifluorene), PC61BM (phenyl-$C_{61}$-butyric acid methyl ester), ZnO:PEI (ZnO:polyethylenimine), PEDOT:PSS (poly(3,4-ethylenedioxythiophene)-poly(styrenesulfonate)), F8 (poly (9,9'-dioctylfluorene), TPBi (1,3,5-tris(1-phenyl-1H-benzimidazol-2-yl)benzene), TPD (N,N'-bis(3-methylphenyl)-N,N'-diphenylbenzidine), TFB (poly(9,9-dioctyl-fluorene-co-N-(4-butylphenyl)diphenylamine), LiF, ZnO, BCP (Bathocuproine), tin oxide, cadmium selenide, cadmium sulfide, nickel oxide, copper thiocyanate, copper iodide, copper bromide, copper chloride, OXD7 (1,3-bis[4-(tert-butylphenyl)-1,3,4-oxadiazolyl]phenylene), and combinations thereof.

In an embodiment, the anode and cathode comprise materials selected from the group consisting of indium tin oxide, aluminum tin oxide, fluorine tin oxide, indium zinc oxide, silver nanowires, silver, tungsten, molybdenum, copper, nickel, aluminum, gold, palladium, platinum, magnesium, calcium, carbon, carbon nanotubes, graphene, graphite, oxides thereof, and combinations thereof.

In an embodiment, the downconverting LED has an anti-reflective coating adjacent to either or both the anode and the cathode configured to reduce reflection of light incident upon the antireflective coating.

A Method of Preparing Spectral Downconversion Materials

In another aspect, the present disclosure provides a method of preparing compositions of the present disclosure. In an embodiment, the methods of preparation are suitable to prepare the compositions of the present disclosure.

Mechanochemical Synthesis

In an embodiment of the method, crystalline powders are obtained from solid ionic precursors by solid-state mechanochemical synthesis. In an embodiment, stoichiometric amounts of solid ionic chemical precursors are mechanically mixed together to form the desired composition of matter (See for example, Example 3). In an embodiment, the solid-state mechanochemical synthesis provides a crystalline powder.

In an embodiment, the solid ionic chemical precursors include solid ionic chemical precursors selected from the group consisting of hydrated solid ionic chemical precursors, anhydrous solid ionic chemical precursors, and combinations thereof. In an embodiment, the solid ionic chemical precursors are selected from the group consisting of metal halides, metal oxides, metal acetates, metal nitrates, metal phosphates, metal acetylacetonates, and combinations thereof.

In an embodiment, mechanochemically mixing solid ionic precursors includes manipulation selected from the group consisting of shaking, grinding, crushing, and sonicating. In an embodiment, mechanochemically mixing solid ionic precursors includes use of mixing devices selected from the group consisting of a mortar and pestle, a rotary ball mill, planetary ball mill, bath sonicator, probe sonicator, vortexer, and combinations thereof.

In an embodiment, solid-state mechanochemical synthesis includes grinding solid ionic precursors for a time in a range of about 5 minutes to about 5 days.

In an embodiment, solid ionic precursors are mixed together simultaneously. In an embodiment, solid ionic precursors are mixed together at different stages of the preparation process to alter the composition.

In an embodiment, obtained powders, such as crystalline powders, are heated at temperatures in a range of about 50° C. to about 1500° C. In an embodiment heating the obtained powders includes heating under ambient and/or inert conditions.

Precipitation

In an embodiment, crystalline powders are obtained by precipitation from solution. In an embodiment, solid ionic chemical precursors are partially or completely solubilized in a liquid. In an embodiment, a desired composition of matter is obtained by mixing solid ionic chemical precursors in an appropriate stoichiometric ratio. In an embodiment, a solubilizing/suspending liquid includes a liquid selected from the group consisting of water, DMSO, DMF, acetonitrile, methyl acetate, HX(aq) (X=Cl, Br, I), and combinations thereof. In an embodiment, all of the ionic precursors are solubilized or suspended in a common solvent system in a single vessel.

In an embodiment, the method includes crystal formation driven, at least in part, by lowering a temperature of a solution of the solubilized ionic precursors and/or slow precipitation at fixed temperature. Powders may be isolated from the solvent mixture by filtration. Filtered powders may be heated and dried at temperatures in a range of about 50° C. to about 1500° C. under ambient or inert conditions.

In an embodiment, component ionic precursors are solubilized or suspended in multiple solvent systems in different vessels. Crystal formation may be driven by mixing of the various solvents containing ionic precursors into a single vessel. As above, powders may be isolated from the solvent mixture by filtration. Filtered powders may be heated and dried at temperatures in a range of about 50° C. to about 1500° C. under ambient or inert conditions.

Pressing Crystalline Powders

As above, in some embodiment, the methods of the present disclosure are suitable to provide crystalline powders. The methods further include pressing such crystalline powders to provide pellets such as polycrystalline pellets or single crystalline pellets.

In an embodiment, where crystalline powders prepared by precipitation from a solution, the crystalline powders are loaded into a dry pellet pressing die. The die cavity may or may not be evacuated under vacuum. Pressure is applied to the dry pellet pressing die. In an embodiment, pressure is applied for a time in a range of about 5 seconds to about 5 days. In an embodiment, the crystalline powder in the die is heated at a temperature in a range of about 30° C. to about 1500° C. In an embodiment, pressure applied to the dry pellet die is in a range of about 10 MPa to about 1000 MPa.

In an embodiment, pressed pellets are heated at a temperature in a range of about 50° C. to about 1500° C. In an embodiment, heating pressed pellets is under ambient and/or inert conditions.

Pressed pellets may have various shapes depending on die geometry. In an embodiment, pressed pellets have a horizontal dimension on the order of millimeters to several centimeters. In an embodiment, pressed pellets have thicknesses ranging from micrometers to centimeters.

Such solid ionic chemical precursors may be hydrated solid ionic precursors, anhydrous ionic precursors, or combinations thereof. In an embodiment, the solid ionic chemical precursors are selected from the group consisting of metal halides, metal oxides, metal acetates, metal nitrates, metal phosphates, metal acetylacetonates, and combinations thereof.

Single Crystals

In an embodiment, the method is configured to provide single crystals from solid ionic precursors. In an embodiment, the method includes mixing stoichiometric amounts of solid ionic chemical precursors in an evacuated vessel, such as in a ratio suitable to form a composition as described herein. In an embodiment, the vessel containing ionic precursors is heated, such as by placing the vessel in an oven. In an embodiment, the heated vessel containing ionic precursors is slowly cooled.

The resulting single crystals may have various shapes depending on vessel geometry. In an embodiment, the resulting single crystals have horizontal dimensions on the order of millimeters to centimeters. In an embodiment, the resulting crystals have a thicknesses ranging from micrometers to centimeters.

Wet Mechanochemical Synthesis

In an embodiment, the method is suitable to provide crystalline colloidal suspensions by wet mechanochemical synthesis of powders or single crystals. In an embodiment, the method includes loading powders or single crystals of composition described herein into a reaction vessel. In an embodiment, the method further includes loading surfactants and/or ligands into the reaction vessel. In an embodiment, surfactants are selected from the group consisting of oleic acid, metal-oleates, oleylamine, tri-n-octlyphoshine, tri-n-octylphosphine oxide, metal alkyl-phosphonates, phosphonic acids, phosphinic acids, alkyl thiols, oleylammonium fluoride, oleylammonium chloride, oleylammonium bromide, oleylammonium iodide, 3-(N,N-dimethyloctadecylammonio)propane sulfonate, benzoic acid and derivatives thereof, fluoroacetic acid, difluoroacetic acid, trifluoroacetic acid, methylsulfonic acid, and combinations thereof.

In an embodiment, the method includes adding a solvent into the reaction vessel. In an embodiment, solvents are selected from the group consisting of hexane, octane, benzene, toluene, xylene, mesitylene, 1-octadecene, ethanol, methanol, isopropyl alcohol, acetone, DMSO, DMF, gamma-butyrolactone, N-methylformamide, propylene carbonate, glycol sulfite, formamide, acetonitrile, methyl acetate, HX(aq) (X=Cl, Br, I), formic acid, and combinations thereof.

In an embodiment, mixing the contents of the reaction vessel includes mechanochemically mixing the reaction vessel contents by methods selected from the group consisting of shaking, grinding, crushing, or sonicating the reaction vessel contents. In an embodiment, mechanochemically mixing includes use of instruments selected from the group consisting of a mortar and pestle, rotary ball mill, planetary ball mill, bath sonicator, probe sonicator, vortexer, and combinations thereof. In an embodiment, mechanochemically mixing the contents of the reaction vessel includes mechanochemically mixing the contents of the reaction vessel for a time in a range of about 5 minutes to about 5 days. In an embodiment, a temperature of the reaction vessel is in a range of about 30° C. to about 1500° C.

In an embodiment, contents of the reaction vessel are added together simultaneously. In an embodiment, contents of the reaction vessel are mixed together at different stages of the preparation process to alter the composition.

In an embodiment, reaction conditions are controlled such that resulting colloidal particles may have dimensions ranging from nanometers to micrometers. For example, variable reaction conditions to control resulting particle diameter include grinding duration, rotation speed, and precursor "ball-to-mass" ratio.

In an embodiment, obtained colloidal suspensions are purified, such as through cycles of centrifugation, re-dispersion in a suitable solvent, and/or flocculation using a suitable anti-solvent. In an embodiment, obtained colloidal suspensions are heated at temperatures in a range of about 50° C. to about 1500° C. Such heating can be performed under ambient conditions and/or inert conditions.

In an embodiment, obtained colloidal suspensions are diluted with the addition of solvent to control the final concentration of the crystalline colloidal suspension. In an embodiment, obtained colloidal suspensions are concentrated through the removal of solvent to form solids or powders.

Microwave Irradiation

In an embodiment, the method includes microwave irradiation of solutions of ionic precursors to provide crystalline colloidal suspensions of the compositions of the present disclosure. In an embodiment, stoichiometric amounts of solid ionic chemical precursors are loaded into a reaction vessel and exposed to microwave radiation therein to form the composition of the present disclosure.

In an embodiment, contents of the reaction vessel are added together simultaneously. In an embodiment, contents of the reaction vessel are mixed together at different stages of the preparation process to alter the composition.

In an embodiment, the contents of the reaction vessel are microwaved for a time in a range of about 5 seconds to about 5 days. In an embodiment, a temperature of the reaction vessel is in a range of about 30° C. to about 1500° C.

In an embodiment, solid ionic chemical precursors are selected from the group consisting of hydrated solid ionic chemical precursors, anhydrous solid ionic chemical precursors, and combinations thereof. In an embodiment, the solid ionic chemical precursors are selected from the group consisting of metal halides, metal oxides, metal acetates, metal nitrates, metal phosphates, metal acetylacetonates, and combinations thereof.

In an embodiment, the method further includes loading surfactants and/or ligands into the reaction vessel. In an embodiment, surfactants are selected from the group consisting of oleic acid, metal-oleates, oleylamine, tri-n-octlyphoshine, tri-n-octylphosphine oxide, metal alkyl-phosphonates, phosphonic acids, phosphinic acids, alkyl thiols, oleylammonium fluoride, oleylammonium chloride, oleylammonium bromide, oleylammonium iodide, 3-(N,N-dimethyloctadecylammonio)propane sulfonate, benzoic acid and derivatives thereof, fluoroacetic acid, difluoroacetic acid, trifluoroacetic acid, methylsulfonic acid, and combinations thereof.

In an embodiment, the method includes adding a solvent into the reaction vessel. In an embodiment, solvents are selected from the group consisting of hexane, octane, benzene, toluene, xylene, mesitylene, 1-octadecene, ethanol, methanol, isopropyl alcohol, acetone, DMSO, DMF, gamma-butyrolactone, N-methylformamide, propylene carbonate, glycol sulfite, formamide, acetonitrile, methyl acetate, HX(aq) (X=Cl, Br, I), formic acid, and combinations thereof.

In an embodiment, reaction conditions are controlled such that resulting colloidal particles may have dimensions ranging from nanometers to micrometers.

In an embodiment, obtained colloidal suspensions are purified through cycles of centrifugation, re-dispersion in a suitable solvent, and/or flocculation using a suitable antisolvent. In an embodiment, obtained colloidal suspensions are heated at temperatures in a range of about 50° C. to about 1500° C., such as under ambient or inert conditions.

In an embodiment, obtained colloidal suspensions are diluted with the addition of solvent to control the final concentration of the crystalline colloidal suspension. In an embodiment, obtained colloidal suspensions are concentrated through the removal of solvent to provide solids or powders.

Sonication

In one embodiment, the method includes sonicating a solution and/or suspension of ionic precursors to provide a crystalline colloidal suspension of the composition of the present disclosure.

In an embodiment, stoichiometric amounts of solid ionic chemical precursors are loaded into a reaction vessel to provide the composition of the present disclosure. In an embodiment, the solid ionic chemical precursors are selected from the group consisting of hydrated solid ionic chemical precursors, anhydrous solid ionic chemical precursors, and combinations thereof. In an embodiment, the solid ionic chemical precursors include solid ionic chemical precursors selected from the group consisting of metal halides, metal oxides, metal acetates, metal nitrates, metal phosphates, metal acetylacetonates, and combinations thereof.

In an embodiment, the method includes loading surfactants and/or ligands into to the reaction vessel. In an embodiment, the surfactants are selected from the group consisting of oleic acid, metal-oleates, oleylamine, tri-n-octlyphoshine, tri-n-octylphosphine oxide, metal alkyl-phosphonates, phosphonic acids, phosphinic acids, alkyl thiols, oleylammonium fluoride, oleylammonium chloride, oleylammonium bromide, oleylammonium iodide, 3-(N,N-dimethyloctadecylammonio)propane sulfonate, benzoic acid and derivatives thereof, fluoroacetic acid, difluoroacetic acid, trifluoroacetic acid, methylsulfonic acid, and combinations thereof.

In an embodiment, the method includes loading a solvent into the reaction vessel. In an embodiment, the solvent is selected from the group consisting of hexane, octane, benzene, toluene, xylene, mesitylene, 1-octadecene, ethanol, methanol, isopropyl alcohol, acetone, DMSO, DMF, gamma-butyrolactone, N-methylformamide, propylene carbonate, glycol sulfite, formamide, acetonitrile, methyl acetate, HX(aq) (X=Cl, Br, I), formic acid, and combinations thereof.

In an embodiment, contents of the reaction vessel are sonicated for a time in a range of about 5 seconds to about 5 days. In an embodiment, a temperature of the reaction vessel is in a range of about 30° C. to about 1500° C.

In an embodiment, contents of the reaction vessel are added together simultaneously. In an embodiment, contents of the reaction vessel are mixed together at different stages of the preparation process to alter the composition.

In an embodiment, reaction conditions are controlled such that resulting colloidal particles may have dimensions ranging from nanometers to micrometers.

In an embodiment, obtained colloidal suspensions are purified through cycles of centrifugation, re-dispersion in a suitable solvent, and/or flocculation using a suitable antisolvent. In an embodiment, obtained colloidal suspensions are heated at a temperature in a range of about 50° C. to about 1500° C., such as under ambient or inert conditions.

In an embodiment, obtained colloidal suspensions are diluted with the addition of solvent to control the final concentration of the crystalline colloidal suspension. In an embodiment, obtained colloidal suspensions are concentrated through the removal of solvent to provide solids or powders.

Co-Precipitation

In an embodiment, the method includes co-precipitation of solutions of ionic precursors to provide crystalline colloidal suspensions of the compositions of the present disclosure. In an embodiment, the method includes loading stoichiometric amounts of solid ionic chemical precursors two or more separate vessels to provide the composition of the present disclosure. In an embodiment, the component ionic precursors are solubilized or suspended in multiple solvent systems in different vessels.

In an embodiment, the solid ionic chemical precursors are selected from the group consisting of hydrated solid ionic chemical precursors, anhydrous solid ionic chemical precursors, and combinations thereof. In an embodiment, the solid ionic chemical precursors are selected from the group consisting of metal halides, metal oxides, metal acetates, metal nitrates, metal phosphates, metal acetylacetonates, and combinations thereof.

In an embodiment, the method includes loading surfactants and/or ligands to one or more of the reaction vessels. In an embodiment, the surfactants are selected from the group consisting of oleic acid, metal-oleates, oleylamine, tri-n-octlyphoshine, tri-n-octylphosphine oxide, metal alkyl-phosphonates, phosphonic acids, phosphinic acids, alkyl thiols, oleylammonium fluoride, oleylammonium chloride, oleylammonium bromide, oleylammonium iodide, 3-(N,N-dimethyloctadecylammonio)propane sulfonate, benzoic acid and derivatives thereof, fluoroacetic acid, difluoroacetic acid, trifluoroacetic acid, methylsulfonic acid, and combinations thereof.

In an embodiment, the method includes loading a solvent into one or more of the reaction vessels. In an embodiment, the solvent(s) is/are selected from the group consisting of hexane, octane, benzene, toluene, xylene, mesitylene, 1-octadecene, ethanol, methanol, isopropyl alcohol, acetone, DMSO, DMF, gamma-butyrolactone, N-methylformamide, propylene carbonate, glycol sulfite, formamide, acetonitrile, methyl acetate, HX(aq) (X=Cl, Br, I), formic acid, and combinations thereof.

In an embodiment, a temperature of the reaction vessels is/are in a range of about 30° C. to about 1500° C.

In an embodiment, the method includes rapid mixing of the two or more precursor solutions/suspensions to drive crystal formation. In an embodiment, the contents of the reaction vessels are added together simultaneously. In an embodiment, the contents of the reaction vessels are mixed together at different stages of the preparation process to alter the composition.

In an embodiment, reaction conditions are controlled such that resulting colloidal particles have dimensions ranging from nanometers to micrometers. For example, size control can be accomplished by varying the precursor-to-surfactant ratio, reaction temperature, and reaction duration.

In an embodiment, obtained colloidal suspensions are purified through cycles of centrifugation, re-dispersion in a suitable solvent, and/or flocculation using a suitable antisolvent.

In an embodiment, obtained colloidal suspensions are heated at a temperature in a range of about 50° C. to about 1500° C., such as under ambient or inert conditions.

In an embodiment, obtained colloidal suspensions are diluted with the addition of solvent to control the final concentration of the crystalline colloidal suspension. In an embodiment, obtained colloidal suspensions are concentrated through the removal of solvent to provide solids or powders.

Post-Synthetic Chemical Treatment

In an embodiment, the method includes altering compositions of the present disclosure through post-synthetic chemical treatment. In an embodiment, post-synthetic chemical treatment includes exposing compositions described herein to chemical species in solid, liquid, and/or gas phase(s).

In an embodiment, compositions are treated with chemical species to alter or introduce X anion composition selected from the group consisting of AX, $BX_2$, CX, $DX_3$, $X_2$, $MX_3$, $MX_2$, oleylammonium-X, trimethylsilyl-X, benzoyl-X, and combinations thereof, wherein, A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{32}$, $Au^{3+}$, and combinations thereof, X is an anion selected from the group consisting of O, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{32}$, $Dy^{3+}$, $Ho^{3+}$, $Er^{3+}$, $Tm^{3+}$, $Yb^{3+}$, $Lu^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In an embodiment, compositions are treated with chemical species to alter or introduce A cation into a composition selected from the group consisting of metal halides, metal oxides, metal acetates, metal nitrates, metal phosphates, metal acetylacetonates, and combinations thereof, where the metal is composed of A cations. In an embodiment, A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof.

In an embodiment, compositions are treated with chemical species to alter or introduce B cation into a composition selected from the group consisting of metal halides, metal oxides, metal acetates, metal nitrates, metal phosphates, metal acetylacetonates, and combinations thereof, where the metal is composed of B cations. In an embodiment, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof.

In an embodiment, compositions are treated with chemical species to alter or introduce C cation into a composition selected from the group consisting of metal halides, metal oxides, metal acetates, metal nitrates, metal phosphates, metal acetylacetonates, and combinations thereof, where the metal is composed of C cations. In an embodiment, C is a cation selected from the group consisting of $Ag^+$, $Cu^+$, $Sn^+$, $Na^+$, $K^+$, $Tl^+$, $Au^+$, and combinations thereof.

In an embodiment, compositions are treated with chemical species to alter or introduce D cation into a composition selected from the group consisting of metal halides, metal oxides, metal acetates, metal nitrates, metal phosphates, metal acetylacetonates, and combinations thereof, where the metal is composed of D cations. In an embodiment, D is a cation selected from the group consisting of $In^{3+}$, $Bi^{3+}$, $Sb^{3+}$, $Au^{3+}$, and combinations thereof.

In an embodiment, compositions are treated with chemical species to alter or introduce M cation into a composition selected from the group consisting of metal halides, metal oxides, metal acetates, metal nitrates, metal phosphates, metal acetylacetonates, and combinations thereof, where the metal is composed of M cations. In an embodiment, M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In an embodiment, a surface chemistry of the crystals is altered by the introduction and/or replacement of surfactant/ligand molecules or inorganic matrices.

A Method of Depositing Spectral Downconversion Materials

In another aspect, the present disclosure provides a method of depositing spectral downconversion materials onto a substrate. In an embodiment, such deposition methods are suitable, in part or in whole, to form downconversion layers of the present disclosure.

Crystalline Colloidal Suspension Deposition

In one embodiment, the method includes depositing a crystalline colloidal suspension as described further herein onto the substrate. In an embodiment, depositing the crystalline colloidal suspension includes a deposition method selected from the group consisting of drop casting, dip coating, spin casting, slot-die printing, spray coating, screen printing, ink-jet printing, and combinations thereof onto a substrate.

In an embodiment, the resulting downconversion layer is heated at a temperature in a range of about 30° C. to 1000° C. In an embodiment, the resulting downconversion layer has a thickness in a range of about 5 nm to about 1000 nm.

Ionic Precursor Solution or Suspension Deposition

In an embodiment, the method includes deposition of solutions or suspensions of ionic precursors to provide a layer of a spectral downconversion material. In an embodiment, deposition of solutions and/or suspensions of ionic precursors is performed in a single deposition step. In an embodiment, stoichiometric amounts of solid ionic chemical precursors are loaded into a vessel to form the desired composition of matter. In an embodiment, deposition of solutions or suspensions of ionic precursors the ionic precursors includes two or more deposition steps. In an embodiment, stoichiometric amounts of solid ionic chemical precursors are loaded into two or more separate vessels to provide the desired composition of matter.

In an embodiment, the solid ionic chemical precursors are selected from the group consisting of hydrated solid ionic chemical precursors, anhydrous solid ionic chemical precursors, and combinations thereof. In an embodiment, the solid ionic chemical precursors are selected from the group consisting of metal halides, metal oxides, metal acetates, metal nitrates, metal phosphates, metal acetylacetonates, and combinations thereof.

In an embodiment, additional molecules or reagents are added to the vessel(s) to restrict grain size and/or promote precursor solubility. In an embodiment, such additives are selected from the group consisting of oleic acid, metal-oleates, oleylamine, tri-n-octlyphoshine, tri-n-octylphosphine oxide, metal alkyl-phosphonates, phosphonic acids, phosphinic acids, alkyl thiols, oleylammonium fluoride, oleylammonium chloride, oleylammonium bromide, oleylammonium iodide, 3-(N,N-dimethyloctadecylammonio) propane sulfonate, benzoic acid and derivatives thereof, fluoroacetic acid, difluoroacetic acid, trifluoroacetic acid, methylsulfonic acid, and combinations thereof.

In an embodiment, a solvent is added into the vessel(s). In an embodiment, the solvent is selected from the group consisting of hexane, octane, benzene, toluene, xylene, mesitylene, 1-octadecene, ethanol, methanol, isopropyl alcohol, acetone, DMSO, DMF, gamma-butyrolactone, N-methylformamide, propylene carbonate, glycol sulfite, formamide, acetonitrile, methyl acetate, HX(aq) (X=Cl, Br, I), formic acid, and combinations thereof.

In an embodiment, the vessel(s) is/are heated and mixed to promote precursor dissolution to form a precursor ink. In an embodiment, the method includes deposition the precursor ink onto the substrate. In an embodiment, depositing the ionic precursor ink occurs in a single step. Such deposition can occur by a method selected from the group consisting of drop casting, dip coating, spin casting, slot-die printing, spray coating, screen printing, ink-jet printing, and combinations thereof onto the substrate.

In an embodiment, the resulting deposited downconversion material is heated at a temperature in a range of about 30° C. to about 1000° C. In an embodiment, the resulting deposited downconversion material is placed under vacuum at a pressure in a range of about $1 \times 10^{-16}$ atm to about $10 \times 10^{-16}$ atm.

In an embodiment, the solid ionic chemical precursors are selected from the group consisting of hydrated solid ionic chemical precursors, anhydrous solid ionic chemical precursors, and mixtures thereof. In an embodiment, the solid ionic chemical precursors are selected from the group consisting of metal halides, metal oxides, metal acetates, metal nitrates, metal phosphates, metal acetylacetonates, and combinations thereof.

Thermal Evaporation

In an embodiment, the method includes thermally evaporating one or more precursors. In an embodiment the precursors are selected from the group consisting of crystalline powders, solid ionic precursors, single crystals of the present disclosure, and combinations thereof. In an embodiment, thermal evaporation includes thermally evaporating the crystalline powders, solid ionic precursors, or single crystals of the present disclosure in a vacuum and/or in an inert atmosphere.

In an embodiment, the thermal evaporation methods described herein are performed in a thermal evaporation chamber. In that regard, attention is directed to FIG. 28A in which a thermal evaporation chamber, in accordance with an embodiment of the disclosure, is illustrated. As discussed further herein with respect to Example 13, precursor mixtures, such as mechanochemically synthesized metal-halide powders and/or colloids of metal-halide powders can be loaded into an evaporation boat, such as molybdenum or tantalum evaporation boat suspended between two electrodes or onto a tantalum foil suspended between two electrodes inside of a vacuum chamber. The source material is rapidly evaporated/sublimated upon contact with the heating element and the resulting vapor is deposited onto a substrate. A thermal heating element is held at a desired temperature inside of a deposition chamber. The heating element can be resistively heated or heated via irradiation from a remote source.

A substrate, such as a piece of glass, a solar cell, flexible sheet, etc., onto which the evaporated composition is to be deposited may be positioned above a heater at a distance suitable for such deposition. In an embodiment, such a distance is in a range of about 1 cm to about 50 cm. In an embodiment, the evaporation chamber is evacuated to a pressure in a range of about $1 \times 10^{-3}$ mTorr to $1 \times 10^{-4}$ mTorr. In an embodiment, a large electrical current is quickly passed through the electrodes, heating the evaporation boat/foil and vaporizing the precursor mixture. In this regard, the vaporized material is deposited onto the substrate suspended above the evaporation boat/foil.

Figure 28B:
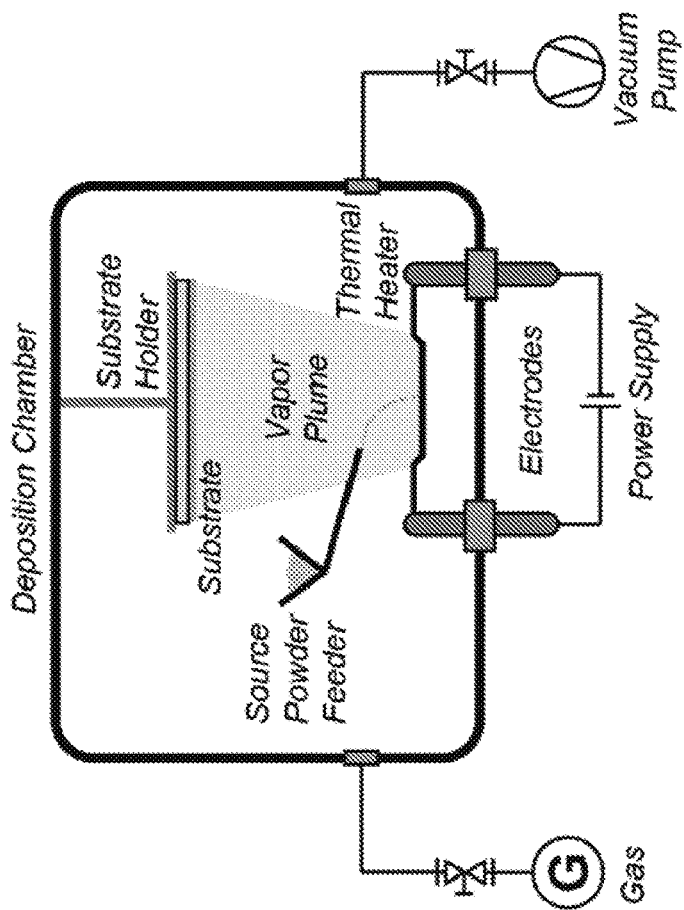
FIGS. 28A-28C illustrate schematically example thermal evaporation chambers for vapor-deposition of metal-halide semiconductors, in accordance with an embodiment of the disclosure.

In an embodiment of the method, layers of the metal-halide semiconductor material are obtained by continuous evaporation/sublimation of a source material onto a substrate. In that regard, attention is directed to FIG. 28B. In an embodiment, the thermal evaporation methods include thermal evaporation in an evaporation chamber in which source materials are provided with a feeder or other structure configured to provide a continuous or semi-continuous source of source materials. As shown, the source material is supplied to the thermal heater via a powder feeder. In an embodiment, the source material is a mixture of ionic precursor powders or a single-source metal-halide powder. In an embodiment, deposition chamber is brought to vacuum or put under an inert or reactive gas atmosphere. Example implementations of a powder feeder include a vibratory feeder or powder suspended in a pressurized carrier gas. The rate of source material sublimation may be controlled by adjusting the powder feeder rate, including suspending material deposition. Likewise, film thickness and uniformity may be controlled by altering the distance between the heating element and substrate, or by setting the rate at which source powder is supplied to the thermal heater. The substrate may be held in a fixed position or translating. The substrate may be rotating. The substrate may be heated or cooled.

In an embodiment, substrates are coated according to the methods described herein in a continuous or semicontinuous way. In that regard, attention is directed to FIG. 28C. As shown, a number of substrates are moved past a vapor plume of thin film source materials in the deposition chamber on a rolling conveyor belt. In this embodiment, a number of substrates are passed through the evaporation chamber and coated. Such an arrangement is suitable to dispose coatings on a number of substrates.

Figures 40A, 40B:
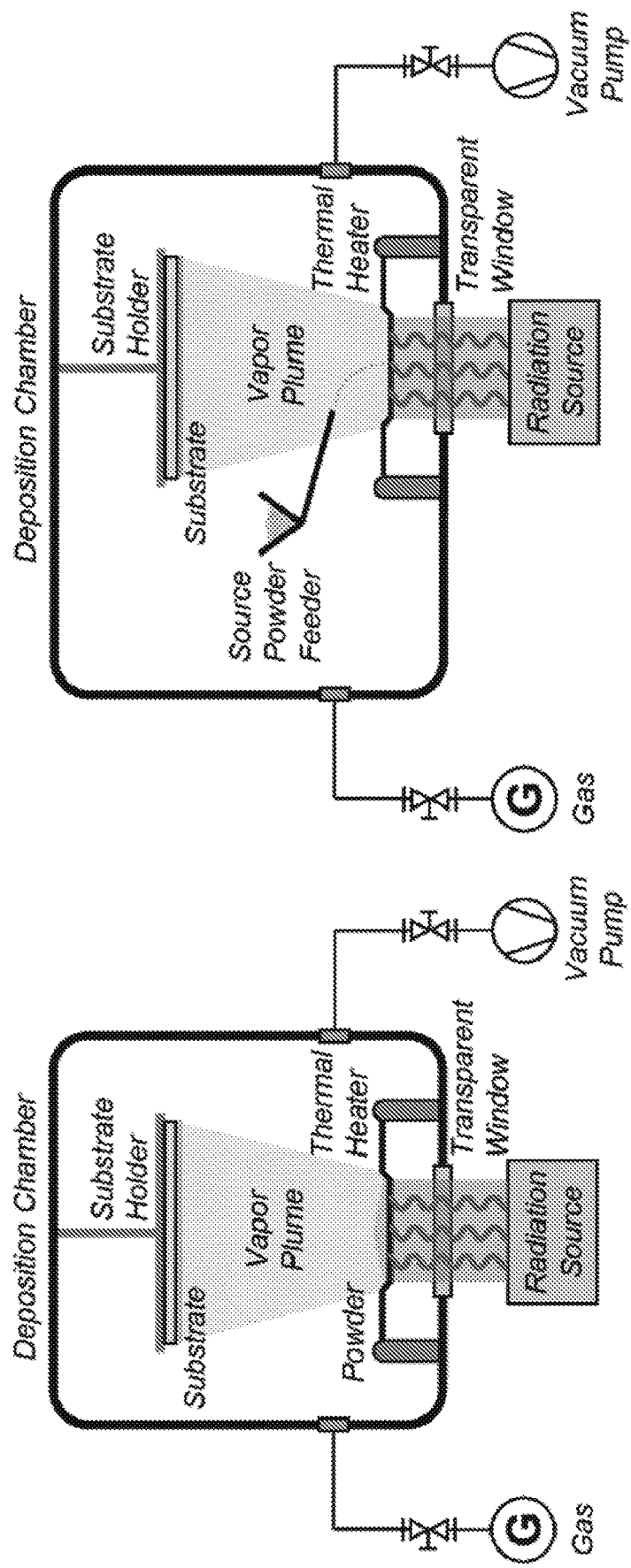
FIGS. 40A-40C illustrate schematically example thermal evaporation chambers for vapor-deposition of metal-halide semiconductors, in accordance with an embodiment of the disclosure.
Figure 40C:
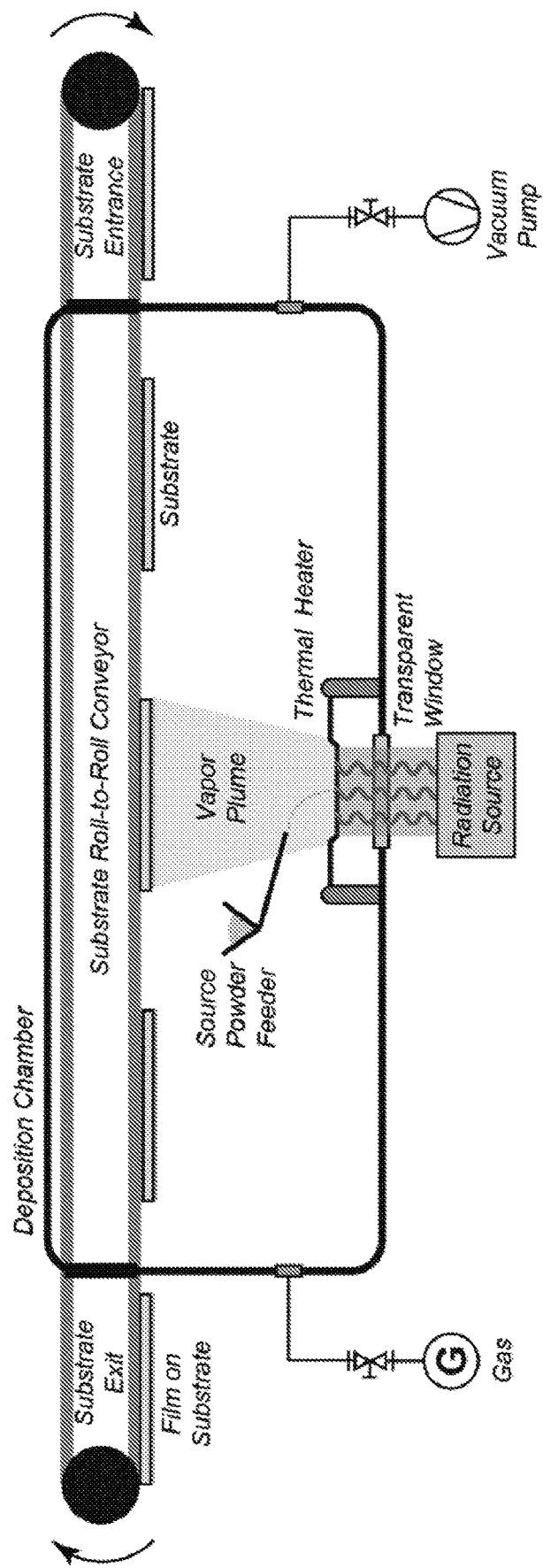

As discussed above with respect to FIGS. 28A-28C, the evaporation boat can be heated through electrical resistive heating. In an embodiment, and as shown in FIGS. 40A-40C, the evaporation boat can be heated with radiation source. While heating an evaporation boat with electrical resistive heating and a radiation source are shown, it will be understood that other heating sources and methods are possible within the scope of the present disclosure.

In an embodiment, the method includes sequentially thermally evaporating precursors onto the substrate. In an embodiment, sequentially thermally evaporating the precursors includes thermally evaporating a precursor selected from the group consisting of crystalline powders, solid ionic precursors, single crystals described herein, and combinations thereof. In an embodiment, sequential thermal evaporation is performed in a vacuum. In an embodiment, sequential thermal evaporation is performed an inert atmosphere.

In an embodiment, thermal evaporation includes thermal evaporation of the one or more precursors at a pressure in a range of about 1 to about $1\times10^{-16}$ atm. In an embodiment, thermal evaporation includes thermal evaporation of the one or more precursors in an inert gas atmosphere In an embodiment, thermal evaporation includes heating the one or more precursors to a temperature in a range of about 30° C. to about 1000° C. In an embodiment, thermal evaporation of the one or more precursors includes deposits the one or more precursors on the substrate at a rate in a range of about 0.01 Å/s to about 100 Å/s.

In an embodiment, the one or more precursors are evaporated at a stoichiometric rate to produce the composition of the present disclosure. In an embodiment, the composition varies through a thickness of the composition.

In an embodiment, the substrate is heated relative to a temperature of a thermal evaporation chamber. In an embodiment, the substrate is cooled relative to a temperature of the thermal evaporation chamber.

In an embodiment, the deposited layer is heated after thermal evaporation. In an embodiment, such heating is performed in conditions selected from the group consisting of a vacuum, inert atmosphere, or reactive atmosphere. In an embodiment, such heating is suitable to drive formation the composition of matter.

Sputtering

In an embodiment, the method includes sputtering a target assembly composed of spectral downconversion materials to provide one or more layers of spectral downconversion materials of the present disclosure. In an embodiment, the target assembly is a target assembly as described further herein.

In an embodiment, sputtering the target assembly deposits the downconversion material onto the substrate at a rate in a range of about 0.01 Å/s to about 500 Å/s. In an embodiment, the target is sputtered at a stoichiometric rate to produce the desired composition of matter. In an embodiment, the composition varies as a function of a thickness of the composition.

In an embodiment, the substrate is heated relative to a temperature of a sputtering chamber. In an embodiment, the substrate is cooled relative to a temperature of a sputtering chamber.

In an embodiment, sputtering occurs in vacuum, such as at a pressure in a range of about 1 atm to about $1\times10^{-16}$ atm. In an embodiment, sputtering occurs in an inert gas atmosphere.

In an embodiment, the resulting layer is heated after deposition. In an embodiment, such heating occurs under conditions selected from the group consisting of a vacuum, an inert atmosphere, and reactive atmosphere. In an embodiment, such heating is suitable to drive formation of the desired composition.

In an embodiment, sputtering the target assembly includes sequentially sputtering targets comprising precursor materials to provide the spectral downconversion materials. In an embodiment, an average stoichiometry of two or more successive layers produces the desired product. In an embodiment, the precursors are selected from the group consisting of metal halides, metal oxides, metal acetates, metal nitrates, metal phosphates, metal acetylacetonates, and combinations thereof. In an embodiment, a precursor film thickness is in a range of about 1 Å to about 500 Ås$^{-1}$. In an embodiment, the precursors are deposited at a rate in a range of about 0.01 Å/s to 500 Å/s. In an embodiment, the resulting layer is heated after deposition in a vacuum, inert atmosphere, or reactive atmosphere to drive formation of the desired composition of matter.

Chemical Vapor Deposition

In an embodiment, the method includes chemical vapor deposition (CVD) of one or more precursors to provide spectral downconversion materials of the present disclosure. In an embodiment, CVD includes plasma-enhanced chemical vapor deposition (PECVD).

In an embodiment, a concentration of precursors at the substrate is controlled to produce a stoichiometric ratio, corresponding to the desired composition of matter. In an embodiment, the desired composition of matter varies as a function of layer thickness.

In an embodiment, a substrate temperature is varied in a range of about 5 K to about 1000° C. In an embodiment, a chamber pressure is varied from 1 and $1\times10^{-16}$ atm.

In an embodiment, the one or more precursors include a Yb$^{3+}$ CVD precursors. In an embodiment, the Yb$^{3+}$ CVD precursor is selected from the group consisting of Tris[N,N-bis(trimethylsilyl)amide]ytterbium(III), Tris(cyclopentadienyl)ytterbium(III), Yb(acac)3, Tris(cyclopentadienyl)ytterbium, Tris(N,N'-di-i-propylacetamidinato)ytterbium(III), Tris(2,2,6,6-tetramethyl-3,5-heptanedionato)ytterbium(III), Ytterbium(III) hexafluoroacetylacetonate dihydrate, and combinations thereof.

In an embodiment, the resulting layer is heated after deposition. Such heating can include heating in conditions selected from the group consisting of a vacuum, inert atmosphere, or reactive atmosphere. In an embodiment, such heating is suitable to drive formation of the desired composition of matter.

Electron Beam Deposition

In an embodiment, the method includes electron beam deposition of one or more precursors to provide the spectral downconversion materials of the present disclosure. In an embodiment, the one or more precursors are selected from the group consisting of crystalline powders, solid ionic precursors, single crystals described further herein, and combinations thereof. In an embodiment, electron beam deposition is conducted in a vacuum or inert atmosphere.

In an embodiment, the one or more precursors are deposited on a substrate at a rate in a range of about 0.01 Å/s to about 100 Å/s. In an embodiment, the one or more precursors are deposited at a stoichiometric rate suitable to provide the desired downconversion material. In an embodiment, the deposited composition varies as function of a thickness of the composition.

In an embodiment, the substrate is heated relative to an electron beam deposition chamber. In an embodiment, the substrate is cooled relative to an electron beam deposition chamber.

In an embodiment, the resulting downconversion composition is heated after electron beam deposition. In an embodiment, such heating is under conditions selected from the group consisting of a vacuum, an inert atmosphere, and reactive atmosphere. In an embodiment, such heating is suitable to drive formation of the desired composition of matter. Heating can drive diffusion, reactions with a reactive atmosphere to oxidize, reduce, or otherwise chemically modify the film.

In embodiment, electron beam deposition includes sequential electron beam deposition of the one or more precursor materials. In an embodiment, an average stoichiometry of two or more successive layers provides the desired downconversion material.

In an embodiment, the one or more precursors are selected from the group consisting of metal halides, metal oxides, metal acetates, metal nitrates, metal phosphates, metal acetylacetonates, and combinations thereof.

Pulsed Laser Deposition

In an embodiment, the method includes pulsed laser deposition of one or more precursors to provide the spectral downconversion material. In an embodiment, the one or more precursors are selected from the group consisting of crystalline powders, solid ionic precursors, single crystals of the present disclosure, and combinations thereof. In an embodiment, pulsed laser deposition is conducted in a vacuum or inert atmosphere.

In an embodiment, a local stoichiometric ratio of deposited materials produces the desired composition. In an embodiment, the deposited composition varies as a function of thickness of the composition.

In an embodiment, the substrate is heated relative to a pulsed laser deposition chamber. In an embodiment, the substrate is cooled relative to the pulsed laser deposition chamber.

In an embodiment, the resulting thin layer is heated after deposition. In an embodiment, such heating is conducted under conditions selected from the group consisting of a vacuum, an inert atmosphere, and reactive atmosphere. In an embodiment, such heating is suitable to drive formation of the desired composition of matter.

A Method of Forming a Precursor Mixture

In another aspect, the present disclosure provides a method of forming a precursor mixture. In an embodiment, the method includes mixing one or more precursor materials to form the precursor mixture. In an embodiment, the one or more precursor materials are selected from the group consisting of:

$M:ABX_3$, $M:AB_2X_5$, $M:A_4BX_6$, $M:C_2DX_5$, $M:A_2CDX_6$, $ABX_3$, $AB_2X_5$, $A_4BX_6$, $C_2DX_5$, $A_2CDX_6$, $AX$, $BX_2$, $CX$, $DX_3$, $MX_2$, and $MX_3$, wherein A is a cation selected from the group consisting of $Li^+$, $Na^+$, $K^+$, $Rb^+$, $Cs^+$, methylammonium, formamidinium, guanidinium, dimethylammonium, trimethylammonium, and combinations thereof, B is a cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof, C is a cation selected from the group consisting of $Ag^+$, $Cu^+$, $Sn^+$, $Na^+$, $K^+$, $Tl^+$, $Au^+$, and combinations thereof, D is a cation selected from the group consisting of $In^{3+}$, $Bi^{3+}$, $Sb^{3+}$, $Au^{3+}$, and combinations thereof, X is an anion selected from the group consisting of $O^-$, $F^-$, $Cl^-$, $Br^-$, $I^-$, $CN^-$, and combinations thereof, and M is a cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Y^{3+}$, $LU^{3+}$, $Sc^{3+}$, $Fe^{3+}$, $Al^{3+}$, $V^{2+}$, $Cr^{2+}$, $Mn^{2+}$, $Bi^{3+}$, and combinations thereof.

In an embodiment, the precursor mixture is suitable for use in making a composition of the present disclosure, such as a downconversion material. In an embodiment, making a composition of the present disclosure using the precursor mixture is conducted according to one or more of the methods described further herein.

In an embodiment, forming one or more precursor materials includes pulverizing precursor materials to form a crystalline powder. In an embodiment, pulverization includes a form of pulverization selected from the group consisting of shaking, grinding, crushing, and sonicating. In an embodiment, pulverization includes use of an instrument selected from the group consisting of a mortar and pestle, rotary ball mill, planetary ball mill, bath sonicator, probe sonicator, vortexer, and combination thereof.

In an embodiment, the method includes sintering the crystalline powder. In an embodiment, sintering the crystalline power includes sintering the crystalline powder at a temperature in a range of about 100° C. to about 1500° C. In an embodiment, the crystalline powder is sintered for a time in a range of about 0.01 hours to about 48 hours. In an embodiment, the sintered powder is pulverized one or more times.

In an embodiment, the crystalline powder is sintered under vacuum at a pressure down to about $1\times10^{-6}$ torr. In an embodiment, the crystalline powder is sintered in an inert atmosphere. In an embodiment, the crystalline powder is sintered under ambient conditions.

In an embodiment, the method includes pressing the crystalline powder into a pellet. In an embodiment the method includes sintering the pellet. In an embodiment, the crystalline powder is pressed into a mechanically stable shape. In an embodiment, the crystalline powder is pressed at a pressure in a range of about 10 MPa to about 1000 MPa. In an embodiment, the crystalline powder is pressed under a vacuum having a pressure as low as about $1\times10^{-6}$ torr. In an embodiment, pressing occurs under an inert atmosphere.

In an embodiment, pressing the crystalline powder includes pressing with a press, such as a press selected from the group consisting of hydraulic, pneumatic, and mechanical presses. In an embodiment, the press uses a plate or die.

In an embodiment, a shape of the pressed crystalline powder is selected from the group consisting of a disk, a rectangle, and a polygon. In an embodiment, the pressed crystalline powder has a longest dimension of about 1 meter. In an embodiment, the pressed crystalline powder has a thickness of down to about 1 mm. In an embodiment, the pressed crystalline powder is further altered a die or mill.

In an embodiment, the precursor materials are selected from the group consisting of metal halides, metal oxides, metal acetates, metal nitrates, metal phosphates, metal acetylacetonates, and combinations thereof.

In an embodiment, the method of forming a precursor mixture is suitable to provide a precursor mixture of the present disclosure, as discussed further herein. In an embodiment, the method of forming the precursor mixture is suitable to provide a sputtering target assembly, as discussed further herein

EXAMPLES

Figure 25A:
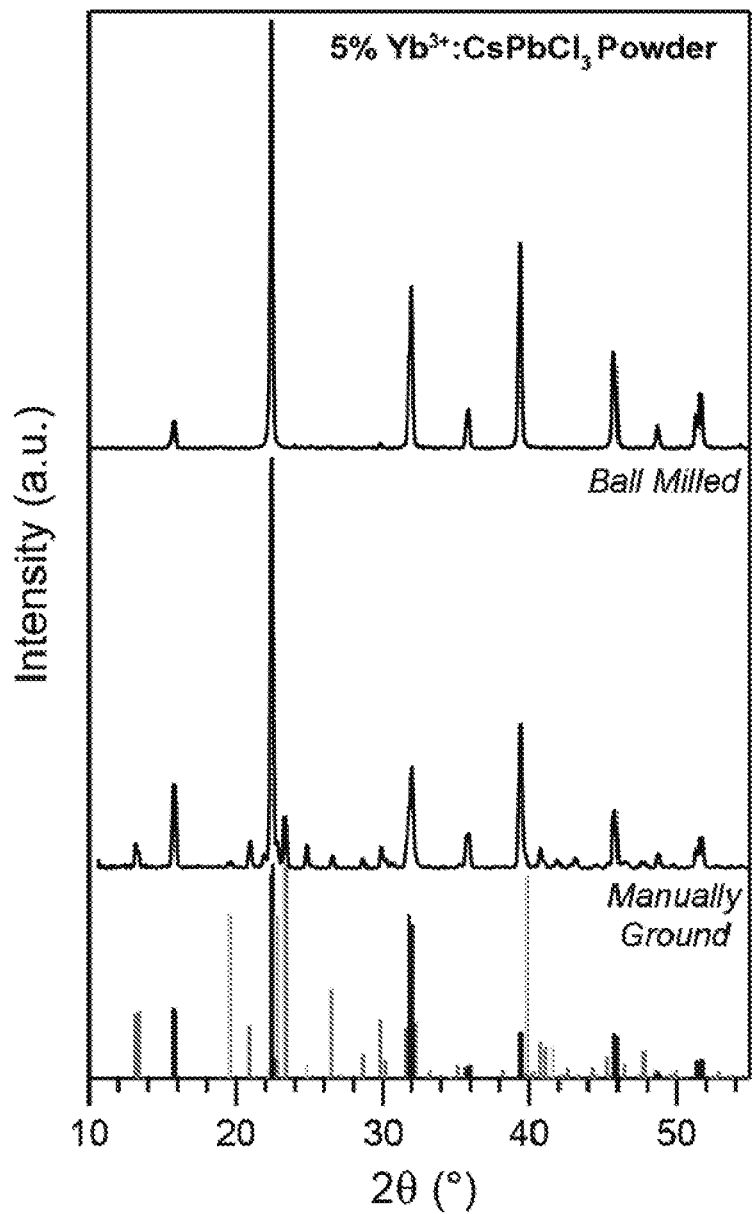
FIG. 25A shows the X-ray diffraction pattern of $Yb^{3+}$-doped $CsPbCl_3$ powder, in accordance with an embodiment of the disclosure, both manually ground and ball milled.
Figure 25B:
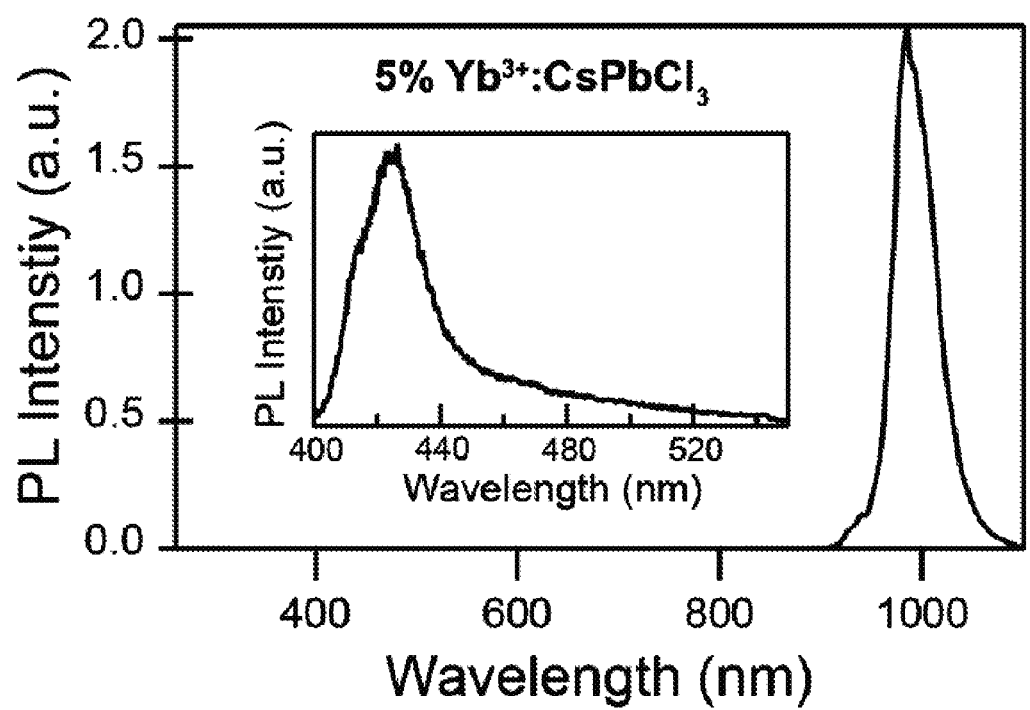
FIG. 25B shows the photoluminescence spectrum of $Yb^{3+}$-doped $CsPbCl_3$ powder under 365 nm photoexcitation, in accordance with an embodiment of the disclosure.

Example 1: Mechanochemical Synthesis of ~3% $Yb^{3+}$-Doped $CsPbCl_3$ Powder $YbCl_3 \cdot 6H_2O$ (0.174 g, 0.045 mmol), CsCl (0.253 g, 1.5 mmol), and $PbCl_2$ (0.405 g, 1.5 mmol) were loaded into a 50 mL zirconia grinding jar with 40 g of 5 mm zirconia grinding balls. The jar was mounted on a planetary ball mill (MSE Supplies, Model PMGB-0.2 L), and the speed was set to 500 RPM. The subsequent milling lasted for 1 hour giving a fine white powder with yields >90% by weight, and the powder was annealed at 250° C. for 10 mins. X-ray diffraction data taken of the powder index to Pnma $CsPbCl_3$ is shown in FIG. 25A. Photoexcitation of the powder with 365 nm irradiation results in strong near infrared emission centered at 985 nm, corresponding to the $^2F_{5/2} \rightarrow {}^2F_{7/2}$ f-f emission of $Yb^{3+}$ (FIG. 25B). Weak emission centered at 425 nm corresponds to the $CsPbCl_3$ exciton (FIG. 25B inset).

Figure 26A:
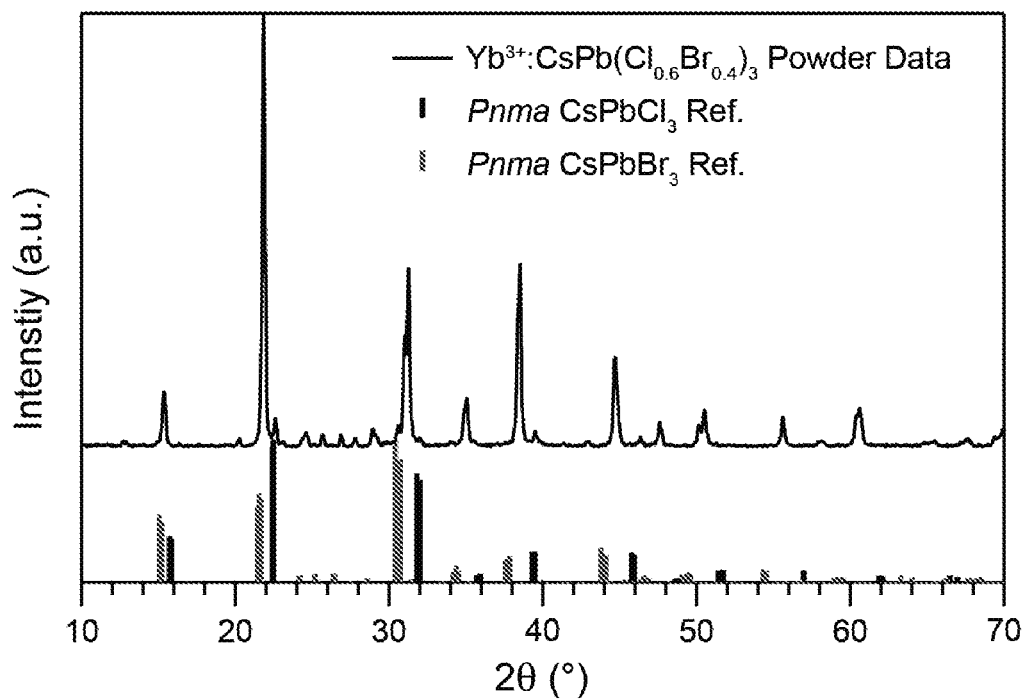
FIG. 26A shows the X-ray diffraction pattern of $Yb^{3+}$-doped $CsPb(Cl_{0.6}Br_{0.4})_3$ powder, in accordance with an embodiment of the disclosure.
Figure 26B:
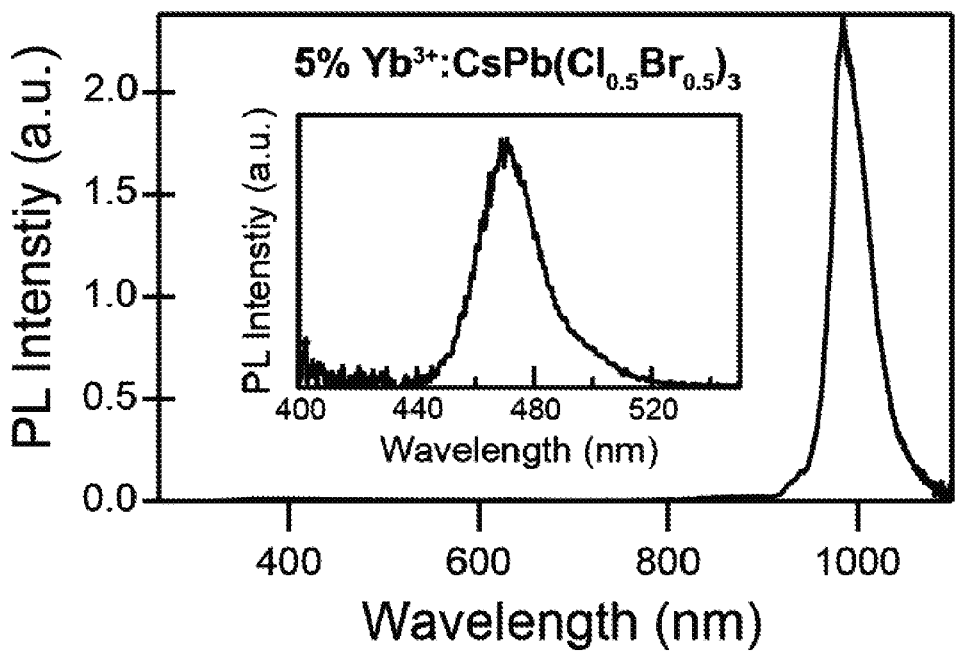
FIG. 26B shows the photoluminescence spectrum of $Yb^{3+}$-doped $CsPb(Cl_{0.6}Br_{0.4})_3$ powder under 405 nm photoexcitation, in accordance with an embodiment of the disclosure.

Example 2: Mechanochemical Synthesis of ~5% $Yb^{3+}$-Doped $CsPb(Cl_{0.6}Br_{0.4})_3$ Powder $YbBr_3 \cdot 6H_2O$ (0.028 g, 0.053 mmol), CsBr (0.174 g, 0.817 mmol), $PbBr_2$ (0.294 g, 0.801 mmol), $YbCl_3 \cdot 6H_2O$ (0.021 g, 0.053 mmol), CsCl (0.203 g, 1.206 mmol), and $PbCl_2$ (0.334 g, 1.200 mmol) were loaded into a 50 mL zirconia grinding jar with 40 g of 5 mm zirconia grinding balls. The jar was mounted on a planetary ball mill (MSE Supplies, Model PMGB-0.2L), and the speed was set to 500 RPM. The subsequent milling lasted for 1 h giving a fine yellow powder with yields >90% by weight, and the powder was annealed at 250° C. for 10 mins. X-ray diffraction data taken of the resulting powder show reflections intermediate to those of Pnma $CsPbCl_3$ and Pnma $CsPbBr_3$, indication an alloyed halide composition (FIG. 26A). Photoexcitation of the powder with 405 nm irradiation results in strong near infrared emission centered at 985 nm, corresponding to the $^2F_{5/2} \rightarrow {}^2F_{7/2}$ f-f emission of $Yb^{3+}$ (FIG. 26B). Weak emission centered at 470 nm corresponds to the $CsPb(Cl_{0.6}Br_{0.4})_3$ exciton (FIG. 26B inset).

Example 3: Mechanochemical Synthesis of $Cs_2AgBiBr_6$ Powder

Figure 27A:
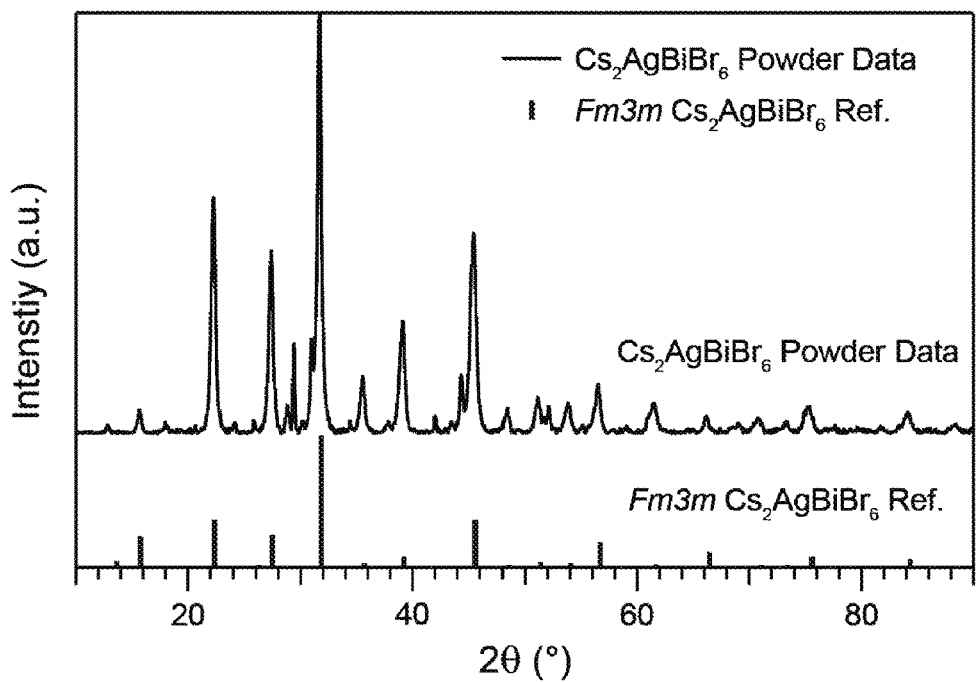
FIG. 27A shows the X-ray diffraction pattern of $Cs_2AgBiBr_6$ powder, in accordance with an embodiment of the disclosure.
Figure 27B:
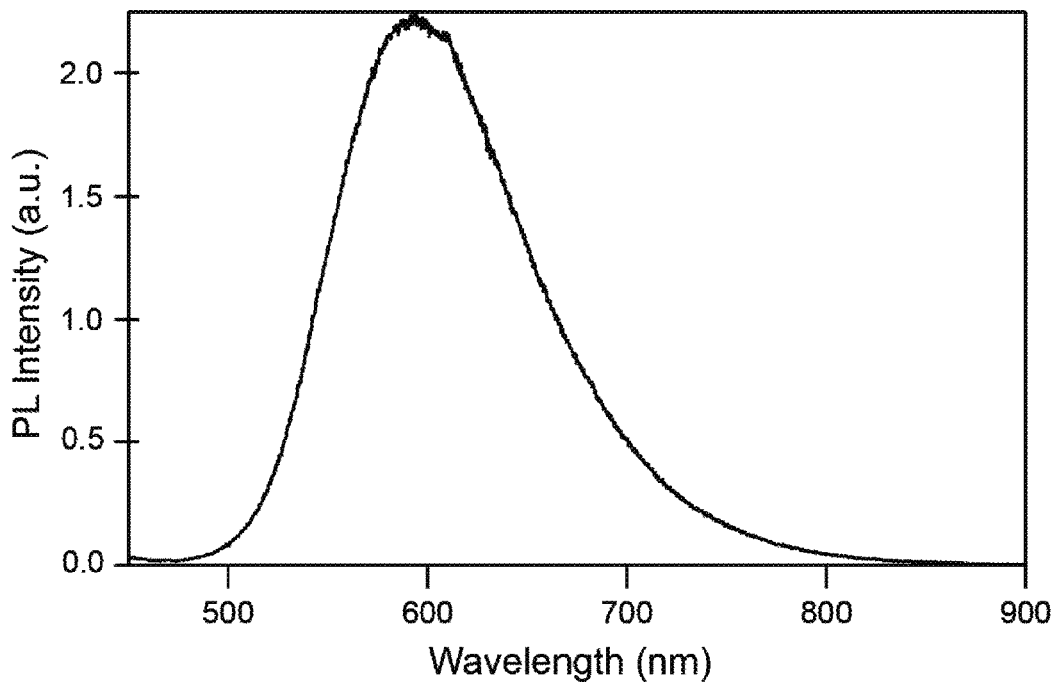
FIG. 27B shows the photoluminescence spectrum of $Cs_2AgBiBr_6$ powder under 405 nm photoexcitation, in accordance with an embodiment of the disclosure.

CsBr (0.801 g, 3.76 mmol), AgBr (0.353 g, 1.88 mmol), and $BiBr_3$ (0.844 g, 1.88 mmol) were loaded into a 50 mL zirconia grinding jar with 40 g of 5 mm zirconia grinding balls. The jar was mounted on a planetary ball mill (MSE Supplies, Model PMGB-0.2 L), and the speed was set to 500 RPM. The subsequent milling lasted for 1 h giving a fine orange powder with yields >90% by weight, and the powder was annealed at 250° C. for 10 mins. X-ray diffraction data taken of the resulting powder index to Fm3m $Cs_2AgBiBr_6$ is shown in FIG. 27A. Photoexcitation of the powder with 405 nm irradiation results in characteristic emission centered at 593 nm (FIG. 27B).

Example 4: Mechanochemical Synthesis of $MAPbI_3$ Powder

MAI (0.588 g, 5.25 mmol) and $PbI_2$ (1.927 g, 5.25 mmol) were loaded into a 50 mL zirconia grinding jar with 80 g of 3 mm zirconia grinding balls. The jar was mounted on a planetary ball mill (MSE Supplies, Model PMGB-0.2 L), and the speed was set to 500 RPM. The subsequent milling lasted for 9 h giving a fine black powder with yields >90% by weight. Representative X-ray diffraction data taken of the powder are shown in FIG. 43.

Example 5: Mechanochemical Synthesis of $(FA_{0.85}Cs_{0.15})PbI_3$ Powder

Figure 45B:
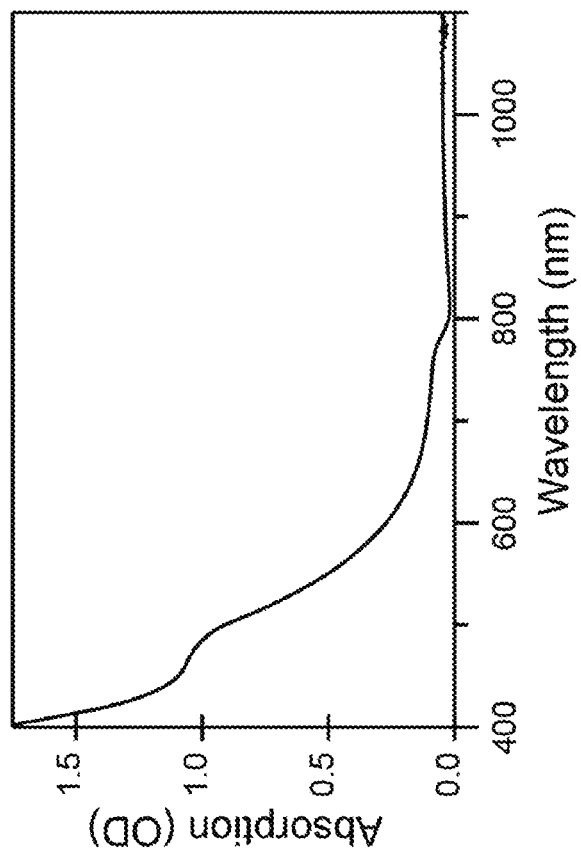
FIG. 45B shows the absorption spectrum of a $(FA_{0.85}Cs_{0.15})PbI_3$ film deposited by SSVD, in accordance with an embodiment of the disclosure.
Figure 45A:
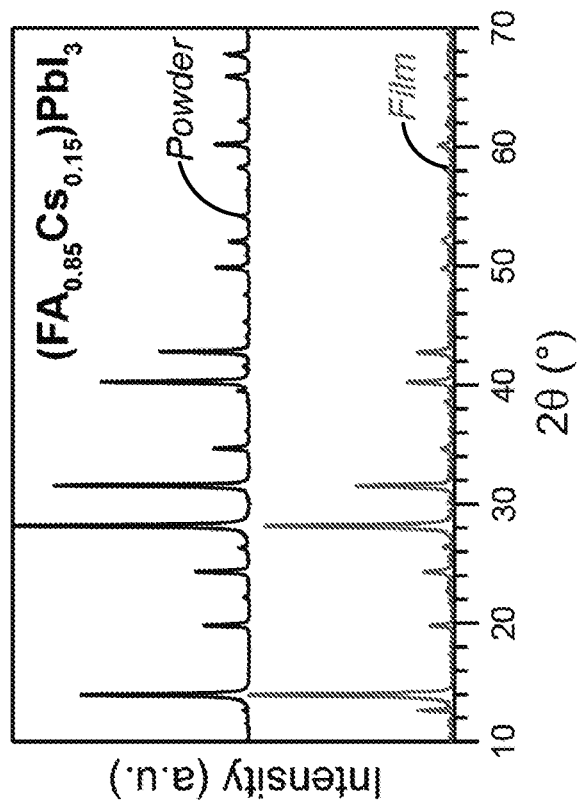
FIG. 45A shows the X-ray diffraction pattern of $(FA_{0.85}Cs_{0.15})PbI_3$ powder and a film deposited by SSVD (grey), in accordance with an embodiment of the disclosure.

FAI (0.439 g; 2.55 mmol), CsI (0.117 g; 0.45 mmol), and $PbI_2$ (1.383 g; 3.0 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h giving a fine black powder with yields >90% by weight. Representative X-ray diffraction data taken of the powder are shown in FIG. 45.

Figure 46B:
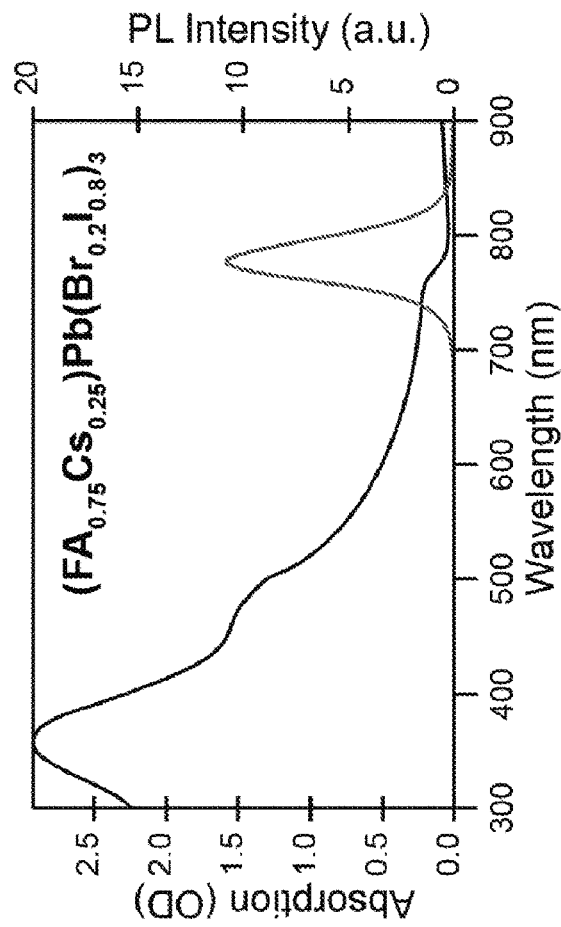
FIG. 46B shows the absorption (black) and photoluminescence (grey) spectra of a $(FA_{0.75}Cs_{0.25})Pb(Br_{0.2}I_{0.8})_3$ film deposited by SSVD, in accordance with an embodiment of the disclosure.
Figure 46A:
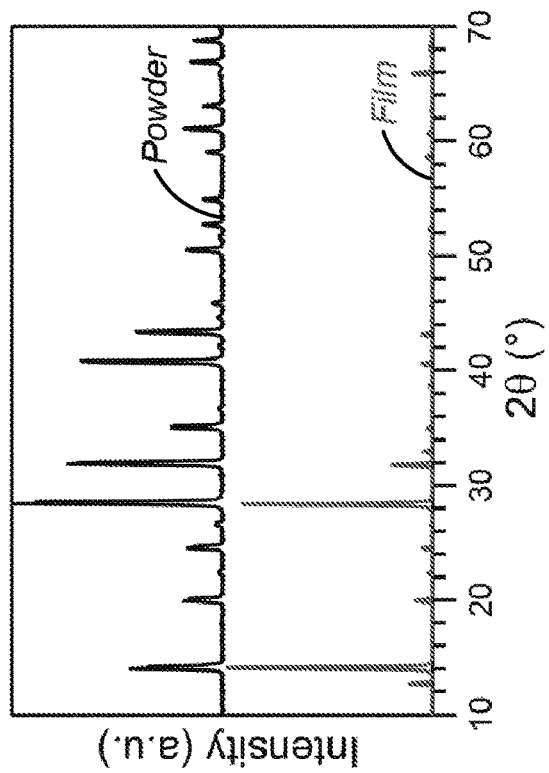
FIG. 46A shows the X-ray diffraction pattern of $(FA_{0.75}Cs_{0.25})Pb(Br_{0.2}I_{0.8})_3$ powder (black) and a film deposited by SSVD (grey), in accordance with an embodiment of the disclosure.

Example 6: Mechanochemical Synthesis of $(FA_{0.75}Cs_{0.25})Pb(Br_{0.2}I_{0.8})_3$ Powder FAI (0.516 g; 3.0 mmol), CsI (0.260 g; 1.0 mmol), $PbI_2$ (1.291 g; 2.8 mmol), and $PbBr_2$ (0.440 g; 1.2 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h giving a fine brown powder with yields >90% by weight. Representative X-ray diffraction data taken of the powder are shown in FIG. 46A.

Figure 44B:
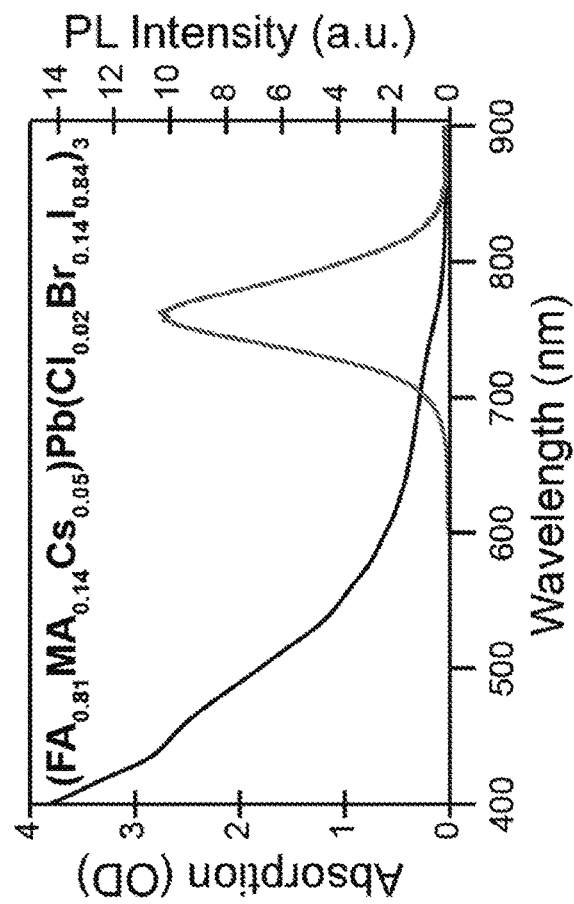
FIG. 44B shows the absorption (black) and photoluminescence spectrum (grey) of $(FA_{0.81}MA_{0.14}Cs_{0.05})Pb(Cl_{0.02}Br_{0.14}I_{0.84})_3$ powder under photoexcitation, in accordance with an embodiment of the disclosure.
Figure 44A:
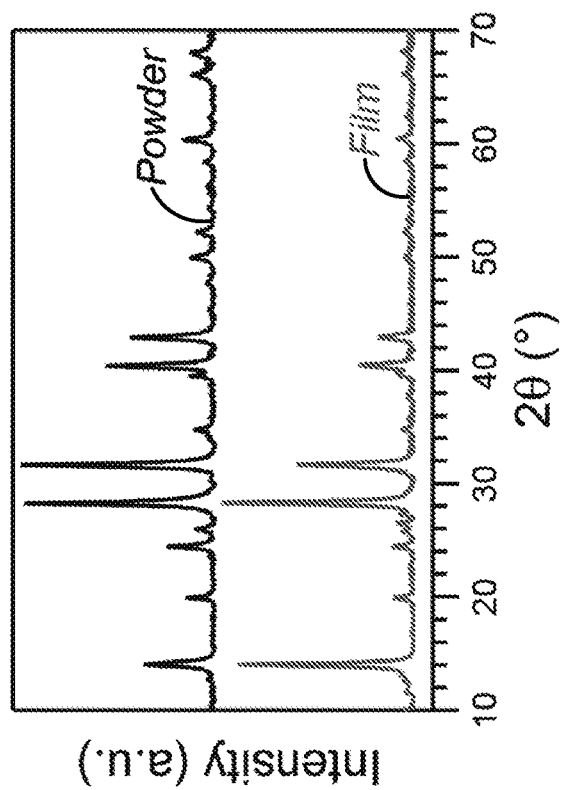
FIG. 44A shows the X-ray diffraction pattern of $(FA_{0.81}MA_{0.14}Cs_{0.05})Pb(Cl_{0.02}Br_{0.14}I_{0.84})_3$ powder (black) and a film deposited by SSVD (grey), in accordance with an embodiment of the disclosure.

Example 7: Mechanochemical Synthesis of $(FA_{0.81}MA_{0.14}Cs_{0.05})Pb(Cl_{0.02}Br_{0.14}I_{0.84})_3$ Powder CsCl (0.032 g; 0.190 mmol), MABr (0.064 g; 0.571 mmol), FAI (0.584 g; 3.396 mmol), $PbBr_2$ (0.220 g; 0.599 mmol), and $PbI_2$ (1.644 g; 3.566 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 2 h giving a fine black powder with yields >90% by weight. Representative X-ray diffraction data taken of the powder are shown in FIG. 44.

Example 8: Mechanochemical Synthesis of $CsPbBr_3$ Powder

Figure 47B:
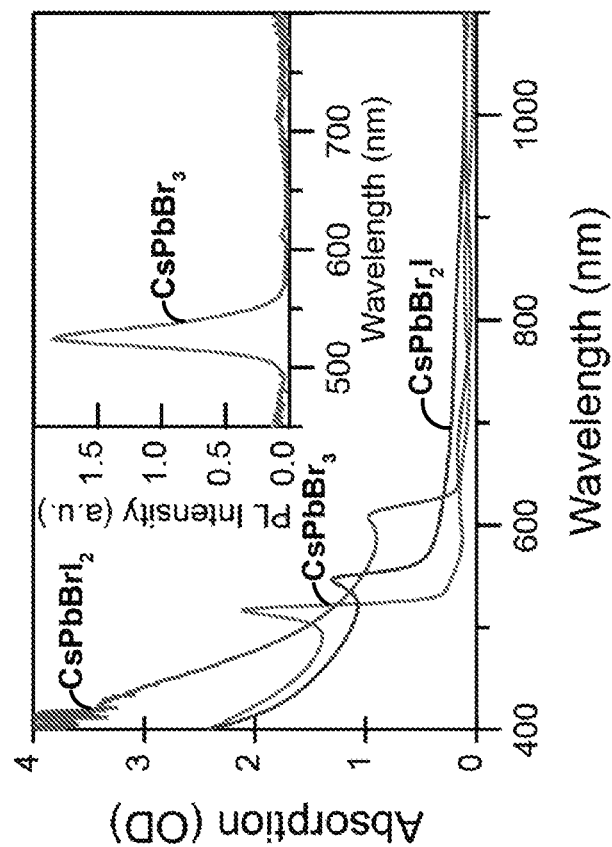
FIG. 47B shows the absorption spectra of $CsPbBrI_2$, $CsPbBr_3$, $CsPbBr_3$ films deposited by SSVD, in accordance with an embodiment of the disclosure; Inset shows the photoluminescence spectrum of a $CsPbBr_3$ film deposited by SSVD under photoexcitation.
Figure 47A:
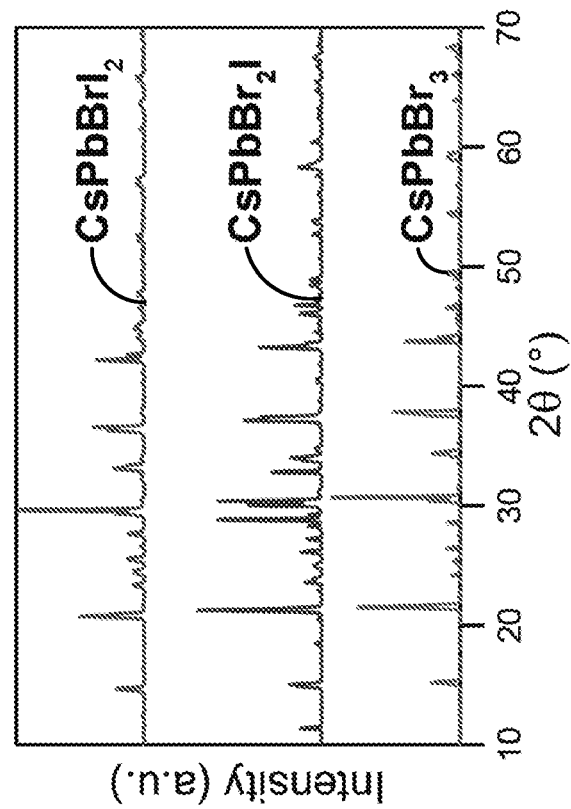
FIG. 47A shows the X-ray diffraction patterns of $CsPbBrI_2$, $CsPbBr_3$, $CsPbBr_3$ powder, in accordance with an embodiment of the disclosure.

CsBr (0.909 g; 3.5 mmol) and $PbBr_2$ (1.614 g; 3.5 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h giving a fine orange powder with yields >90% by weight. Representative X-ray diffraction data taken of the powder are shown in FIG. 47.

Example 9: Mechanochemical Synthesis of $CsPbBr_2I$ Powder

CsBr (0.606 g; 2.333 mmol), CsI (0.248 g; 1.167 mmol), $PbBr_2$ (1.076 g; 2.333 mmol), and $PbI_2$ (0.428 g; 1.167 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h. Representative X-ray diffraction data taken of the powder are shown in FIG. 47.

Example 10: Mechanochemical Synthesis of $CsPbBrI_2$ Powder

CsBr (0.303 g; 1.167 mmol), CsI (0.497 g; 2.333 mmol), $PbBr_2$ (0.538 g; 1.167 mmol), and $PbI_2$ (0.856 g; 2.333 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h. Representative X-ray diffraction data taken of the powder are shown in FIG. 47.

Example 11: Mechanochemical Synthesis of $Cs(Pb_{0.9}Sn_{0.1})Br_2I$ Powder

CsI (0.831 g; 3.20 mmol), $SnBr_2$ (0.089 g; 0.32 mmol), and $PbBr_2$ (1.057 g; 2.88 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h. Representative X-ray diffraction data taken of the powder are shown in FIG. 48.

Example 12: Mechanochemical Synthesis of $Yb^{3+}:CsAgBiBr_6$ Powder

Figure 50B:
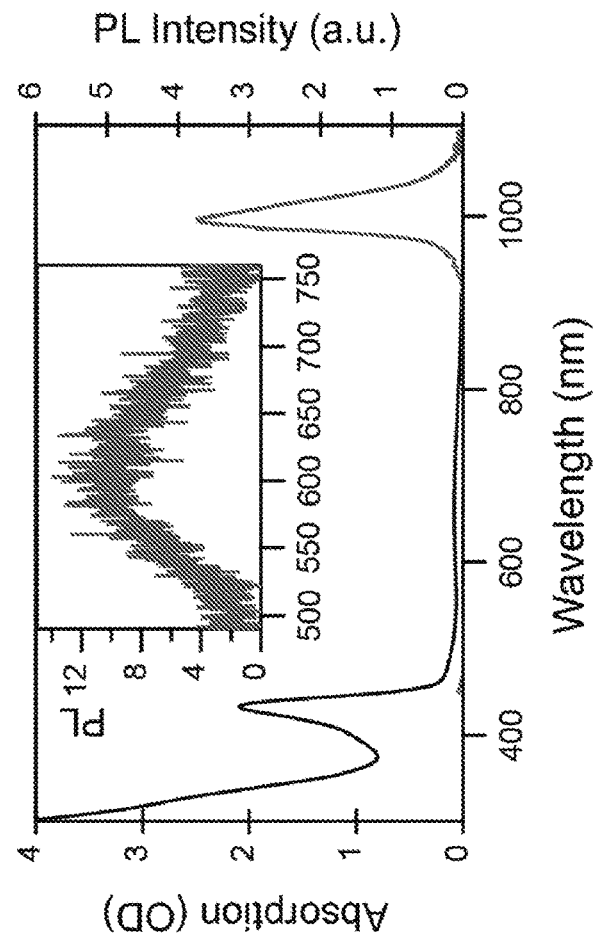
FIG. 50B shows the absorption (black) and photoluminescence (grey) spectrum of a $Yb^{3+}$:$Cs_2AgBiBr_6$ film deposited by SSVD, in accordance with an embodiment of the disclosure; Inset highlight the band-edge photoluminescence region.
Figure 50A:
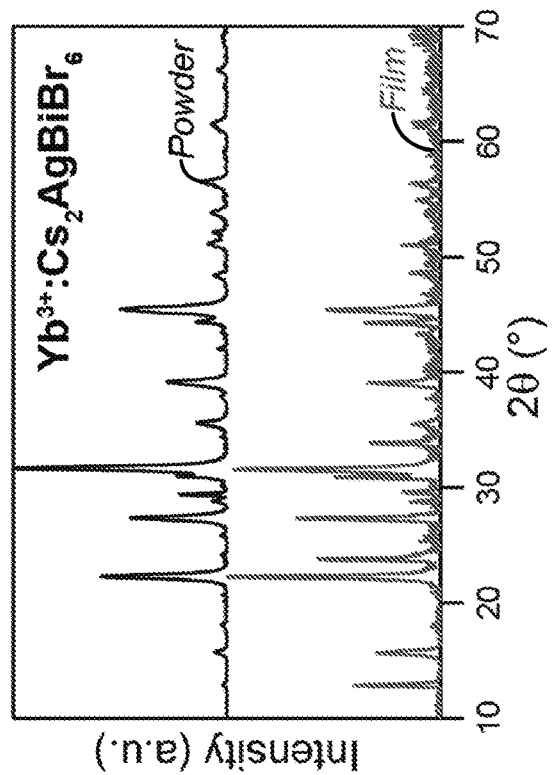
FIG. 50A shows the X-ray diffraction pattern of $Yb^{3+}$:$Cs_2AgBiBr_6$ powder (black) and a film deposited by SSVD (grey), in accordance with an embodiment of the disclosure.

CsBr (1.064 g; 5.000 mmol), AgBr (0.469 g; 2.500 mmol), $BiBr_3$ (1.066 g; 2.375 mmol), and $YbBr_3$ (0.065 g; 0.125 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L), and the speed was set to 500 RPM. The subsequent milling lasted for 9 h giving a fine orange powder with yields >90% by weight. Representative X-ray diffraction data taken of the powder are shown in FIG. 50.

Example 13: General Vapor Deposition of Metal-Halide Powder

Figure 29A:
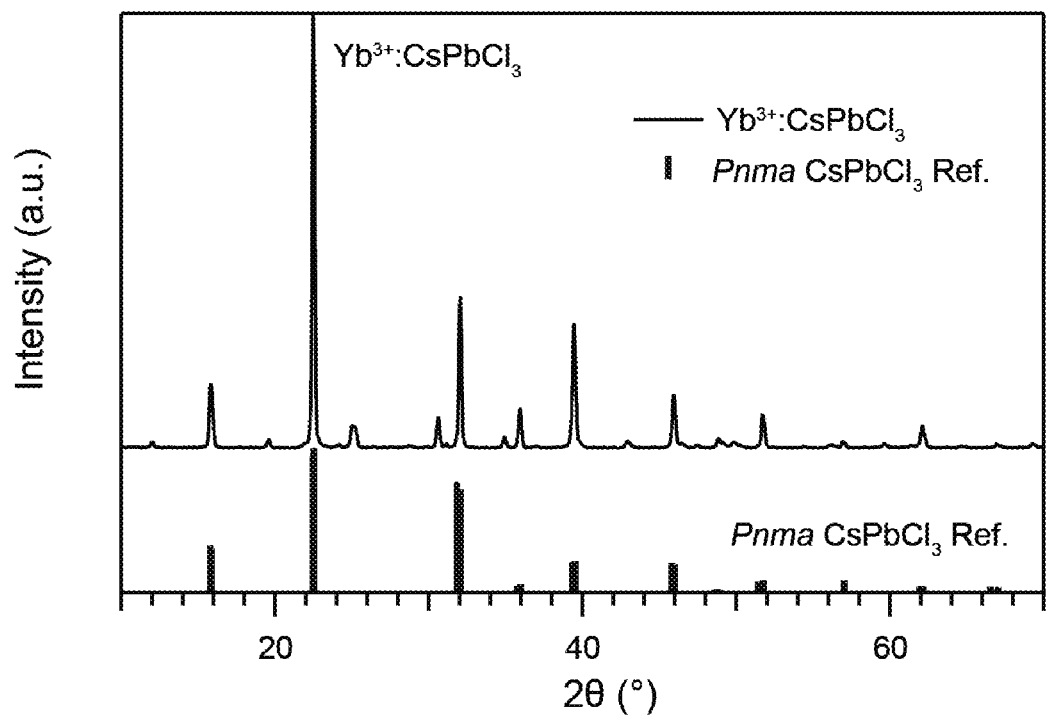
FIG. 29A shows the X-ray diffraction pattern of a $Yb^{3+}$-doped $CsPbCl_3$ thin film, in accordance with an embodiment of the disclosure.
Figure 29B:
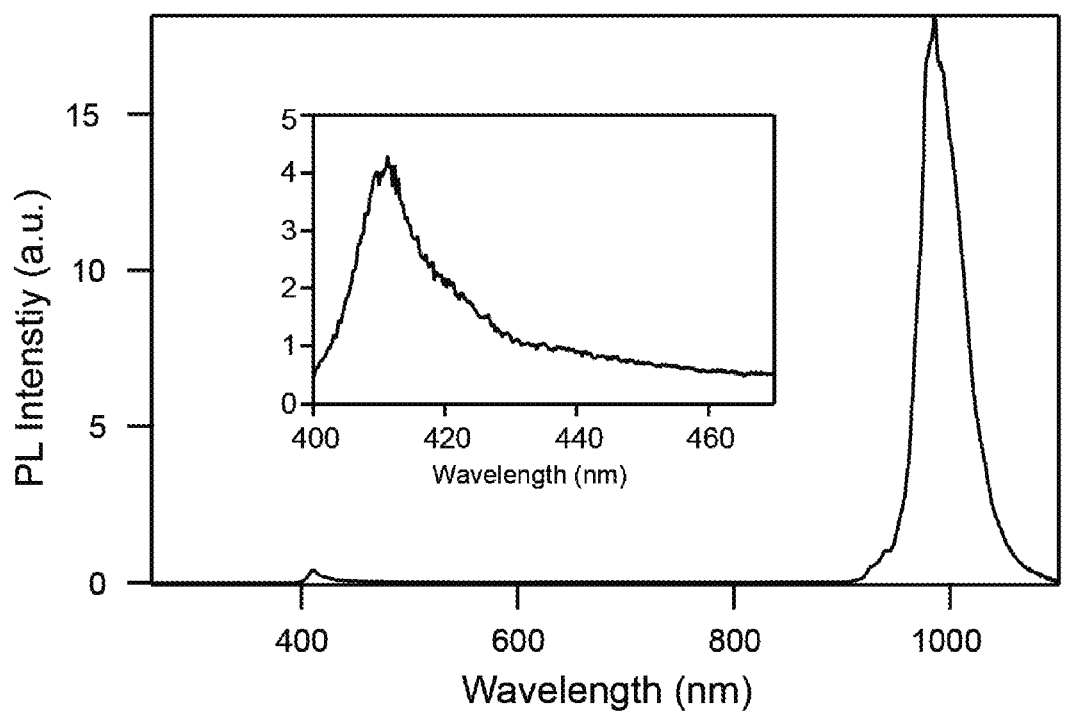
FIG. 29B shows the photoluminescence spectrum of a $Yb^{3+}$-doped $CsPbCl_3$ thin film under 365 nm photoexcitation, in accordance with an embodiment of the disclosure.
Figure 29C:
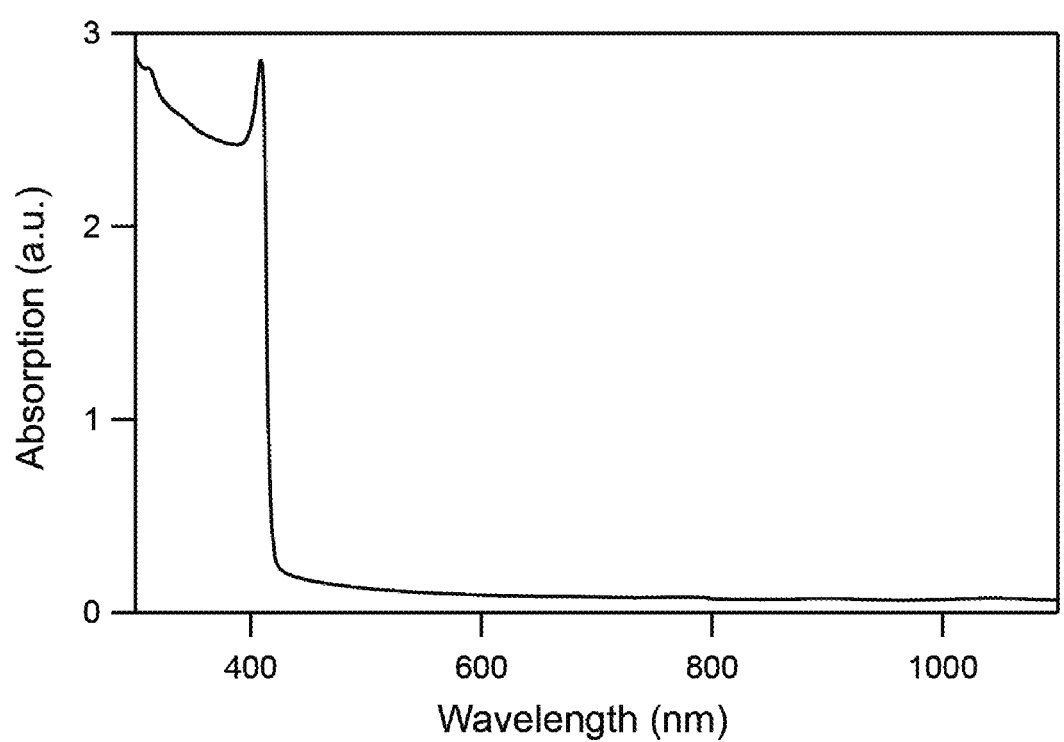
FIG. 29C shows the ultraviolet-visible-near-infrared (UV-Vis-NIR) absorption spectrum of a $Yb^{3+}$-doped $CsPbCl_3$ thin film, in accordance with an embodiment of the disclosure.
Figure 30A:
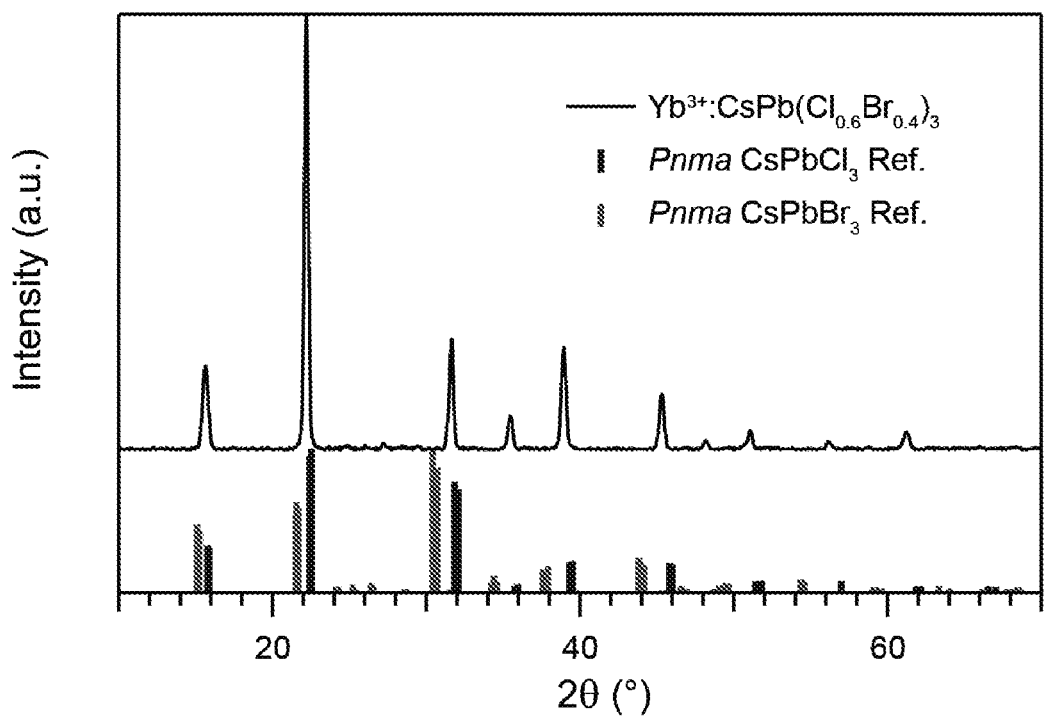
FIG. 30A shows the X-ray diffraction pattern of a $Yb^{3+}$-doped $CsPb(Cl_{0.6}Br_{0.4})_3$ thin film, in accordance with an embodiment of the disclosure.
Figure 30B:
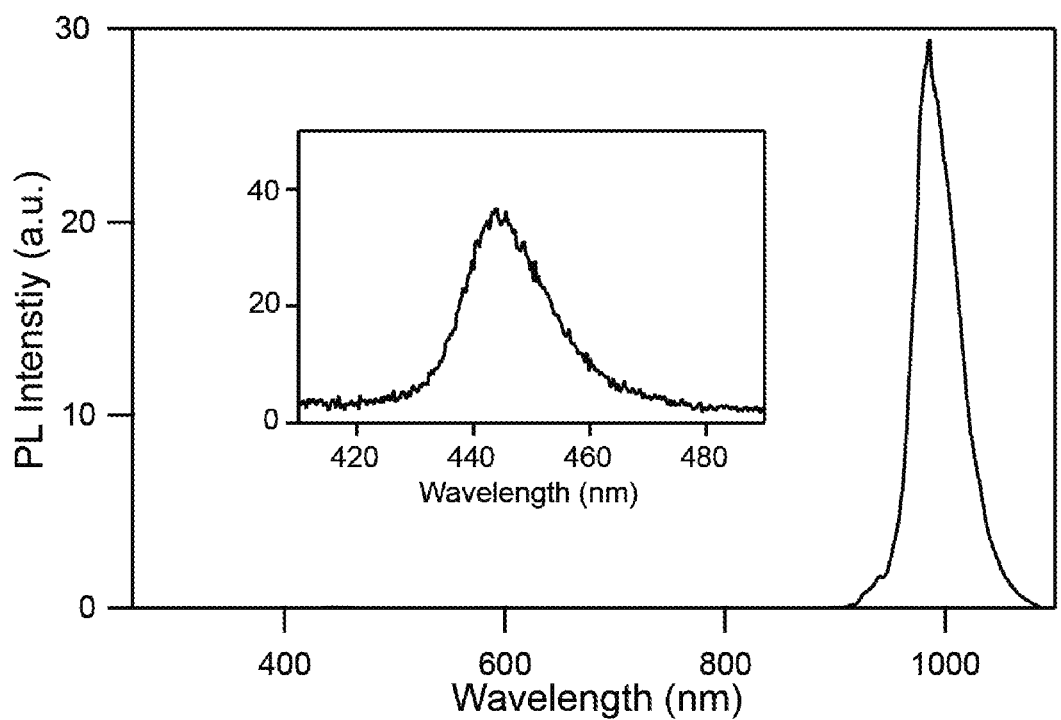
FIG. 30B shows the photoluminescence spectrum of $Yb^{3+}$-doped $CsPb(Cl_{0.6}Br_{0.4})_3$ thin film under 365 nm photoexcitation, in accordance with an embodiment of the disclosure.
Figure 30C:
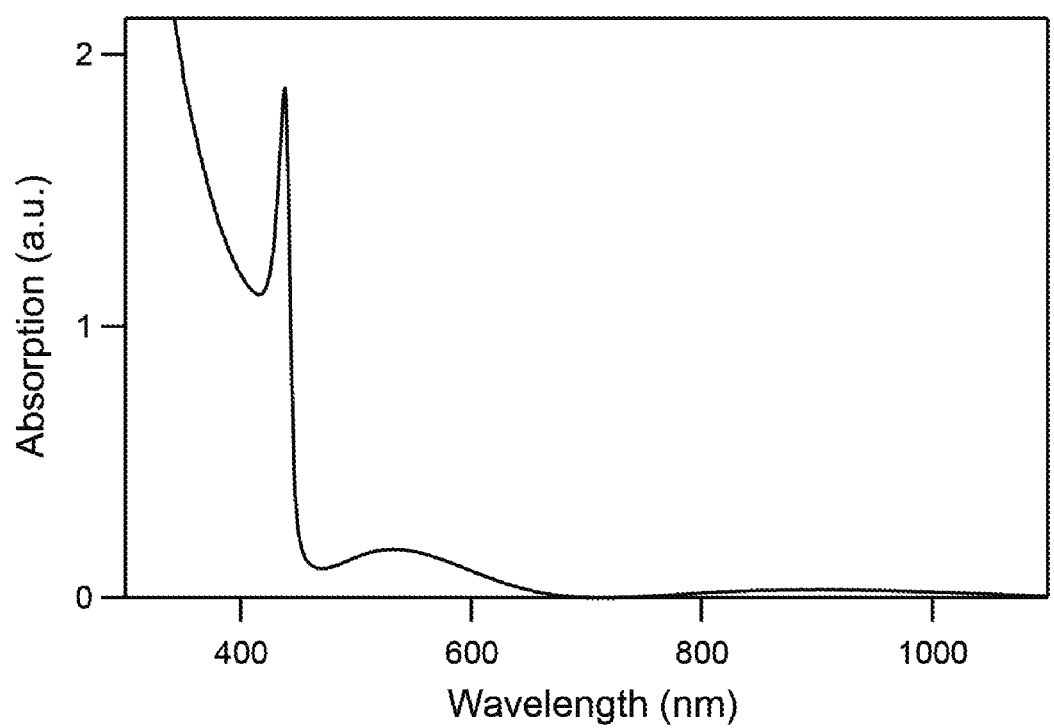
FIG. 30C shows the UV-Vis-NIR absorption spectrum of a $Yb^{3+}$-doped $CsPb(Cl_{0.6}Br_{0.4})_3$ thin film, in accordance with an embodiment of the disclosure.
Figure 31A:
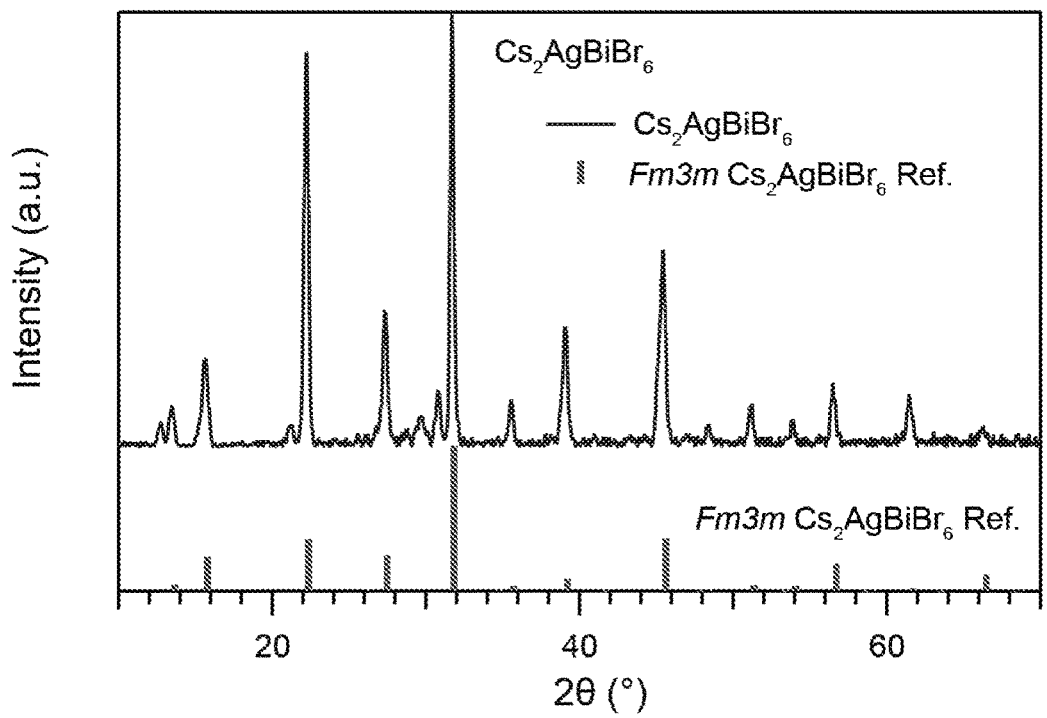
FIG. 31A shows the X-ray diffraction pattern of a $Cs_2AgBiBr_6$ thin film, in accordance with an embodiment of the disclosure.
Figure 31B:
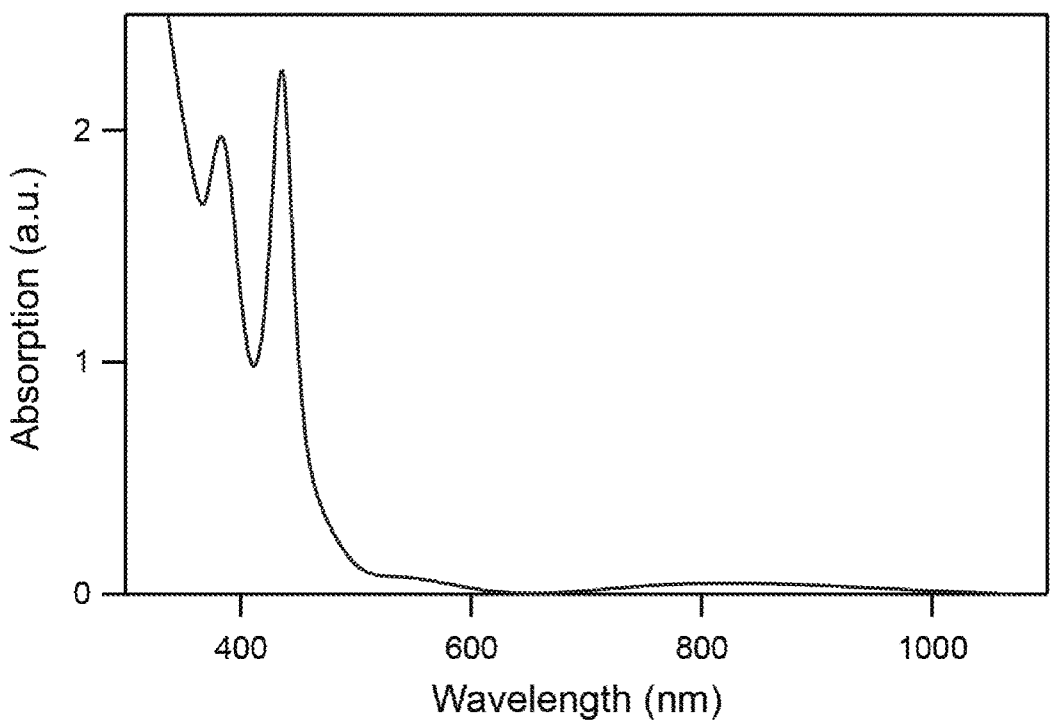
FIG. 31B shows the UV-Vis-NIR absorption spectrum of a $Cs_2AgBiBr_6$ thin film, in accordance with an embodiment of the disclosure.

Mechanochemically synthesized metal-halide powder was loaded into a molybdenum or tantalum evaporation boat suspended between two electrodes inside of a vacuum chamber. Alternatively, a colloid of metal-halide powder was dispersed onto a tantalum foil suspended between two electrodes inside of a vacuum chamber. A substrate, which can be a piece of glass, a solar cell, flexible sheet, etc., was positioned above the heater at distances ranging from 1's to 10's of centimeters. The chamber was evacuated to pressures ranging from 10 to $1\times10^{-4}$ mTorr and a large current is quickly passed through the electrodes, heating the evaporation boat/foil and instantly vaporizing the metal-halide powder. The vaporized material was deposited onto a substrate suspended above the evaporation boat/foil. A schematic of an example thermal evaporation chamber is shown in FIG. 28. X-ray diffraction data and photoluminescence spectra of thermally evaporated $Yb^{3+}:CsPbCl_3$ (FIG. 29) $Yb^{3+}:CsPb(Cl_{0.4}Br_{0.6})_3$ (FIG. 30), and $Cs_2AgBiBr_6$ (FIG. 31) demonstrate that the thermally evaporated films exhibit similar physical and optical properties as their mechanochemically-synthesized counterparts. Corresponding absorption spectra reveal high optical quality of the thermally evaporated films.

Example 14: Deposition of $MAPbI_3$ Film from Powder

A mechanically mixed powder of $MAPbI_3$ (0.030-0.400 g) and 2.5 molar equivalents of MAI was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. Representative X-ray diffraction, photoluminescence, and absorption data of the resulting films are shown in FIG. 43.

Example 15: Deposition of $(FA_{0.85}Cs_{0.15})PbI_3$ Film from Powder

Figure 42:
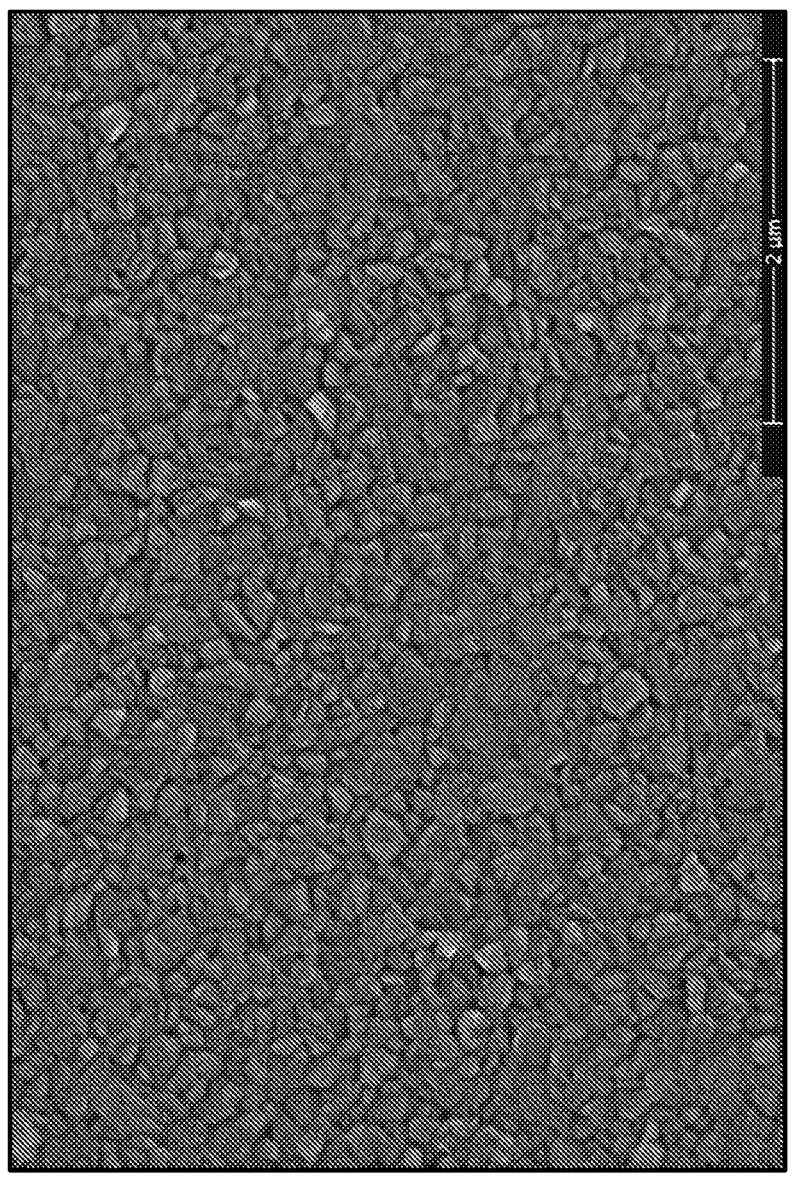
FIG. 42 is a top-down scanning electron microscope image of a $(FA_{0.75}Cs_{0.25})Pb(Br_{0.2}I_{0.8})_3$ film deposited by SSVD onto a flat silicon substrate.

A mechanically mixed powder of $(FA_{0.85}Cs_{0.15})PbI_3$ (0.030-0.400 g) and 2.125 molar equivalents of FAI was loaded into a tantalum or molybdenum thermal evaporation/ sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. Finally, the film was annealed at 170° C. for 10 minutes in a glovebox under a nitrogen atmosphere. Representative X-ray diffraction and absorption data of the resulting films are shown in FIG. 45. A representative scanning electron microscope image is shown in FIG. 42.

Example 16: Deposition of $(FA_{0.75}Cs_{0.25})Pb(Br_{0.2}I_{0.8})_3$ Film from Powder A mechanically mixed powder of $(FA_{0.75}Cs_{0.25})Pb(Br_{0.2}I_{0.8})_3$ (0.030-0.400 g), 1.5 molar equivalents of FAI, and 0.375 molar equivalents of FABr was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. Finally, the film was annealed at 170° C. for 10 minutes in a glovebox under a nitrogen atmosphere. Representative X-ray diffraction, photoluminescence, and absorption data of the resulting films are shown in FIG. 46.

Example 17: Deposition of $(FA_{0.81}MA_{0.14}Cs_{0.05})Pb(Cl_{0.02}Br_{0.14}I_{0.84})_3$ Film from Powder A mechanically mixed powder of $(FA_{0.81}MA_{0.14}Cs_{0.05})Pb(Cl_{0.02}Br_{0.14}I_{0.84})_3$ (0.030-0.400 g), 2.025 molar equivalents of FAI, and 0.35 molar equivalents of MABr was loaded into a tantalum or molybdenum thermal evaporation/ sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. Finally, the film was annealed at 100° C. for 60 minutes in a glovebox under a nitrogen atmosphere. Representative X-ray diffraction, photoluminescence, and absorption data of the resulting films are shown in FIG. 44.

Example 18: Deposition of $CsPbBr_3$ Film from Powder $CsPbBr_3$ (0.030-0.400 g) was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. For a slow evaporation, the evaporation/sublimation boat was resistively heated to obtain deposition rates between 0.05 and 20 Å $s^{-1}$. Finally, the film was annealed at 250° C. for 10 minutes in a glovebox under a nitrogen atmosphere. Representative X-ray diffraction, photoluminescence, and absorption data of the resulting films are shown in FIG. 47.

Example 19: Deposition of $CsPbBr_2I$ Film from Powder $CsPbBr_2I$ (0.030-0.400 g) was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. For a slow evaporation, the evaporation/sublimation boat was resistively heated to obtain deposition rates between 0.05 and 20 Å $s^{-1}$. Finally, the film was annealed at 250° C. for 10 minutes in a glovebox under a nitrogen atmosphere. Representative X-ray diffraction, photoluminescence, and absorption data of the resulting films are shown in FIG. 47.

Example 20: Deposition of $Cs(Pb_{0.9}Sn_{0.1})Br_2I$ Film from Powder $Cs(Pb_{0.9}Sn_{0.1})Br_2I$ (0.030-0.400 g) was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. For a slow evaporation, the evaporation/sublimation boat was resistively heated to obtain deposition rates between 0.05 and 20 Å $s^{-1}$. Finally, the film was annealed at 250° C. for 10 minutes in a glovebox under a nitrogen atmosphere. Representative X-ray diffraction, photoluminescence, and absorption data of the resulting films are shown in FIG. 48.

Example 21: Deposition of $Yb^{3+}:Cs_2AgBiBr_6$ Film from Powder $Yb^{3+}:Cs_2AgBiBr_6$ (0.030-0.400 g) was loaded into a tantalum or molybdenum thermal evaporation/sublimation boat and mounted in a vacuum chamber. Similarly, substrates (glass, silicon, and silicon solar cells) were loaded into the vacuum chamber and suspended 5-20 cm above the evaporation/sublimation boat. The chamber was then sealed and evacuated to pressures between $10^{-2}$ and $10^{-7}$ torr. For a rapid evaporation, the evaporation/sublimation boat was resistively heated over a period of ~1-15 s, causing the powder to vaporize and deposit on the substrates. For a slow evaporation, the evaporation/sublimation boat was resistively heated to obtain deposition rates between 0.05 and 20 Å $s^{-1}$. Finally, the film was annealed at 250° C. for 10 minutes. Representative X-ray diffraction, photoluminescence, and absorption data of the resulting films are shown in FIG. 50.

Example 22: Device Formation and Film Characterization

The example steps involve the optimization of high quality $Yb^{3+}$-doped $CsPbCl_3$ thin film deposition techniques on large area (6 inch×6 inch) substrates. In the present Example, we utilize an ultrasonic spray coater, as well as the FOM R&D sheet coater and Newlong LS 34GX screen printer to enhance uniform ink deposition over a large area and subsequent crystal growth after annealing treatments. Similar material quality characterization techniques can be also employed for the analysis of the films deposited on large substrates. Large area films are tested for solar downconversion by mechanically stacking the substrate/film on top of a commercially available high efficiency crystalline Si solar cell with interdigitated back contacts. To quantify relative downconversion efficiency enhancement, we measure the solar cell power conversion efficiency (PCE) with a stacked downconversion/substrate layer versus the same solar cell with only a stacked blank substrate using a OAI Class AAA solar simulator.

Long-term (weeks to months) stability testing and analysis of the $Yb^{3+}$-doped $CsPbCl_3$ thin films was carried out by monitoring the optical and physical properties of identically prepared films with time for varied storage conditions (ambient versus inert atmosphere; low versus high humidity; dark storage versus light exposure). Select films are encapsulated with polymers used for solar cell module encapsulation, such as ethylene vinyl acetate (EVA), and stability tests on encapsulated films are compared with un-encapsulated films.

To demonstrate the add-on value that these downconversion films provide to post-production solar installations, films are deposited on the outside front glass surface of commercially available Si PV modules, and the PCE of these devices before and after deposition is measured using a SPIRE SPI-SUN 5100SLP Solar Module Flash Tester. Integration of the $Yb^{3+}$-doped $CsPbCl_3$ layer into the device stack can enable improved device performance and long-term material stability. Therefore, we fabricate custom Si PV modules using high efficiency crystalline Si solar cells with interdigitated back contacts, EVA encapsulation layers, and low-iron glass front- and back-sheets. Downconversion layers are deposited on the inside of the glass front-sheet and stacked against an EVA encapsulant layer. Assembled modules are encapsulated and sealed in a vacuum oven. In one example, the PCE of custom Si PV modules is measured with and without integration of $Yb^{3+}$-doped $CsPbCl_3$ solar downconversion layers using the SPIRE SPI-SUN 5100SLP Solar Module Flash Tester for comparison with the modules that have downconversion films deposited on the outside front glass. Long-term and accelerated stability analysis can be carried out on select downconversion PV modules using the TPS Tenney Temperature and Humidity Chamber.

Example 23: Solution Deposition of Polycrystalline Downconversion Thin Films We developed a solution-deposition method to produce thin-films of undoped and $Yb^{3+}$-doped $CsPbCl_3$ under ambient conditions. Due to the poor solubility of $PbCl_2$ and $CsCl$ in common solvents, we employed a two-step deposition protocol, similar to literature reports for $CsPbBr_3$ and $(CH_3NH_3)PbI_3$. Briefly, a $PbCl_2$ layer was deposited from dimethyl sulfoxide (DMSO), followed by a $CsCl$ ($+YbCl_3$) deposition from methanol. The films were subsequently annealed at 250° C. to remove residual solvent and promote crystallization.

Figure 32C:
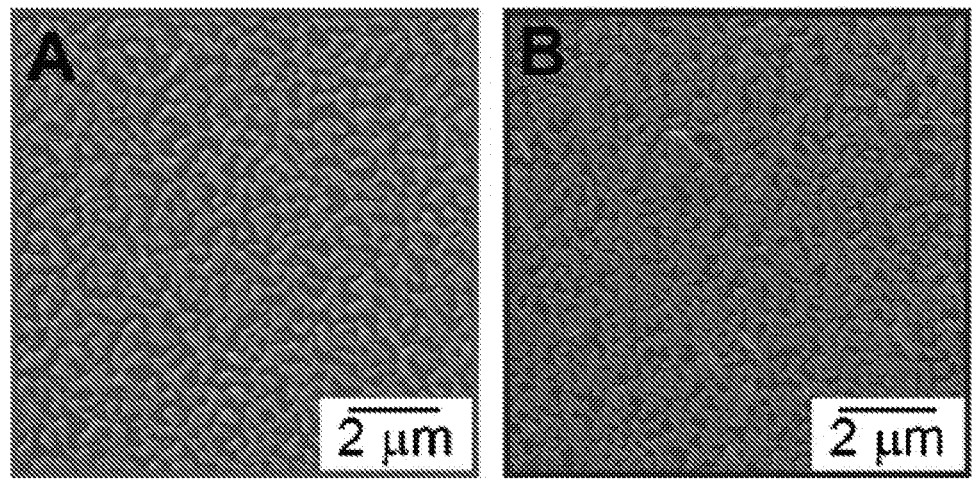
FIG. 32C illustrates X-ray diffraction data of the films of FIG. 32A (solid) and FIG. 32B (dashed)
Figure 32C:
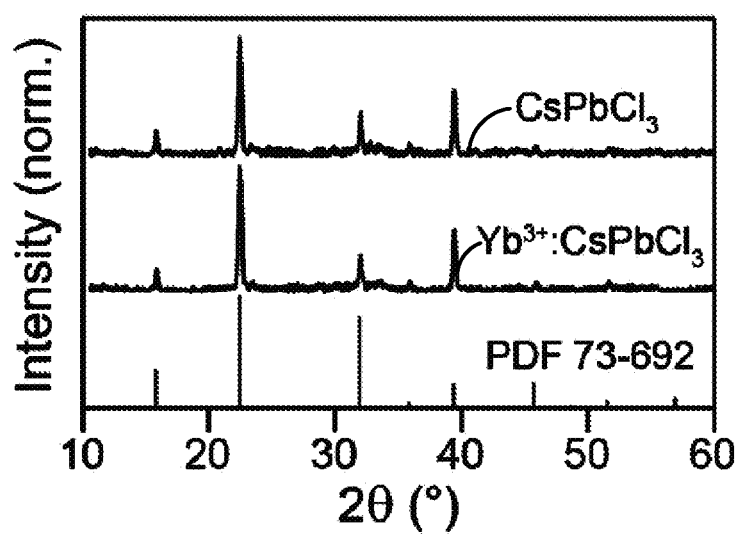
Figure 33A:
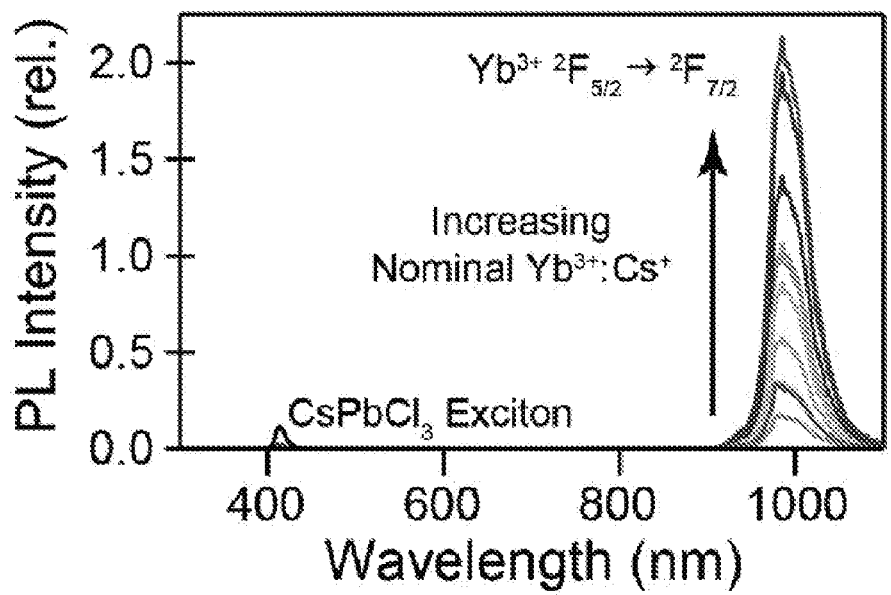
FIG. 33A illustrates photoluminescence spectra of un-doped (solid) and $Yb^{3+}$-doped $CsPbCl_3$ polycrystalline thin films with varying amounts of added $Yb^{3+}$.
Figure 33B:
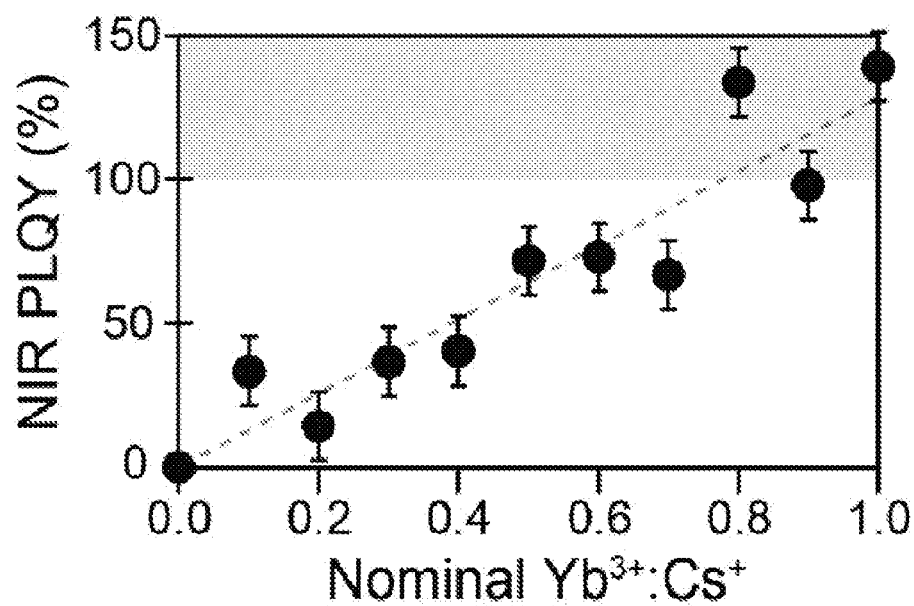
FIG. 33B illustrates near-infrared photoluminescence quantum yield plotted as a function of $[Yb^{3+}]:[Cs^+]$ ratio deposited onto a preformed $PbCl_2$ film.

FIGS. 32A-32C summarize general physical characterization data for un-doped and $Yb^{3+}$-doped $CsPbCl_3$ thin films. Scanning electron microscopy (SEM) images of the un-doped and doped films in FIGS. 32 and 32B, respectively, show that both are composed of microstructured crystalline grains. X-ray diffraction data of the doped and un-doped films in FIG. 32C suggest phase pure $CsPbCl_3$ without evidence of crystalline impurities. FIG. 33A shows representative absorbance and photoluminescence (PL) spectra of un-doped and $Yb^{3+}$-doped $CsPbCl_3$ films, respectively. The un-doped data are consistent with previous measurements of bulk $CsPbCl_3$ prepared using quench deposition, where the emission feature centered near 415 nm corresponds to band-edge PL. The addition of $YbCl_3$ to the precursor solution results in a substantial loss of the band-edge PL and the growth of an intense near-infrared (NIR) PL feature centered around 990 nm, characteristic of the $Yb^{3+}$ $2F_{7/2}$ f-f transitions. These data are similar to what has been reported for $Yb^{3+}$-doped $CsPbCl_3$ NCs, and are consistent with efficient sensitization of $Yb^{3+}$ by the $CsPbCl_3$ semiconductor lattice.

We varied the nominal $[Cs^+]:[Yb^{3+}]$ ratio in the methanol precursor solution to study the effect of increasing $Yb^{3+}$ doping levels on thin-film optical properties, and find an overall trend of increasing NIR PL intensity with increasing $Yb^{3+}$ addition (FIG. 32A). We plot the corresponding $Yb^{3+}$ $2F_{5/2} \rightarrow 2F_{7/2}$ absolute photoluminescence quantum yields (PLQYs) measured using an integrating sphere in FIG. 32B. We note that measured PLQYs exceed 100% for the films having the largest $Yb^{3+}$ addition, reaching upwards of 140%.

The photophysical mechanism of greater-than-unity PLQYs observed for $Yb^{3+}$-doped $CsPbCl_3$ bulk thin films can be understood by invoking a similar mechanism that was proposed for $Yb^{3+}$-doped $CsPbCl_3$ NCs—namely, picosecond quantum cutting. In the NCs, we offer that the introduction of $Yb^{3+}$ into the $CsPbCl_3$ lattice results in a charge-neutral $M^{3+}$-$V_{Pb}$-$M^{3+}$ defect complex—analogous to the charge-compensating "McPherson pair" motif well-established in the $CsCdBr_3$ and related metal-halide lattices. Such a defect rapidly localizes excitation energy on a ps time scale and transfers its energy to the two adjacent $Yb^{3+}$ ions in a single concerted step. Given the spectroscopic similarities, a similar phenomenon is at play in the bulk crystalline form.

Example 24: Solvent-Free Conformal Vapor Deposition of Complex Metal-Halide Semiconductors: Quantum-Cutting $Yb^{3+}$:$CsPb(Cl_{1-x}Br_x)_3$ And Photovoltaic Absorber $Fa_{0.81}MA_{0.14}Cs_{0.05})Pb(Cl_{0.2}Br_{0.14}I_{0.84})_3$ Perovskites Metal-halide semiconductors, specifically the family of lead-halide perovskites, exhibit attractive properties for a host of applications, including photovoltaics, solid-state lighting, and photodetection. While most research and development has involved solution-phase preparation of these materials, such deposition methods can introduce both processing and technical challenges owing to differential solubilities and scalability, limiting optoelectronic applications. In the present Example, we demonstrate a simple, inexpensive, and scalable single-source vapor deposition (SSVD) method for depositing high-quality conformal thin films of complex metal-halide perovskites, including doped perovskites, over large areas. These results demonstrate a promising and industrially attractive approach to high-throughput vapor processing of metal-halide perovskite and coatings for photonic or optoelectronic applications.

Metal-halide perovskites have optoelectronic properties that make them highly attractive for numerous applications including photovoltaics, photodetectors, and light-emitting devices. These are readily prepared from solvated precursor reagents, allowing solution growth of bulk crystals, hot-injection and heat-up syntheses of colloidal nanocrystals, and printing of ionic "inks". The current highest performing perovskite thin-film photovoltaics have been prepared from solution, but there are particular attractive designs for which solution-based processing may impose limitations. For example, solution deposition of multi-layered monolithic devices necessitates the use of orthogonal solvents to ensure that underlying layers (such as organic electrodes, other metal-halide films, flexible polymer substrates, etc.) are undamaged. In addition, common solution methods cannot conformally coat substrates with irregular topographies, which significantly limits perovskite-on-silicon tandem photovoltaics, where the ideal silicon cell is textured to boost its near-infrared response. Finally, although ionic precursors such as $PbI_2$, FAI, and MAI (FA=formamidinium; MA=methylammonium) used for making low-bandgap hybrid perovskites are readily soluble in common solvents, other metal-halide salts (e.g. CsI, TlI, AgI) are poorly soluble, limiting the scope of accessible compositions, thickness, and morphology. Vapor-based deposition of metal halide perovskites overcomes many of these shortcomings by enabling conformal coating, eliminating solubility problems, and permitting the deposition of high optical quality films onto arbitrary substrates. In addition, vapor deposition is already widely used in the optoelectronics industry, making it the lowest risk choice for incorporation into existing manufacturing. However, to date, vapor deposition of metal halide perovskites has not been able to access the full compositional space currently available to solution-processed metal halide perovskites, including doped metal-halide perovskites. To obviate the shortcomings of both solution and vapor processing for metal-halide perovskites, we present single-source vapor deposition (SSVD) as a general, scalable, and solvent-free method that excels at large-area conformal deposition of thin films, using mechanochemically synthesized complex lead-halide perovskites and significantly expanding the materials available for vapor deposition. As case studies, we demonstrate deposition of two complex perovskites: quantum-cutting $Yb^{3+}$:$CsPb(Cl_{1-x}Br_x)_3$, which shows near-infrared photoluminescence quantum yields (PLQYs) approaching 200% that make it particularly attractive for solar spectral downconversion, and $(FA_{0.81}MA_{0.14}Cs_{0.05})Pb(Cl_{0.02}Br_{0.14}I_{0.84})_3$ "triple-cation" perovskites, an absorber layer in state-of-the-art photovoltaic cells with outstanding device performance and stability. We show that the complex perovskites can be prepared with high optical quality, stoichiometric fidelity, and optically active defects over large substrate areas.

Existing metal-halide perovskite thermal vapor deposition methods differ in both the composition of the perovskite precursor, the speed of deposition, and the available materials for deposition. The most common approach is multi-source co-evaporation, which controls film stoichiometry and thickness by tuning the deposition rate of each individual precursor source (e.g. $PbI_2$ and MAI). Typically, the vapor deposition rates occur at ~1 Ås$^{-1}$. However, multi-source co-evaporation is time consuming and technically challenging because it requires frequent optimization of deposition conditions, and a large excess of organoammonium ions due to their low sticking coefficients and decomposition temperatures, resulting in deviations from the desired film stoichiometry. A second general vapor deposition approach is single-source evaporation, which uses a solid state form of the desired film (typically powder) and deposits thin films with deposition rates that may exceed 1000 Ås$^{-1}$. The most straightforward single-source evaporation technique is single-source thermal ablation (SSTA), in which single-source precursors are rapidly to drive film deposition. This approach has been used to create 2D perovskite LEDs and to deposit films of $MAPbI_3$, $MASnI_3$, and $MASnBr_3$ perovskites for device and spectroscopic characterization. Between these two general approaches, the broad category of single source flash evaporation is simpler and enables higher throughput deposition of perovskite films than multi-source co-evaporation. However, single-source deposition has not demonstrated conformal coating. Moreover, it is not clear if either of these methodologies can be used to deposit heavily alloyed metal-halide perovskite films over large areas and on textured substrates. Our SSVD deposition method differs by enabling conformal coating, allowing vapor-phase doping, and significantly expanding the rate of film deposition between 0.05 and >1000 Å s$^{-1}$.

Figure 34:
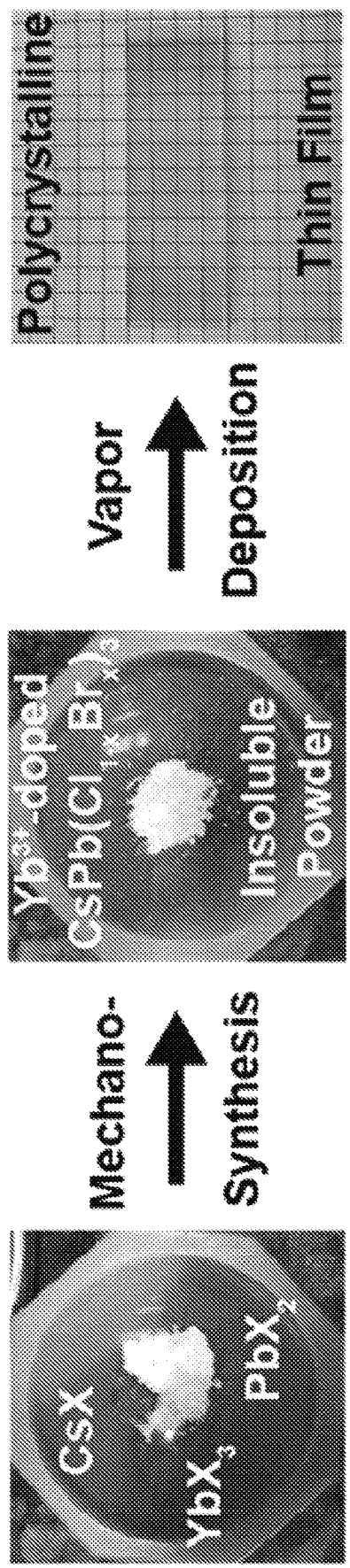
FIG. 34 schematically illustrates processing of complex perovskite films, in accordance with an embodiment of the disclosure.

We prepared compositionally complex lead-halide perovskites via mechanochemical syntheses with a planetary ball mill to form powders with predictable and controlled stoichiometries in near-quantitative yield. Powders of $Yb^{3+}$:$CsPbCl_3$ and $Yb^{3+}$:$CsPb(Cl_{0.5}Br_{0.5})_3$ were prepared by grinding stoichiometric amounts of metal-halide precursors. For $Yb^{3+}$:$CsPb(Cl_{0.5}Br_{0.5})_3$, the colorless CsX, $PbX_2$, and $YbX_3$ (X=Cl, Br) powders form a bright yellow powder when ground together in air (FIG. 34), reflecting conversion to the desired perovskite phase. These ground powders were then used for SSVD as illustrated schematically in FIG. 28A.

FIG. 35 shows X-ray diffraction (XRD) patterns collected for the $Yb^{3+}$:$CsPbCl_3$ and $Yb^{3+}$:$CsPb(Cl_{0.5}Br_{0.5})_3$ precursor powders. Both perovskites are consistent with their orthorhombic (room-temperature) polymorphs, with the Bragg reflections of $Yb^{3+}$:$CsPb(Cl_{0.5}Br_{0.5})_3$ occurring at angles intermediate between those of $CsPbCl_3$ and $CsPbBr_3$ parent materials, as expected for a halide alloy. The powders exhibited intense near-infrared photoluminescence (PL) at ca. 985 nm characteristic of $Yb^{3+}2F_{5/2} \rightarrow 2F_{7/2}$ f-f transitions (FIGS. 25B and 26B, respectively). Very weak exciton emission is also observed from both doped powders. These results demonstrate successful synthesis of phase-pure $Yb^{3+}$:$CsPbCl_3$ and $Yb^{3+}$:$CsPb(Cl_{0.5}Br_{0.5})_3$ powders by simple mechanochemical synthesis. We note that manual grinding using a mortar and pestle also yields the desired perovskites, but with substantial impurities (Figure Si).

Figure 28A:
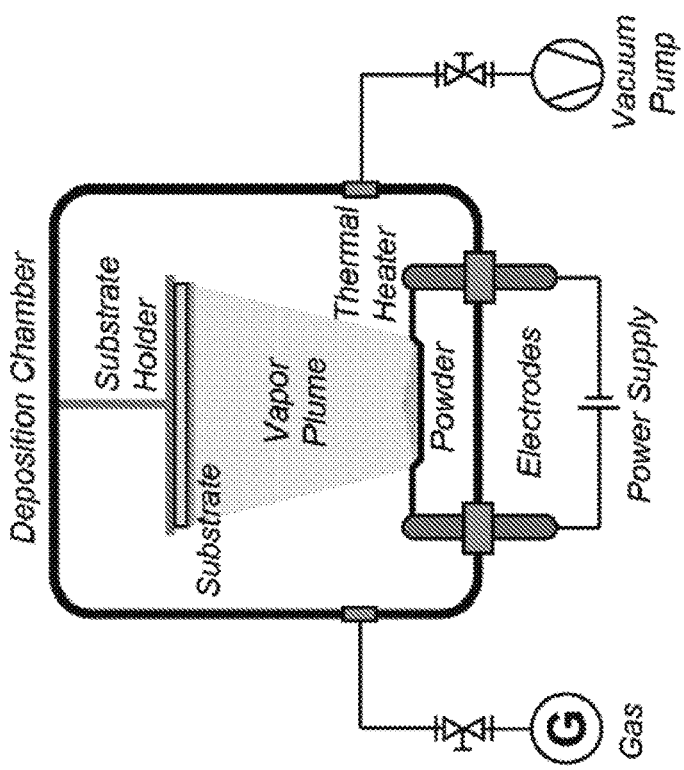
Figure 28C:
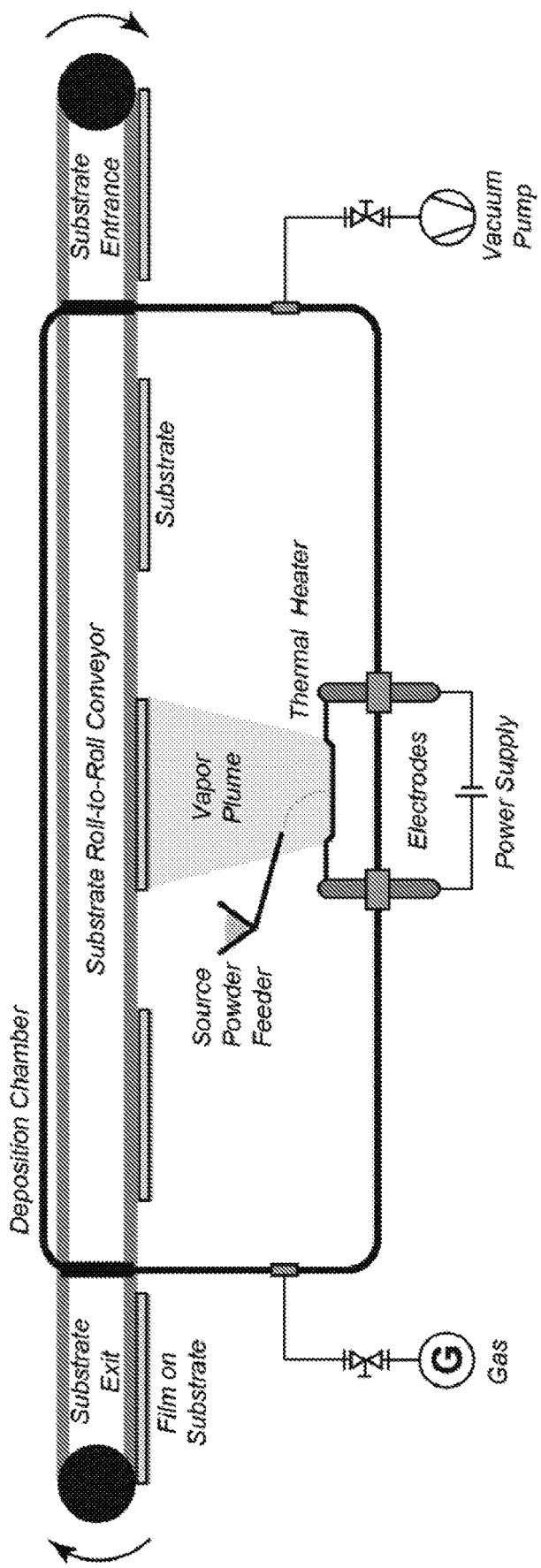
Figure 35A:
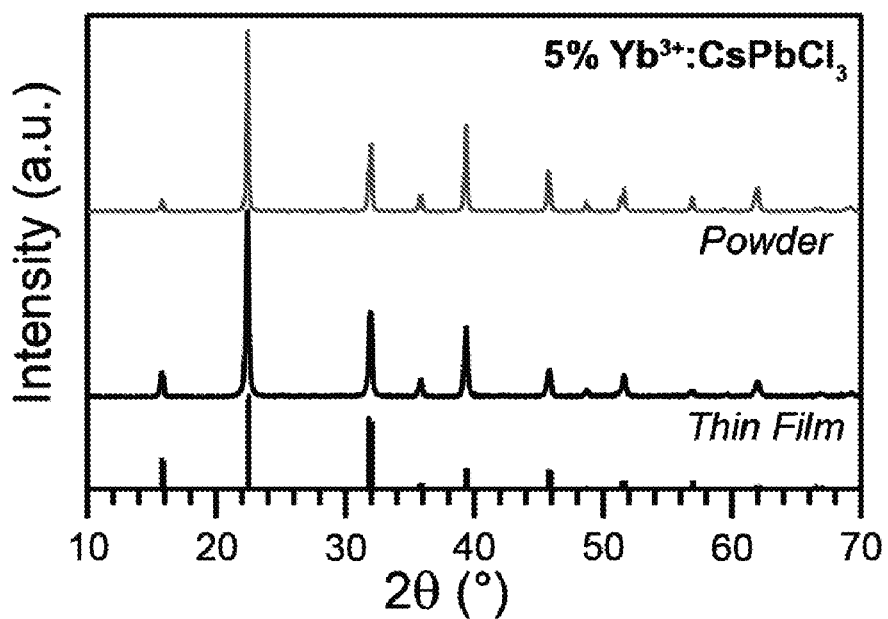
FIG. 35A-35D: XRD patterns for (A) $Yb^{3+}$:$CsPbCl_3$ powder (gray) and thin film (black) and (B) $Yb^{3+}$:$CsPb(Cl_{0.5}Br_{0.5})_3$ powder (gray) and thin film (black). Reference indices are shown for Pnma $CsPbCl_3$ and Pnma $CsPbBr_3$ (gray). Absorption (black) and PL (gray, low-fluence 375 nm photoexcitation) spectra for (C) a $Yb^{3+}$:$CsPbCl_3$ film and (D) a $Yb^{3+}$:$CsPb(Cl_{0.5}Br_{0.5})_3$ film deposited by single-source vapor deposition (SSVD) onto cleaned glass slides. The panel insets magnify the excitonic PL of the powders. All data were collected at room temperature.
Figure 35B:
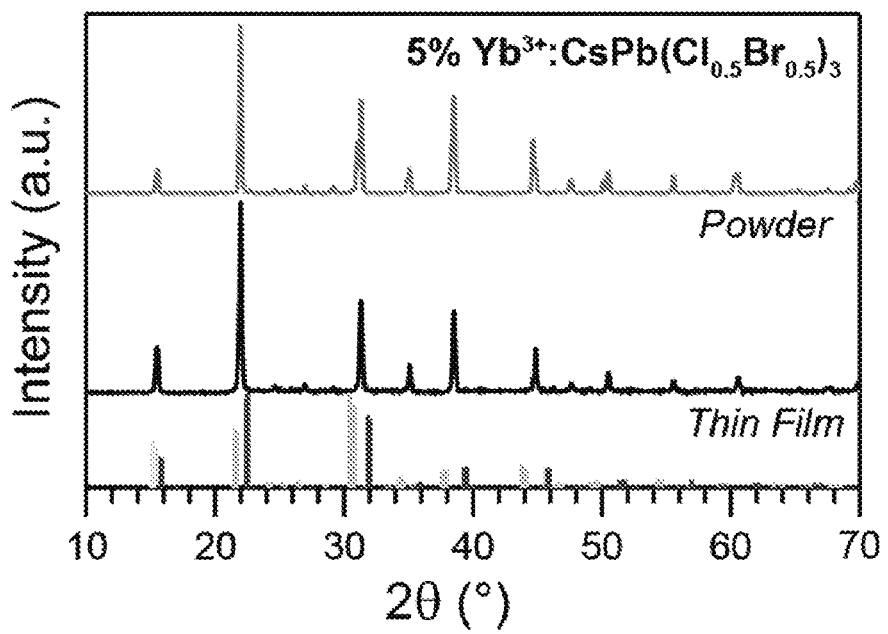
Figure 39:
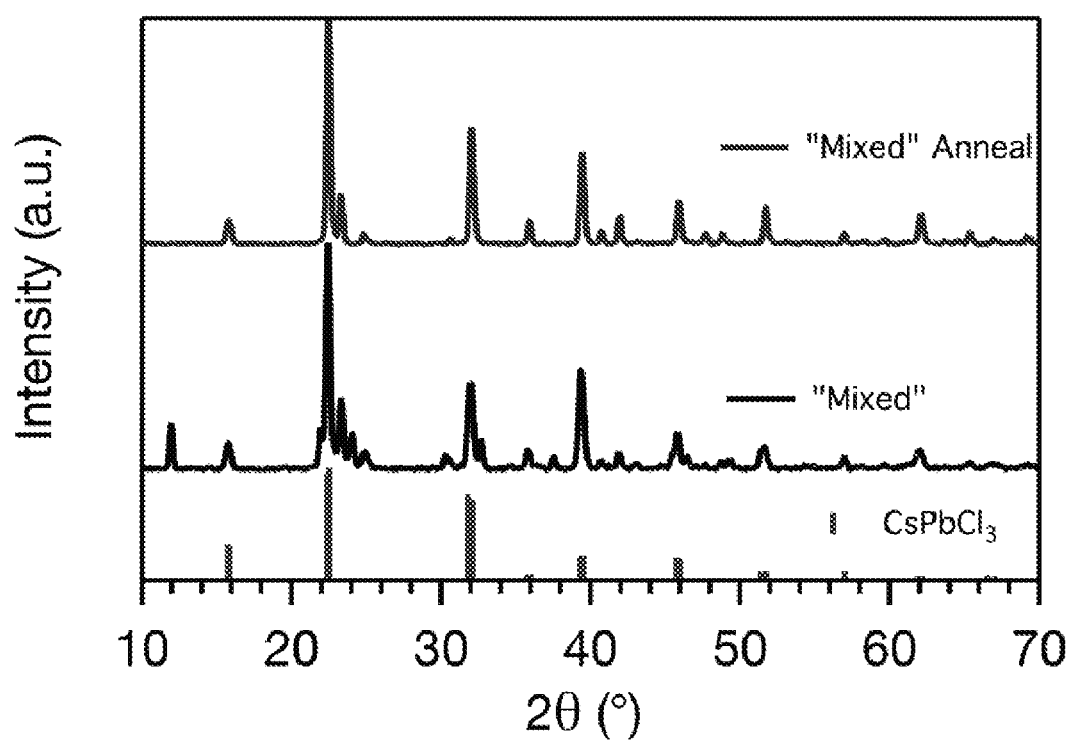
FIG. 39: XRD patterns of thin films produced by thermal evaporation of stoichiometrically mixed CsCl, $PbCl_2$, and $YbCl_3$ before (bottom) and after (top) annealing for 10 minutes in air. While some off-stoichiometry phases disappear after annealing, others remain, indicating the need for a single-source precursor.

These doped-perovskite powders were then used as precursor materials for SSVD of $Yb^{3+}$:$CsPbCl_3$ and $Yb^{3+}$:$CsPb(Cl_{0.5}Br_{0.5})_3$ thin films on glass substrates (FIG. 28A). A full description of the SSVD process is provided in the Experimental Details below. Briefly, mechanochemically synthesized single-source perovskite powders were loaded into a thermal evaporation source located inside of a vacuum chamber, which was evacuated to pressures between $10^{-2}$ and $10^{-6}$ torr. The single source precursor was heated causing it to sublime at rates between ~0.05 Å s$^{-1}$ and ~1000 Å s$^{-1}$, effectively spanning the region from slow to rapid evaporation, and condense on a substrate suspended 5-20 cm above the source. For comparison with the powder data, FIGS. 35A and 35B presents XRD data for films of $Yb^{3+}$:$CsPbCl_3$ and $Yb^{3+}$:$CsPb(Cl_{0.5}Br_{0.5})_3$ deposited by SSVD and annealed under ambient atmosphere at 250° C. for 10 min. The XRD patterns of the thin films are nearly identical to those of their powder counterparts, demonstrating conservation of the composition and crystalline phase of the original source materials. Energy-dispersive X-ray spectroscopy shows that the thin films contain almost the same concentrations of $Yb^{3+}$ (4.7%) as the single-source precursor (5.0%). Despite the differences in the melting points of $PbCl_2$, CsCl, and $YbCl_3$ (501, 645, and 704° C., respectively), which imply a low vapor pressure of $Yb^{3+}$ relative to the other constituents at the same temperature, these results demonstrate that SSVD can successfully transform powders with complex compositions into films with almost identical compositions. Notably, the films contain no undesired phases, underscoring the high fidelity of the SSVD process. For comparison, SSVD of a stoichiometric mixture of CsCl, $PbCl_2$, and $YbCl_3$ combined without grinding also forms $Yb^{3+}$:$CsPbCl_3$ showing efficient $Yb^{3+}$ sensitization, but XRD (FIG. 39) reveals substantial $Cs_4PbCl_6$ impurities. Similarly, solution deposition of $Yb^{3+}$:$CsPb(Cl_{1-x}Br_x)_3$ thin films was frustrated by poor precursor solubility, and a large excess of $YbX_3$ was required to achieve sufficient doping. These solubility limitations yielded undesired crystalline impurities in that they decreased the atom economy and reduced the optical quality substantially.

Figure 35C:
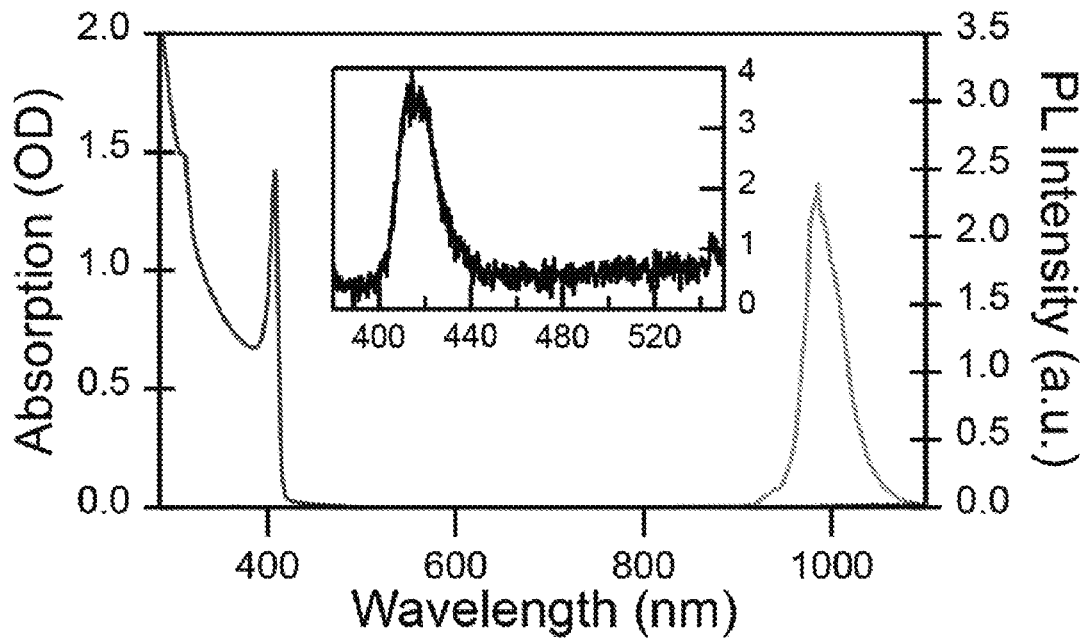
Figure 35D:
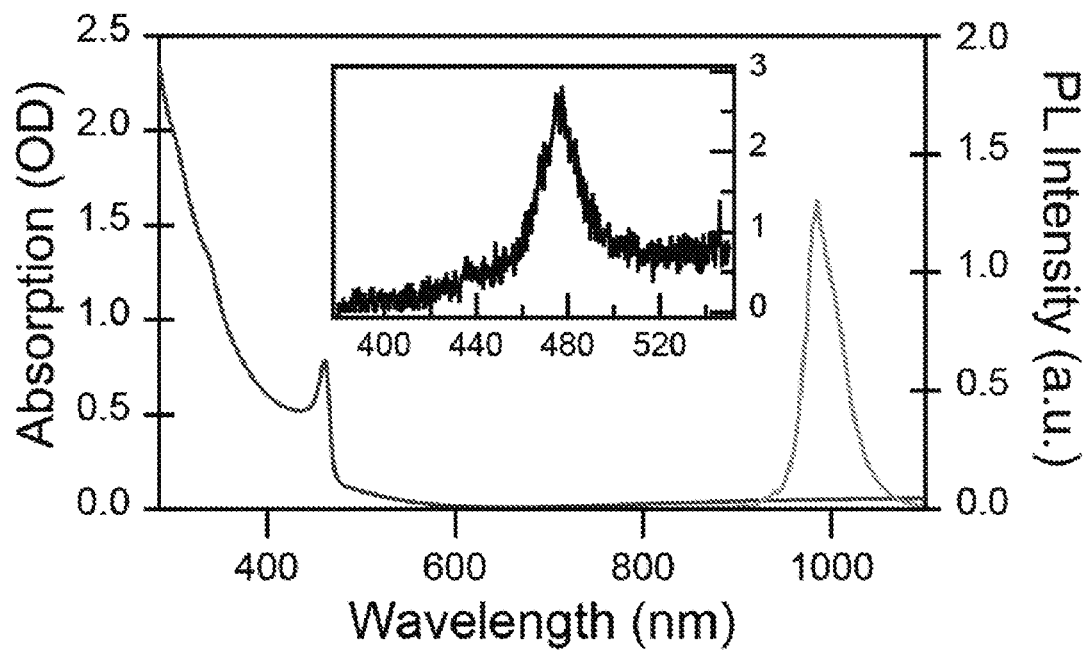

FIGS. 35C and 35D shows absorption and PL data collected for the $Yb^{3+}$:$CsPbCl_3$ and $Yb^{3+}$:$CsPb(Cl_{0.5}Br_{0.5})_3$ films of FIGS. 35A and 35B. As expected, the mixed Cl$^-$/Br$^-$ perovskite film exhibits a lower bandgap and PL energies compared to the Cl perovskite film. Like their source powders, both films show intense Yb near-infrared emission centered at 985 nm and extremely weak excitonic emission. Remarkably, SSVD $Yb^{3+}$:$CsPbCl_3$ and $Yb^{3+}$:$CsPb(C_{0.5}Br_{0.5})_3$ thin films show PLQYs of up to 183%, comparable to the previously investigated best-performing materials. Overall, the PL characteristics of these SSVD films are almost identical to those of quantum-cutting $Yb^{3+}$:$CsPb(Cl_{1-x}Br_x)_3$ nanocrystals and polycrystalline films prepared from solution. Previously, transient-absorption measurements of $Yb^{3+}$:$CsPb(Cl_{1-x}Br_x)_3$ nanocrystals and solution-processed thin films demonstrated that quantum cutting occurs within a few picoseconds, significantly faster than the nanosecond $CsPb(Cl_{1-x}Br_x)_3$ exciton recombination. The observation of highly efficient quantum cutting in thin films made by SSVD indicates that this deposition method does not introduce competing recombination channels or otherwise interfere with the quantum-cutting function of these materials. Moreover, the SSVD films show markedly reduced sub-bandgap photon scattering relative to films prepared from solution, and scattering is minimal even at significant (>2) optical densities. This combination of minimal sub-bandgap scattering and high optical density is critical for applications such as solar quantum cutting, tandem photovoltaics, light-emitting diodes, etc. Collectively, these results demonstrate that quantum-cutting metal-halide perovskite films prepared by SSVD without the use of solvents show equal or superior optical and photophysical qualities compared to their solution-processed counterparts.

Figure 36A:
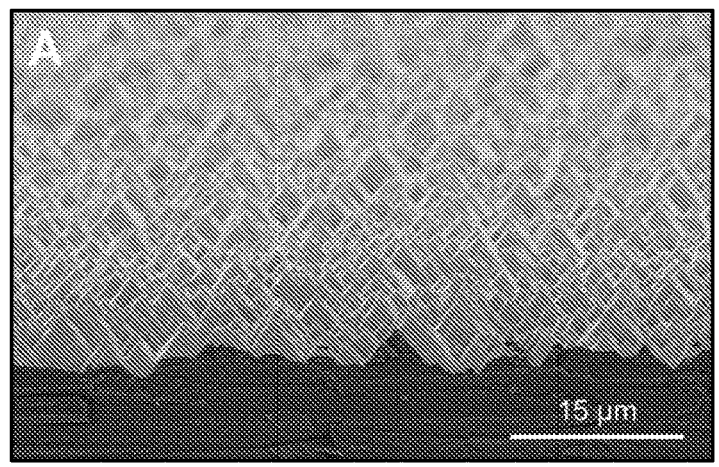
FIGS. 36A-36C: Cross-sectional scanning electron microscope images of an $Yb^{3+}$:$CsPbCl_3$ film deposited by SSVD of a single-source powder onto a textured silicon solar cell. (A) Low-, (B) intermediate-, and (C) high-magnification images show that the perovskite coating is continuous and conformal across the textured substrate, including in the highly confined regions between textured silicon pyramids.
Figure 36B:
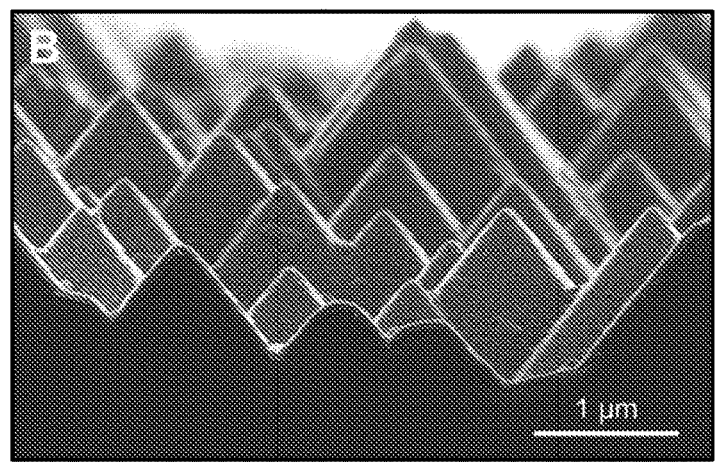
Figure 36C:
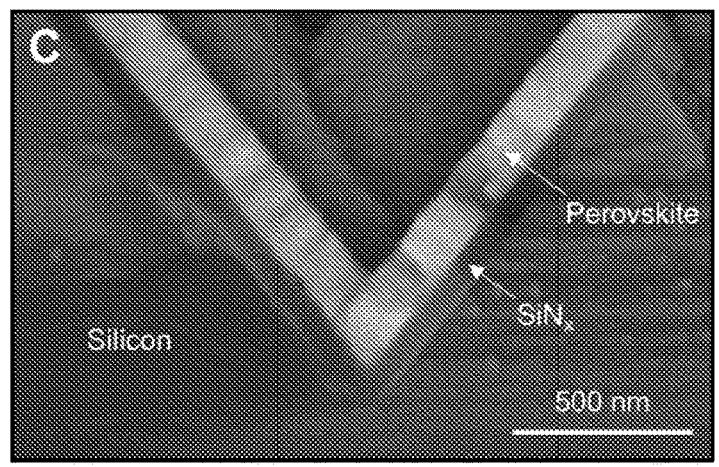

Tunable film thicknesses from ca. 50 to 1000 nm and areal coverage from 4 to 230 cm$^2$ were achieved by controlling the amount of single-source precursor and the distance between the substrate and the evaporation boat. Successful deposition onto a variety of substrates was also achieved. For example, FIG. 3 shows cross-sectional scanning electron microscope (SEM) images of a 130 nm Yb$^{3+}$:CsPbCl$_3$ film deposited onto an etched Si substrate via SSVD. Notably, FIG. 36 shows that the perovskite layer coats the textured silicon surface evenly, including in sub-micron features such as highly confined corners and at the sharp pyramid tops. These conformal perovskite coatings contrast those produced from solution, which are thick in the troughs and thin at the peaks due to solvent pooling and non-uniform evaporation. Conformal deposition of perovskite thin films onto textured surfaces is critical for production of high-quality quantum-cutting and tandem photovoltaic devices. This demonstration of conformal perovskite coatings by SSVD highlights the attractive technological potential of this method.

Figure 37A:
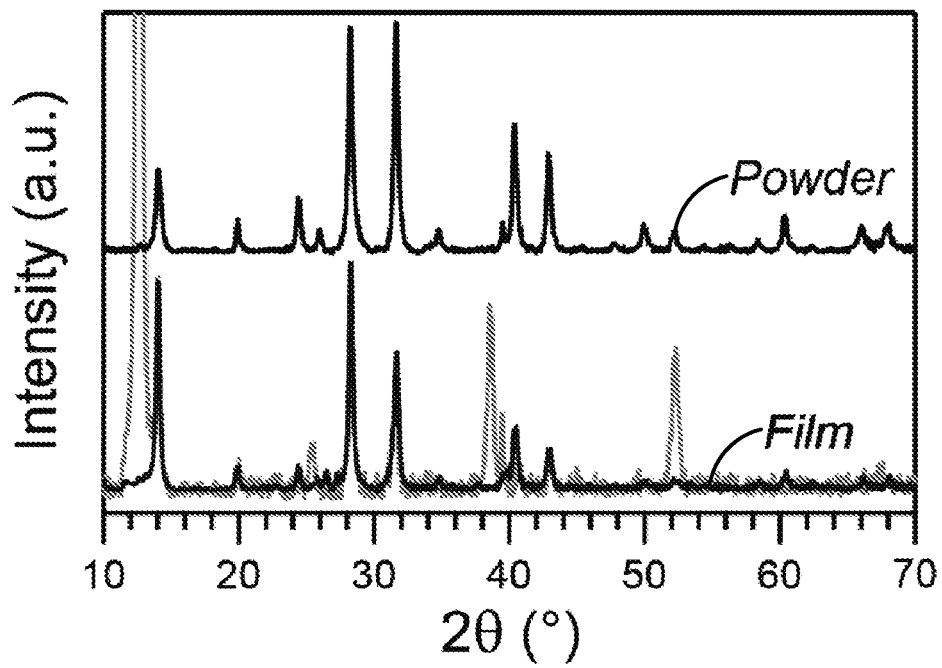
FIG. 37A: XRD data from $(FA_{0.81}MA_{0.14}Cs_{0.05})Pb(Cl_{0.02}Br_{0.14}I_{0.84})_3$ powder (black), a film deposited by SSVD of the triple-cation/triple-anion powder (grey), and a film deposited by SSVD of the powder with additional FAI and MABr (gray)
Figure 37B:
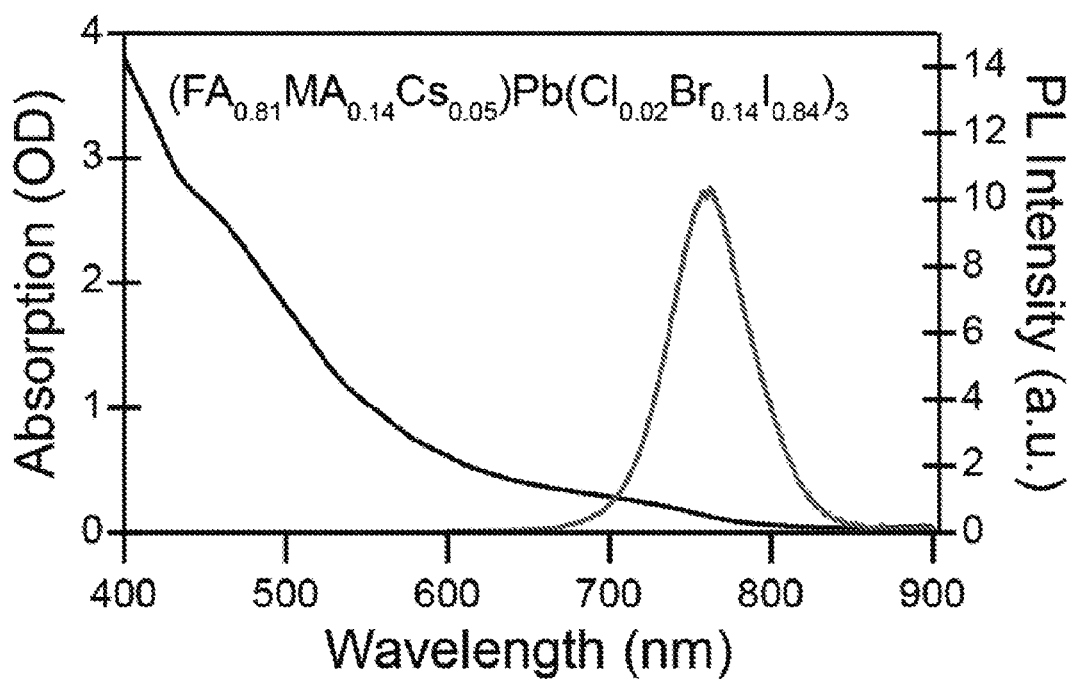
FIG. 37B: Absorption (black) and PL (gray, low-fluence 375 nm photoexcitation) spectra of a $(FA_{0.81}MA_{0.14}Cs_{0.05})Pb(Cl_{0.02}Br_{0.14}I_{0.84})_3$ film deposited by SSVD. All data were collected at room temperature.
Figure 38:
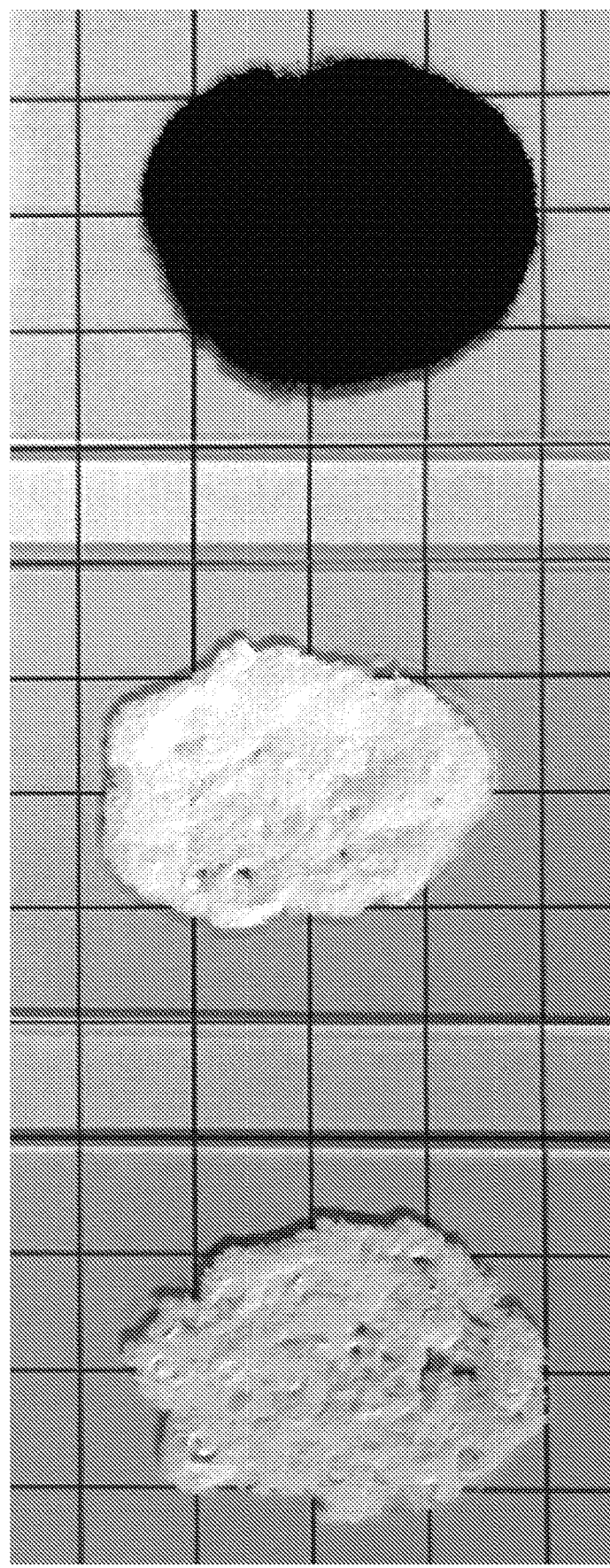
FIG. 38: Images of mechanochemically prepared perovskite powders. From left to right, $Yb^{3+}$-doped $CsPbCl_3$, $Yb^{3+}$-doped $CsPb(Cl_{0.5}Br_{0.5})_3$, and $(FA_{0.81}MA_{0.14}Cs_{0.05})Pb(Cl_{0.02}Br_{0.14}I_{0.84})_3$.

To explore the breadth of the combined mechanochemical synthesis and SSVD vapor-deposition approach, we attempted to prepare thin films of the complex hybrid perovskite (FA$_{0.81}$MA$_{0.14}$Cs$_{0.05}$)Pb(Cl$_{0.02}$Br$_{0.14}$I$_{0.34}$)$_3$ by the same methods. "Triple-cation" perovskite absorbers of this type have enabled state-of-the-art photovoltaic cells with better device performance and enhanced stability compared to perovskites with less-complex compositions. Likewise, Cl$^-$ incorporation in such triple-cation perovskites improves cell performance via higher open-circuit voltages, reduced carrier recombination, and longer carrier lifetimes, but is challenging with solution processing due to poor Cl precursor solubilities. In the present work, low-bandgap triple-cation/triple-anion perovskite powder was first prepared mechanochemically by grinding CsCl, MABr, FAI, PbBr$_2$, and PbI$_2$ precursors at the desired stoichiometry to form a fine black powder (details in Experimental Details below). FIG. 37A shows XRD patterns of the triple-cation/triple-anion perovskite powder, demonstrating successful mechanochemical synthesis of phase-pure perovskite, with peak positions consistent with the nominal (FA$_{0.81}$MA$_{0.14}$Cs$_{0.05}$)Pb(Cl$_{0.02}$Br$_{0.14}$I$_{0.84}$)$_3$ composition. FIG. 37A also presents XRD data collected from an SSVD film made from this source powder. These data index primarily to PbI$_2$, which likely forms because of poor incorporation of the ammonium halides into the film, possibly due to their thermal decomposition. To address this deficiency, additional equivalents of FAI and MABr were added to the source powder. Films deposited from this source powder exhibit similar reflections to the initial perovskite powder (FIG. 37A). Absorption and PL spectra of a representative film are shown in FIG. 37B and are consistent with those reported for solution-processed triple-cation films. This represents the first example of highly alloyed metal-halide perovskite thin films deposited using SSVD, and highlights the ability to prepare complex perovskite compositions.

Overall, SSVD of metal-halide perovskites from mechanochemically synthesized single-source powders is an effective route to prepare high-quality materials with complex compositions attractive for next-generation solar technologies, including quantum-cutting spectral downconversion and single- or multi-junction photovoltaics. The ability to introduce dopants and to tune the halide composition, the A-site cation composition, and the B-site cation composition demonstrates that SSVD can access a very wide composition space and opens the door to simple, high-throughput, and large-area deposition of metal-halide semiconductors for optoelectronics. The successful deposition of complex perovskites as thin films with high compositional fidelity suggests that SSVD from single-source precursors may be generally applicable to a multitude of related complex systems extending well beyond the 3D metal-halide perovskites. The simplicity of combining mechanochemistry with SSVD truly facilitates development and application of new materials without the hindrances of precursor solubility, solvent compatibility, or solvent-pooling effects. Furthermore, because mechanochemistry and SSVD are both industrially mature, low-cost, high-throughput, and scalable methods compatible with existing optoelectronic production strategies, the methodology demonstrated here appears extremely bright for future commercial production of metal-halide semiconductors for quantum-cutting, tandem photovoltaics, and other advanced optoelectronic technologies.

EXPERIMENTAL DETAILS

General Remarks:

All materials were used as received unless otherwise specified. All procedures were carried out under ambient conditions unless otherwise noted.

Materials:

Cesium chloride (CsCl; 99.999%), cesium bromide (CsBr; 99.999%), lead(II) chloride (PbCl$_2$; 99.999%), lead (II) bromide (PbBr$_2$; 99.998%), lead(II) iodide (PbI$_2$; 99.9985%), and ytterbium(III) bromide hydrate (YbBr$_3$ xH$_2$O; 99.99%) were purchased from Alfa Aesar. Ytterbium (III) chloride hexahydrate (YbCl$_3$·6H$_2$O; 99.9%) was purchased from Strem Chemicals. Toluene was sourced from Fischer Scientific. Methylammonium bromide (MABr) and formamidinium bromide (FAI) were purchased from GreatCell Solar.

5% Yb$^{3+}$-Doped CsPbCl$_3$ Powder Preparation (5 Mmol Scale)

CsCl (0.842 g), PbCl$_2$ (1.321 g), and YbCl$_3$xH$_2$O (0.097 g) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L) and ground for 9 hr at 500-700 RPM. Every hour, rotation was paused for 30 min to allow the vessel to cool and the milling rotational direction reversed. Optionally, the powder could be prepared via "wet grinding", in which ~25 mL of toluene was added to the ionic precursor charge. Wet grinding can achieve finer particle sizes compared to dry grinding if desired. Upon completion of the grinding, toluene can be recovered by vacuum evaporation and recycled. Both methods yield the same results. In both cases, the resulting white powder was stored under dry conditions in the dark.

5% Yb$^{3+}$-Doped CsPb(Cl$_{0.5}$Br$_{0.53}$ Powder Preparation (5 Mmol Scale)

The same methods as described above were used, except the precursor mixture now included CsCl (0.421 g), CsBr (0.532 g), PbCl$_2$ (0.661 g), PbBr$_2$ (0.8716 g), YbCl$_3$xH$_2$O (0.048 g), and YbBr$_3$xH$_2$O (0.065 g). The resulting bright yellow powder was stored under dry conditions in the dark.

[FA$_{0.81}$MA$_{0.14}$Cs$_{0.05}$)Pb(Cl$_{0.02}$Br$_{0.14}$I$_{0.84}$)$_3$ Powder Preparation (4.16 Mmol Scale)

In a nitrogen-filled glovebox, CsCl (0.032 g; 0.190 mmol), MABr (0.064 g; 0.571 mmol), FAI (0.584 g; 3.396 mmol), PbBr$_2$ (0.220 g; 0.599 mmol), and PbI$_2$ (1.644 g; 3.566 mmol) were loaded into a 50 mL yttria-stabilized zirconia grinding jar charged with ~80 g of 3-5 mm yttria-stabilized zirconia grinding balls. The sealed grinding jars were loaded into a planetary ball mill (MSE Supplies; PMGB-0.2L) and ground for 2 hours at 500 RPM. The resulting black powder was unloaded and stored in a dry nitrogen-filled glovebox in the dark.

(FA$_{0.81}$MA$_{0.14}$Cs$_{0.05}$)Pb(Cl$_{0.02}$Br$_{0.14}$I$_{0.84}$)$_3$+Excess FAI/MABr Powder Preparation In a nitrogen-filled glovebox, the as-prepared (FA$_{0.81}$MA$_{0.14}$Cs$_{0.05}$)Pb(Cl$_{0.02}$Br$_{0.14}$I$_{0.84}$)$_3$ powder (0.100 g; 0.164 mmol) was mixed with FAI (0.034 g; 0.200 mmol) and MABr (~0.004 g; 0.034 mmol) such that the final (FA+MA):Pb stoichiometric ratio of the mixed powder was ~2.4:1. The resulting black powder was stored in a dry nitrogen-filled glovebox in the dark.

Single-Source Vapor Deposition (SSVD) Thin-Film Deposition:

SSVD deposition was accomplished using a home-built evaporator comprising a bell jar, a roughing pump, and a high-current power supply. In a typical deposition, 35-100 mg of mechanochemically synthesized source powder was loaded onto either a tantalum or an alumina-coated molybdenum evaporation boat. For (FA$_{0.81}$MA$_{0.14}$Cs$_{0.05}$)Pb(Cl$_{0.02}$Br$_{0.14}$I$_{0.84}$)$_3$, an excess of FAI and MABr was added as described above. Before deposition, glass slides for absorption, PL, PLQY, and profilometry were sonicated sequentially in water, acetone, and isopropanol and then cleaned using an oxygen plasma cleaner. Substrates were loaded into the SSVD system at a height between 5 and 20 cm from the source boat. Then, the chamber was evacuated to either ~10 mtorr or 10$^{-6}$ torr. To sublime the powder, a high current was passed through the sublimation boat, causing it to heat to and deposit at rates between 0.05 Å s$^1$ and 1000 Å s$^1$. Both (FA$_{0.81}$MA$_{0.14}$Cs$_{0.05}$)Pb(Cl$_{0.02}$Br$_{0.14}$I$_{0.84}$)$_3$ and 5% Yb$^{3+}$:CsPb(Cl$_{1-x}$Br$_x$)$_3$ fully evaporated well before the evaporation boat reached its maximum temperature. After deposition, all films were stored under dry conditions in the dark.

Absorption Spectroscopy:

Absorption spectra were measured using an Agilent Cary 5000 spectrometer operating in transmission mode.

Photoluminescence Spectroscopy:

Steady-state, room-temperature photoluminescence (PL) data were measured using a 375 nm Thorlabs LED excitation source and a LN$_2$-cooled silicon CCD for detection in front-face sample-excitation geometry. All steady-state PL spectra were corrected for instrument response and sample optical density at 375 nm. Absolute PL quantum yields (PLQYs) were measured with the thin films positioned at the 1800 port of a 5.3 inch teflon-based integrating sphere. The samples were directly excited with a 375 nm LED, and the samples were slightly angled so that the primary and secondary reflections were positioned on the integrating sphere wall. Light from the sphere was fiber-coupled to a home-built luminescence spectrometer equipped with a LN$_2$-cooled silicon CCD for detection. All spectra were corrected for integrating sphere, fiber, lens, grating, and detector spectral response using a radiometric calibration lamp (Ocean Optics, LS-1-Cal). The emission correction curve generated using the calibrated lamp was further reinforced and extended in the UV-Vis spectral region using secondary emission standards.[1] PLQYs were calculated using:

$$PLQY = \frac{N_{em}}{N_{abs}} = \frac{\int I_{sample}(\lambda) - I_{ref}(\lambda) d\lambda}{\int E_{ref}(\lambda) - E_{sample}(\lambda) d\lambda}$$

where "I" indicates the spectrally corrected intensity of the emitted light, "E" indicates the spectrally corrected intensity of the excitation light, "sample" indicates measurements of samples, and "ref" indicates measurements of a reference glass substrate. The PLQY setup was frequently calibrated using well-characterized dye emission standard solutions, which yielded good agreement with literature.

X-Ray Diffraction (XRD):

X-ray diffraction patterns of powders and films were measured using a Bruker D8 Discover equipped with a Pilatus 100K large-area 2D detector. Samples were irradiated using Cu Kα radiation (50 W).

Scanning Electron Microscopy (SEM):

Images were captured using an Apreo-S with Lovac at 5 kV. Energy-dispersive X-ray spectroscopy was conducted in an FEI Sirion SEM operating at 5 kV with an Oxford detector.

Profilometry:

Film thickness was measured using a Bruker OM-DektakXT profilometer.

It should be noted that for purposes of this disclosure, terminology such as "upper," "lower," "vertical," "horizontal," "inwardly," "outwardly," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. The term "about" means plus or minus 5% of the stated value.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

All references described in the present disclosure are expressly incorporated herein by reference in their entireties.

While illustrative embodiments have been illustrated and described, it will be appreciated that various changes can be made therein without departing from the spirit and scope of the invention.

The embodiments of the invention in which are exclusive property or privilege is claimed as defined as follows:

1. A device comprising:
   a first layer; and
   a composition disposed in the form of a film on the first layer, wherein the film does not comprise nanocrystals, the composition having a chemical formula selected from the group of formulae consisting of one or more of:
M:$ABX_3$;
M:$AB_2X_5$;
M:$A_4BX_6$;
M:$C_2DX_5$;
M:$A_2CDX_6$; or
combinations thereof;
wherein:
A is at least one cation selected from the group consisting of $Li^+$, $Na^+$, $K^+$, $Rb^+$, $Cs^+$, methylammonium (MA), formamidinium (FA), guanidinium, dimethylammonium, trimethylammonium, and combinations thereof,
B is at least one cation selected from the group consisting of $Pb^{2+}$, $Sn^{2+}$, $Ge^{2+}$, $Cd^{2+}$, $Mg^{2+}$, $Ti^{2+}$, $Hg^{2+}$, and combinations thereof,
C is at least one cation selected from the group consisting of $Ag^+$, $Cu^+$, $Sn^+$, $Na^+$, $K^+$, $Tl^+$, $Au^+$, and combinations thereof,
D is at least one cation selected from the group consisting of $In^{3+}$, $Bi^{3+}$, $Sb^{3+}$, $Au^{3+}$, and combinations thereof,
X is at least one anion selected from the group consisting of $O^{2-}$, $F^-$, $Cl^-$, $Br^-$, $I^-$, $CN^-$, and combinations thereof, and
M is at least one cation selected from the group consisting of $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Sc^{3+}$, $Fe^{3+}$, $Al^{3+}$, $V^{2+}$, $Cr^{2+}$, $Mn^{2+}$, $Bi^{3+}$, and combinations thereof,
wherein the composition is configured to emit light of a first wavelength after absorption of light of a second wavelength that is different than the first wavelength.

2. The device of claim 1, wherein the composition disposed on the first layer is a conformal coating.

3. The device of claim 2, wherein the first layer is a textured silicon solar cell.

4. The device of claim 1, comprising a solar cell; wherein the first layer is glass.

5. The device of claim 1, comprising a second layer; wherein the first layer includes at least one of a solar cell layer or a glass layer; and
wherein the composition is a vapor deposition layer and comprises a film situated between the first layer and the second layer.

6. The device of claim 1, wherein the composition is disposed in a layer having a thickness of 50 nm to 1000 nm.

7. The device of claim 1, wherein the composition is selected from the group consisting of $Yb^{3+}$:$CsPbCl_3$, $Yb^{3+}$:$CsPb(Cl_{1-x}Br_x)_3$, $Yb^{3+}$:$CsSnCl_3$, $Yb^{3+}$:$CsSn(Cl_{1-x}Br_x)_3$, $Yb^{3+}$:$RbPbCl_3$, $Yb^{3+}$:$RbPb(Cl_{1-x}Br_x)_3$, Yb:$(Rb_{1-x}Cs_x)Pb(Cl_{1-x}Br_x)_3$, $Yb^{3+}$:$FAPbCl_3$, $Yb^{3+}$:$FAPb(Cl_{1-x}Br_x)_3$, Yb:$(FA_{1-x}Cs_x)PbCl_3$, Yb:$(FA_{1-x}Cs_x)Pb(Cl_{1-x}Br_x)_3$, $Yb^{3+}$:$(Rb_{1-x}Cs_x)(Pb_{1-x}Sn_x)(Cl_{1-x}Br_x)_3$, $Yb^{3+}$:$Cs_2PbCl_2I_2$, $Yb^{3+}$:$Cs_2SnCl_2I_2$, $Yb^{3+}$:$Cs_2AgBiCl_6$, $Yb^{3+}$:$Cs_2AgBiBr_6$, $Yb^{3+}$:$Cs_2AgBi(Cl_{1-x}Br_x)_6$, $Yb^{3+}$:$Cs_2AgInCl_6$, $Yb^{3+}$:$Cs_2AgIn(Cl_{1-x}Br_x)_6$, wherein x is a number between 0 and 1.

8. The device of claim 1, wherein M substitutes for B or D in a crystalline lattice of the composition.

9. The device of claim 8, wherein the inclusion of M is associated with a defect of the crystalline lattice configured to conserve charge.

10. The device of claim 1, wherein a molar ratio of M/(B+M) is in a range of 0% to 49% or a molar ratio of M/(D+M) is in a range of 0% to 49%.

11. The device of claim 1, wherein the composition comprises a plurality of M cations, and wherein M cations of the plurality of M cations are inhomogeneously distributed within the composition.

12. The device of claim 1, wherein the emitted light is as a result of dopant emission.

13. The device of claim 12, wherein a quantum yield of the composition is in a range of 0% to 200%.

14. The device of claim 1, wherein the device is one or more of a photovoltaic cell, a photovoltaic module, a photodetector, a light-emitting diode, and/or a laser.

15. The device of claim 1, wherein the composition is configured to emit quanta of energy, the device further comprising an active material configured to receive the quanta of energy emitted from the composition.

16. The device of claim 15, further comprising a spacer layer disposed between the composition and the active material.

17. The device of claim 15, further comprising a selective reflector configured to allow photons in wavelength range incident upon the selective reflector to pass through to the composition and to reflect or scatter photons incident upon the selective reflector and outside of the wavelength range.

18. The device of claim 17, wherein the selective reflector is positioned to direct the quanta of energy emitted by the composition to the active material.

19. The device of claim 1, wherein the device is a photovoltaic cell.

20. The device of claim 19, wherein the composition is configured to absorb x-rays.

21. The device of claim 19, wherein the composition is a downconversion layer configured to absorb x-rays and emit one or more photons in response to absorbing the x-rays, and wherein the first layer is a photodetector configured to absorb the one or more photons and generate an electrical signal in response to the absorbed one or more photons.

22. The device of claim 1, wherein the film is a bulk film.

* * * * *